United States Patent
Marimuthu et al.

(10) Patent No.: US 9,842,798 B2
(45) Date of Patent: *Dec. 12, 2017

(54) SEMICONDUCTOR DEVICE AND METHOD OF FORMING A POP DEVICE WITH EMBEDDED VERTICAL INTERCONNECT UNITS

(71) Applicant: STATS ChipPAC, Ltd., Singapore (SG)

(72) Inventors: Pandi C. Marimuthu, Singapore (SG); Yaojian Lin, Singapore (SG); Kang Chen, Singapore (SG); Yu Gu, Singapore (SG); Won Kyoung Choi, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/135,415

(22) Filed: Dec. 19, 2013

(65) Prior Publication Data

US 2014/0103527 A1 Apr. 17, 2014

Related U.S. Application Data

(63) Continuation-in-part of application No. 13/477,982, filed on May 22, 2012, which is a continuation-in-part
(Continued)

(51) Int. Cl.
*H01L 21/48* (2006.01)
*H01L 23/00* (2006.01)
(Continued)

(52) U.S. Cl.
CPC ...... *H01L 23/49827* (2013.01); *H01L 21/486* (2013.01); *H01L 21/561* (2013.01);
(Continued)

(58) Field of Classification Search
CPC ............... H01L 23/49827; H01L 23/13; H01L 23/3121; H01L 23/3128; H01L 23/49816;
(Continued)

(56) References Cited

U.S. PATENT DOCUMENTS 5,148,266 A 9/1992 Khandros et al.
5,773,884 A 6/1998 Andros et al.
(Continued)

FOREIGN PATENT DOCUMENTS

TW 201108335 A1 3/2011
TW 201142932 A 12/2011

OTHER PUBLICATIONS

Inventor: Yaojian Lin, U.S. Appl. No. 13/931,397, filed Jun. 28, 2013 Title: Semiconductor Device and Method of Forming Low Profile 3D Fan-Out Package.

*Primary Examiner* — David Zarneke
(74) *Attorney, Agent, or Firm* — Robert D. Atkins; Patent Law Group: Atkins and Associates, P.C.

(57) ABSTRACT

A semiconductor device has a substrate. A plurality of conductive vias is formed through the substrate. A conductive layer is formed over the substrate. An insulating layer is formed over conductive layer. A portion of the substrate is removed to expose the conductive vias. A plurality of vertical interconnect structures is formed over the substrate. A first semiconductor die is disposed over the substrate. A height of the vertical interconnect structures is less than a height of the first semiconductor die. An encapsulant is deposited over the first semiconductor die and the vertical interconnect structures. A first portion of the encapsulant is removed from over the first semiconductor die while leaving a second portion of the encapsulant over the vertical interconnect structures. The second portion of the encapsulant is removed to expose the vertical interconnect structures. A
(Continued)

second semiconductor die is disposed over the first semiconductor die.

6 Claims, 54 Drawing Sheets

Related U.S. Application Data of application No. 13/429,119, filed on Mar. 23, 2012, now Pat. No. 8,810,024.

(51) Int. Cl.

| | |
|---|---|
| *H01L 21/56* | (2006.01) |
| *H01L 21/683* | (2006.01) |
| *H01L 23/498* | (2006.01) |
| *H01L 23/31* | (2006.01) |
| *H01L 23/538* | (2006.01) |
| *H01L 25/10* | (2006.01) |
| *H01L 25/065* | (2006.01) |
| *H01L 23/13* | (2006.01) |
| *H01L 23/14* | (2006.01) |

(52) U.S. Cl.

CPC .......... *H01L 21/563* (2013.01); *H01L 21/565* (2013.01); *H01L 21/568* (2013.01); *H01L 21/6835* (2013.01); *H01L 21/6836* (2013.01); *H01L 23/13* (2013.01); *H01L 23/3121* (2013.01); *H01L 23/3128* (2013.01); *H01L 23/49816* (2013.01); *H01L 23/49833* (2013.01); *H01L 23/5389* (2013.01); *H01L 24/11* (2013.01); *H01L 24/17* (2013.01); *H01L 24/19* (2013.01); *H01L 24/20* (2013.01); *H01L 24/24* (2013.01); *H01L 24/81* (2013.01); *H01L 24/82* (2013.01); *H01L 24/92* (2013.01); *H01L 24/96* (2013.01); *H01L 24/97* (2013.01); *H01L 25/0652* (2013.01); *H01L 25/105* (2013.01); *H01L 23/147* (2013.01); *H01L 23/562* (2013.01); *H01L 24/03* (2013.01); *H01L 24/05* (2013.01); *H01L 24/13* (2013.01); *H01L 24/16* (2013.01); *H01L 24/48* (2013.01); *H01L 24/73* (2013.01); *H01L 25/0655* (2013.01); *H01L 2221/68327* (2013.01); *H01L 2221/68331* (2013.01); *H01L 2221/68381* (2013.01); *H01L 2224/0345* (2013.01); *H01L 2224/03462* (2013.01); *H01L 2224/03464* (2013.01); *H01L 2224/0401* (2013.01); *H01L 2224/04105* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/16235* (2013.01); *H01L 2224/16237* (2013.01); *H01L 2224/16238* (2013.01); *H01L 2224/1703* (2013.01); *H01L 2224/211* (2013.01); *H01L 2224/215* (2013.01); *H01L 2224/245* (2013.01); *H01L 2224/24101* (2013.01); *H01L 2224/24155* (2013.01); *H01L 2224/24227* (2013.01); *H01L 2224/32225* (2013.01); *H01L 2224/48091* (2013.01); *H01L 2224/48105* (2013.01); *H01L 2224/48227* (2013.01); *H01L 2224/73265* (2013.01); *H01L 2224/81005* (2013.01); *H01L 2224/81125* (2013.01); *H01L 2224/81127* (2013.01); *H01L 2224/81193* (2013.01); *H01L 2224/81203* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81466* (2013.01); *H01L 2224/81484* (2013.01); *H01L 2224/81805* (2013.01); *H01L 2224/81815* (2013.01); *H01L 2224/81986* (2013.01); *H01L 2224/82039* (2013.01); *H01L 2224/82101* (2013.01); *H01L 2224/82106* (2013.01); *H01L 2224/92* (2013.01); *H01L 2224/95* (2013.01); *H01L 2224/96* (2013.01); *H01L 2224/97* (2013.01); *H01L 2225/1023* (2013.01); *H01L 2225/1035* (2013.01); *H01L 2225/1058* (2013.01); *H01L 2225/1082* (2013.01); *H01L 2924/00014* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/157* (2013.01); *H01L 2924/15311* (2013.01); *H01L 2924/15331* (2013.01); *H01L 2924/181* (2013.01); *H01L 2924/18161* (2013.01); *H01L 2924/3511* (2013.01)

(58) Field of Classification Search

CPC .......... H01L 23/49833; H01L 23/5389; H01L 21/486; H01L 21/561; H01L 21/563; H01L 21/565; H01L 21/568; H01L 21/6836

See application file for complete search history.

(56) References Cited

U.S. PATENT DOCUMENTS

| | | | |
|---|---|---|---|
| 5,953,816 | A | 9/1999 | Pai et al. |
| 6,022,758 | A | 2/2000 | Badehi |
| 6,191,023 | B1 | 2/2001 | Chen |
| 6,569,712 | B2 | 5/2003 | Ho et al. |
| 6,680,529 | B2 | 1/2004 | Chen et al. |
| 6,815,712 | B1 | 11/2004 | Kline |
| 6,818,978 | B1 | 11/2004 | Fan |
| 7,169,694 | B2 | 1/2007 | Pozder et al. |
| 7,235,431 | B2 | 6/2007 | Wood et al. |
| 7,239,014 | B2 | 7/2007 | Ogawa et al. |
| 7,372,151 | B1 * | 5/2008 | Fan ................. H01L 21/561 257/738 |
| 7,545,047 | B2 | 6/2009 | Bauer et al. |
| 7,648,911 | B2 | 1/2010 | Pagaila et al. |
| 7,659,145 | B2 | 2/2010 | Do et al. |
| 7,714,453 | B2 * | 5/2010 | Khan ................. H01L 21/56 257/621 |
| 7,838,337 | B2 | 11/2010 | Marimuthu et al. |
| 7,859,085 | B2 | 12/2010 | Pagaila et al. |
| 7,948,095 | B2 | 5/2011 | Ng et al. |
| 8,012,797 | B2 * | 9/2011 | Shen ................. H01L 21/4853 438/107 |
| 8,076,756 | B2 * | 12/2011 | Lane ................. H01L 21/563 257/620 |
| 8,105,875 | B1 | 1/2012 | Hu et al. |
| 8,138,609 | B2 | 3/2012 | Horiuchi et al. |

(56) References Cited

U.S. PATENT DOCUMENTS

| | | | |
|---|---|---|---|
| 8,148,256 B2 | 4/2012 | Hebert et al. | |
| 8,222,538 B1* | 7/2012 | Yoshida | H01L 23/3128 174/260 |
| 8,237,278 B2 | 8/2012 | Gluschenkov et al. | |
| 8,247,269 B1* | 8/2012 | Liu | H01L 24/19 257/E21.505 |
| 8,263,439 B2 | 9/2012 | Marimuthu et al. | |
| 8,270,176 B2* | 9/2012 | Pagaila | H01L 23/3128 361/760 |
| 8,304,900 B2* | 11/2012 | Jang | H01L 23/3128 257/733 |
| 8,378,476 B2* | 2/2013 | Lee | H01L 23/31 257/686 |
| 8,378,480 B2 | 2/2013 | Chen et al. | |
| 8,405,212 B2* | 3/2013 | Chu | H01L 23/3128 257/738 |
| 8,421,202 B2 | 4/2013 | Shim et al. | |
| 8,471,154 B1* | 6/2013 | Yoshida | H01L 23/3128 174/260 |
| 8,508,954 B2* | 8/2013 | Kwon | H01L 21/561 361/774 |
| 8,528,954 B1* | 9/2013 | Dale | A01D 46/247 294/19.2 |
| 8,546,938 B2* | 10/2013 | Kim | H01L 21/565 257/723 |
| 8,552,548 B1* | 10/2013 | Do | H01L 23/481 257/698 |
| 8,592,992 B2 | 11/2013 | Lin et al. | |
| 8,633,598 B1* | 1/2014 | St. Amand | H01L 23/3135 257/778 |
| 8,659,162 B2 | 2/2014 | Suthiwongsunthorn et al. | |
| 8,779,601 B2* | 7/2014 | Gan | H01L 23/3121 257/686 |
| 8,796,561 B1* | 8/2014 | Scanlan | H01L 24/19 174/260 |
| 8,802,554 B2 | 8/2014 | Sutardja | |
| 8,810,024 B2* | 8/2014 | Lin | H01L 23/13 257/621 |
| 8,823,156 B2* | 9/2014 | Hsieh | H01L 23/3128 257/686 |
| 8,884,422 B2* | 11/2014 | Goh | H01L 25/16 257/686 |
| 8,912,662 B2* | 12/2014 | Chun | H01L 23/34 257/686 |
| 8,987,896 B2 | 3/2015 | Cheah et al. | |
| 9,171,792 B2* | 10/2015 | Sun | H01L 25/16 |
| 9,209,163 B2* | 12/2015 | Kao | H01L 24/11 |
| 9,391,041 B2 | 7/2016 | Lin | |
| 9,406,580 B2 | 8/2016 | Erhart et al. | |
| 9,679,863 B2 | 6/2017 | Lin et al. | |
| 2002/0135057 A1* | 9/2002 | Kurita | H01L 25/0657 257/685 |
| 2005/0121764 A1* | 6/2005 | Mallik et al. | 257/686 |
| 2006/0194373 A1 | 8/2006 | Fee et al. | |
| 2007/0158813 A1* | 7/2007 | Kim | H01L 23/3114 257/686 |
| 2007/0190690 A1 | 8/2007 | Chow et al. | |
| 2007/0228543 A1* | 10/2007 | Walter | H01L 24/13 257/686 |
| 2009/0057849 A1 | 3/2009 | Tang et al. | |
| 2009/0127686 A1 | 5/2009 | Yang et al. | |
| 2009/0146315 A1 | 6/2009 | Shim et al. | |
| 2009/0166886 A1 | 7/2009 | Kim et al. | |
| 2009/0311829 A1 | 12/2009 | Yang et al. | |
| 2010/0006330 A1 | 1/2010 | Fu et al. | |
| 2010/0013081 A1 | 1/2010 | Toh et al. | |
| 2010/0109169 A1 | 5/2010 | Kolan et al. | |
| 2010/0133704 A1* | 6/2010 | Marimuthu | H01L 21/565 257/778 |
| 2010/0171205 A1* | 7/2010 | Chen | H01L 21/565 257/686 |
| 2010/0171207 A1* | 7/2010 | Shen | H01L 21/4853 257/686 |
| 2010/0221873 A1 | 9/2010 | Marimuthu et al. | |
| 2010/0276792 A1 | 11/2010 | Chi et al. | |
| 2011/0012266 A1* | 1/2011 | Horiuchi | H01L 21/561 257/773 |
| 2011/0037155 A1 | 2/2011 | Pagaila | |
| 2011/0068459 A1 | 3/2011 | Pagaila et al. | |
| 2011/0215470 A1 | 9/2011 | Chen et al. | |
| 2011/0217812 A1 | 9/2011 | Hedler et al. | |
| 2011/0221057 A1 | 9/2011 | Lin et al. | |
| 2011/0278707 A1 | 11/2011 | Chi et al. | |
| 2011/0278736 A1 | 11/2011 | Lin et al. | |
| 2011/0309490 A1 | 12/2011 | Lu et al. | |
| 2012/0074585 A1 | 3/2012 | Koo et al. | |
| 2012/0074587 A1 | 3/2012 | Koo et al. | |
| 2012/0319294 A1 | 12/2012 | Lee et al. | |
| 2013/0001767 A1* | 1/2013 | Kajiki | H01L 23/3128 257/734 |
| 2013/0049217 A1 | 2/2013 | Gong et al. | |
| 2013/0062760 A1 | 3/2013 | Hung et al. | |
| 2013/0075936 A1 | 3/2013 | Lin et al. | |
| 2013/0105991 A1 | 5/2013 | Gan et al. | |
| 2013/0154108 A1 | 6/2013 | Lin et al. | |
| 2013/0182402 A1 | 7/2013 | Chen et al. | |
| 2013/0228917 A1 | 9/2013 | Yoon et al. | |
| 2013/0249101 A1* | 9/2013 | Lin | H01L 24/96 257/773 |
| 2013/0249106 A1 | 9/2013 | Lin et al. | |
| 2013/0277851 A1* | 10/2013 | Lin | H01L 21/76802 257/773 |
| 2014/0110856 A1 | 4/2014 | Lin | |
| 2014/0110860 A1* | 4/2014 | Choi et al. | 257/774 |

* cited by examiner

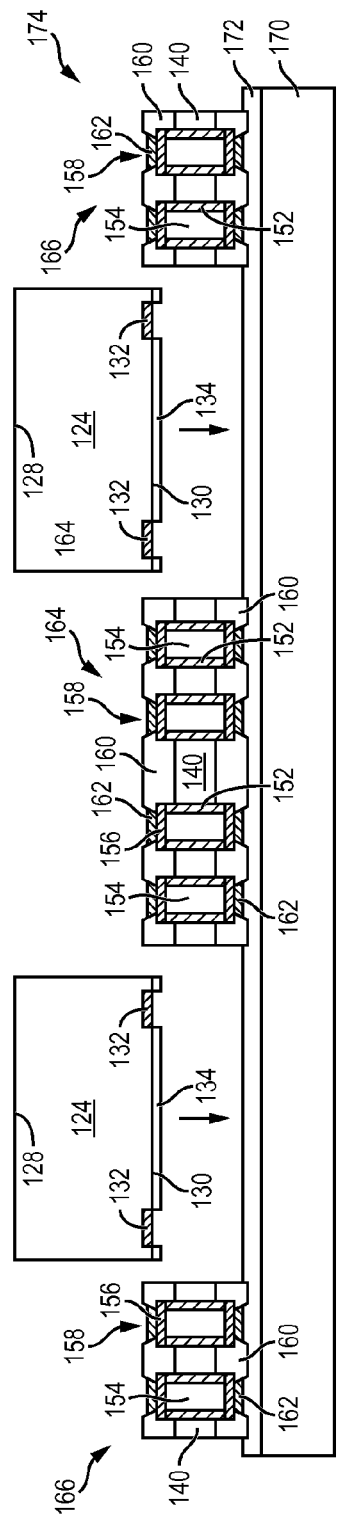
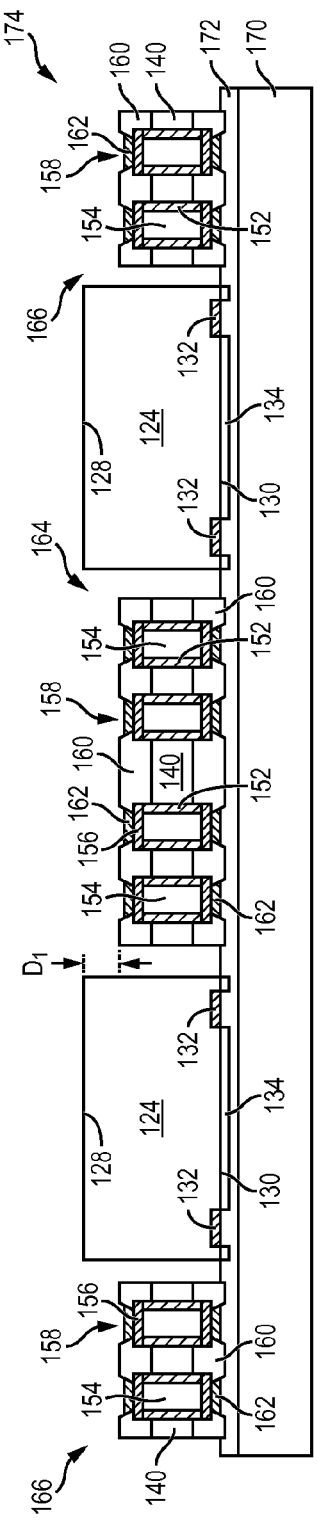
FIG. 5a
FIG. 5b

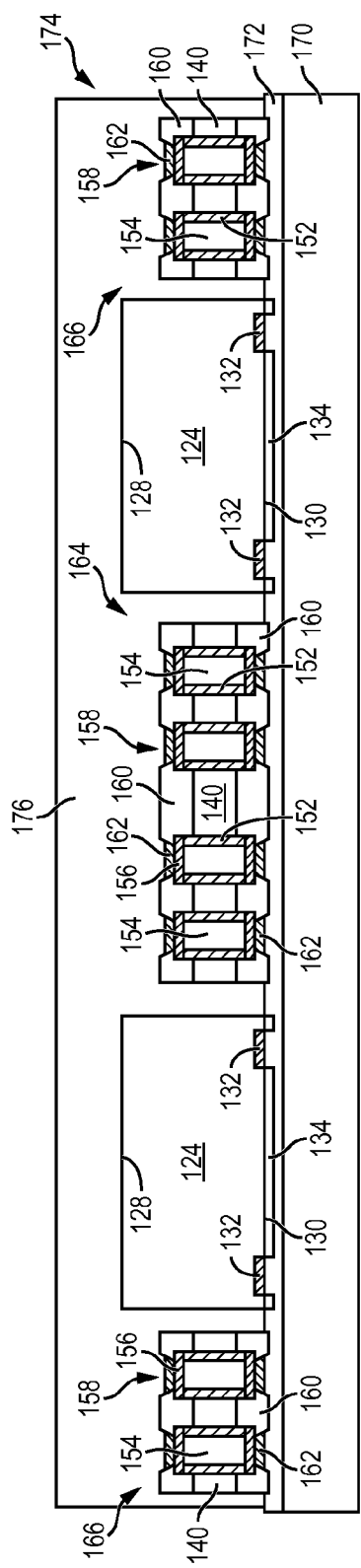
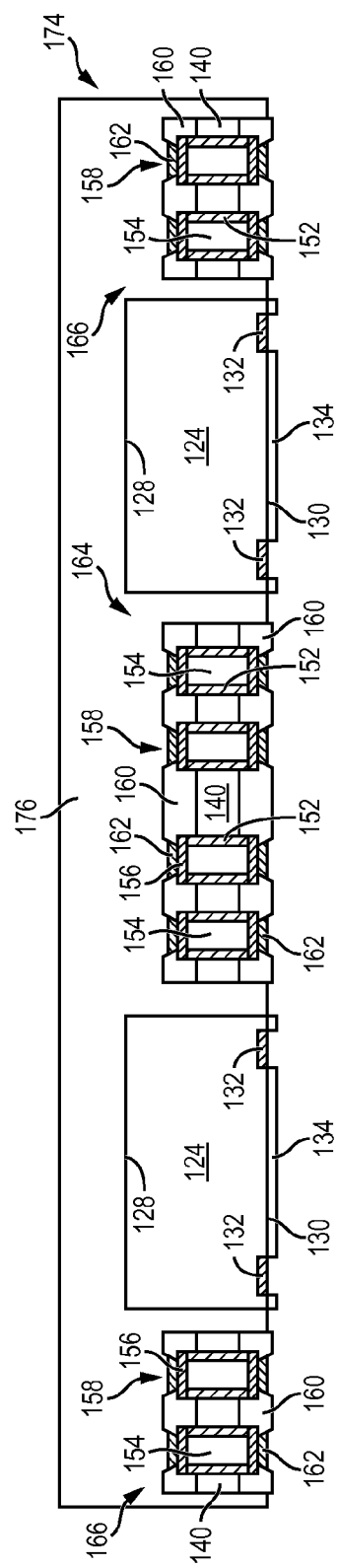
FIG. 5c
FIG. 5d

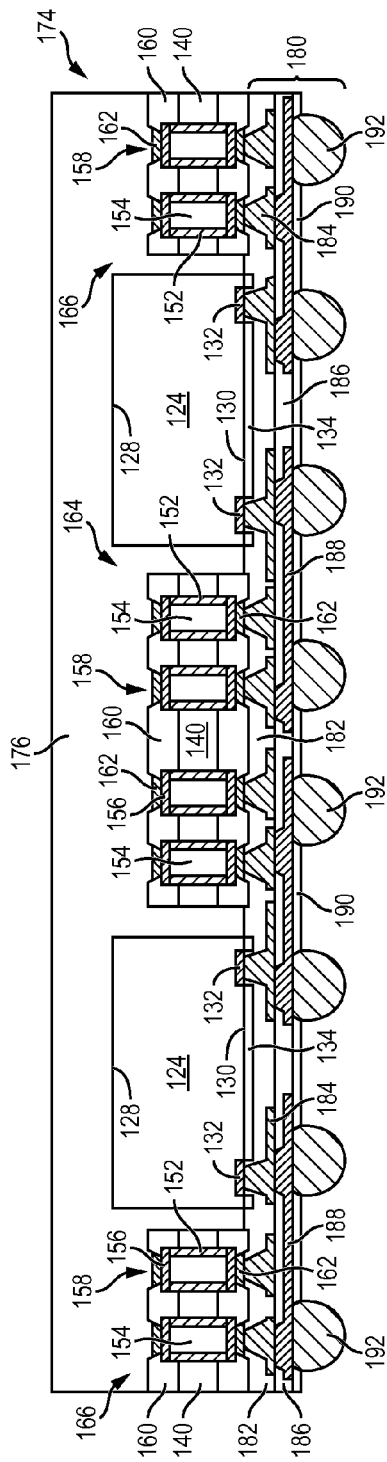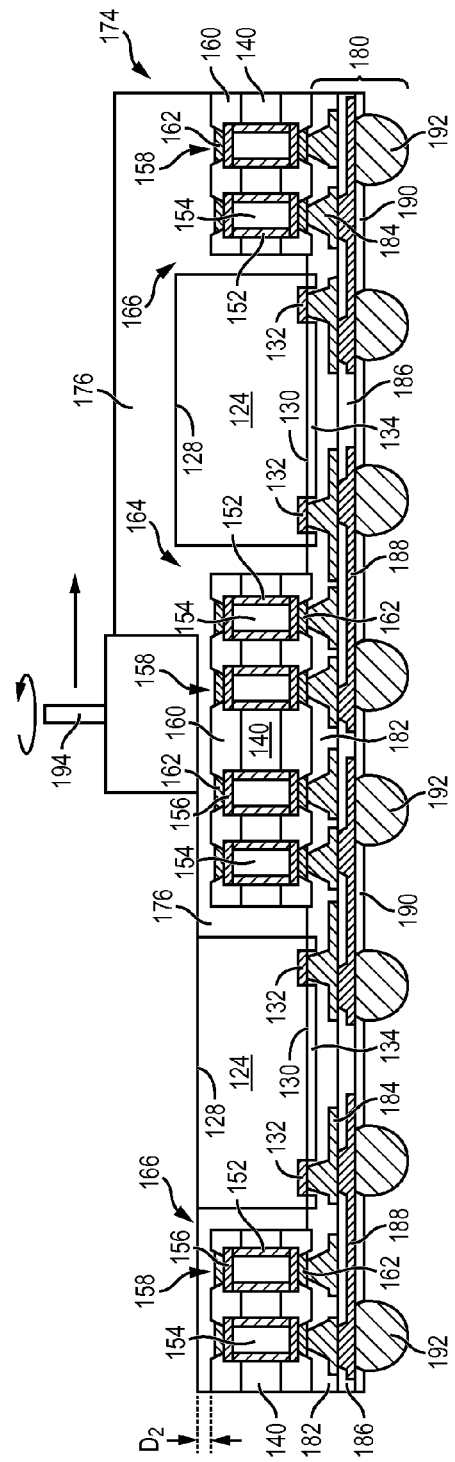

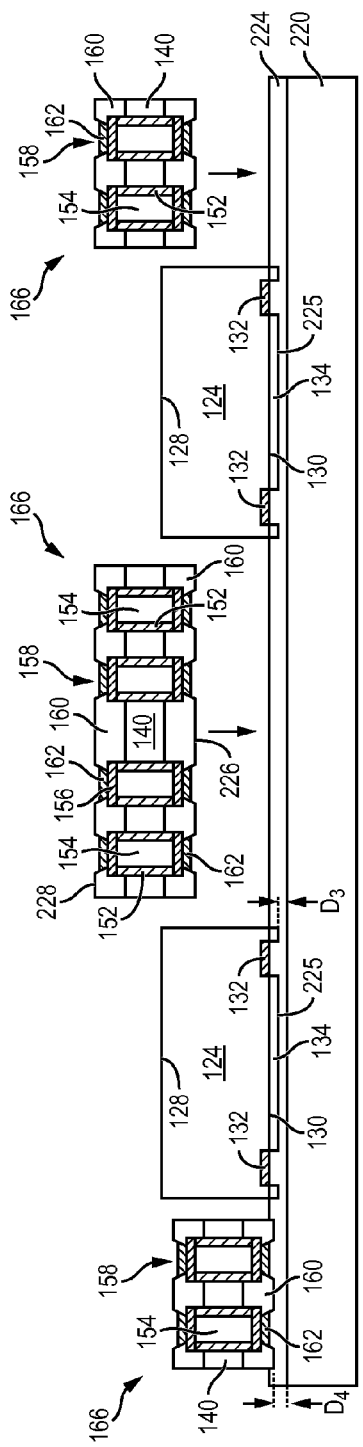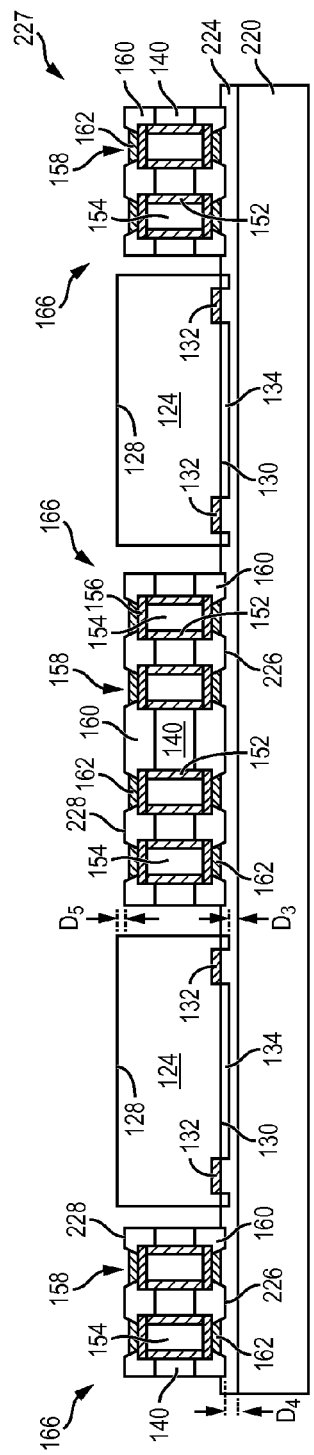
FIG. 6c
FIG. 6d

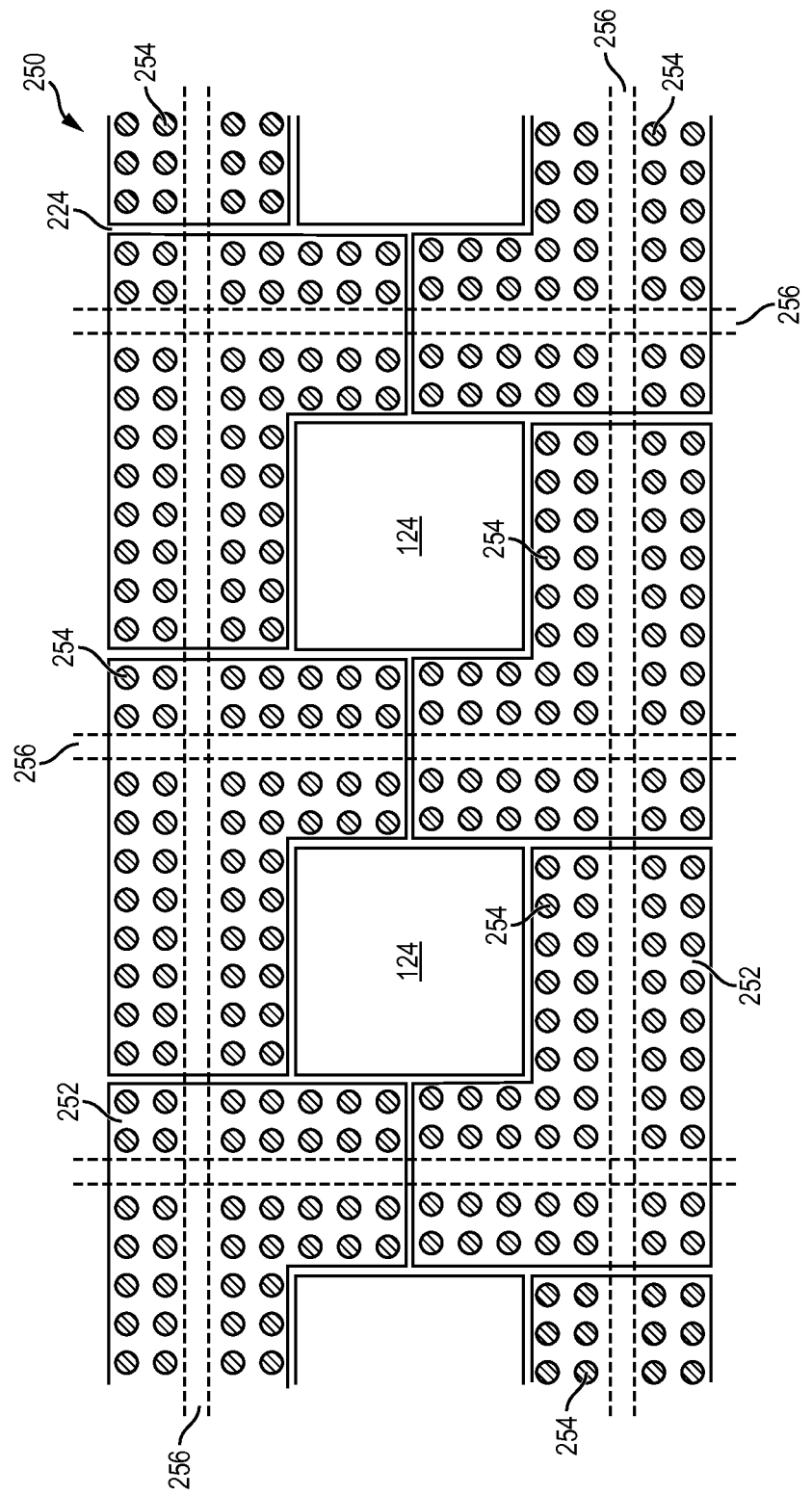

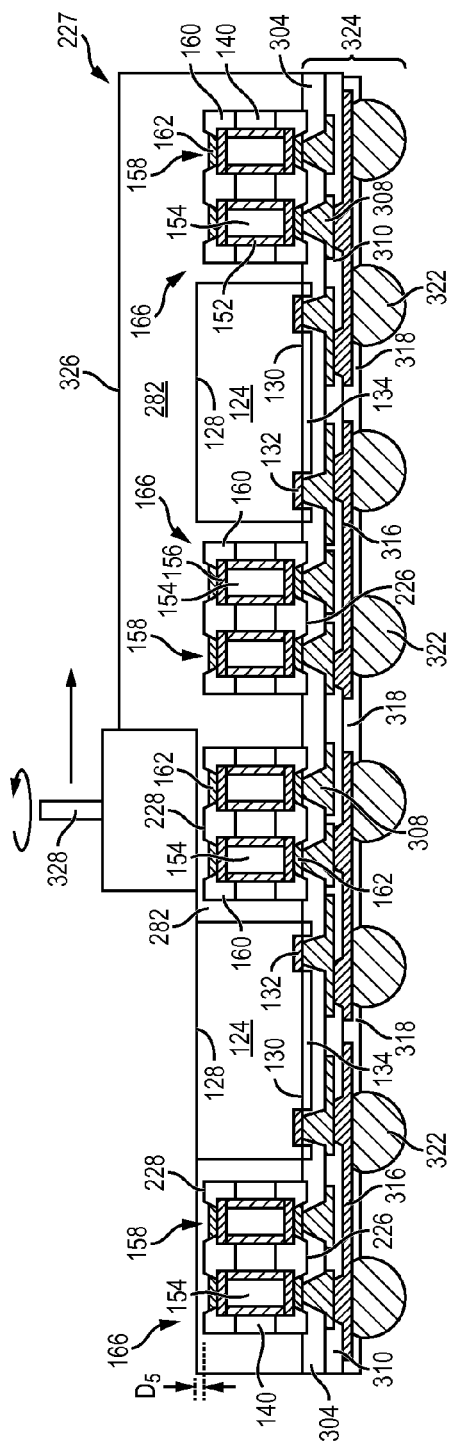
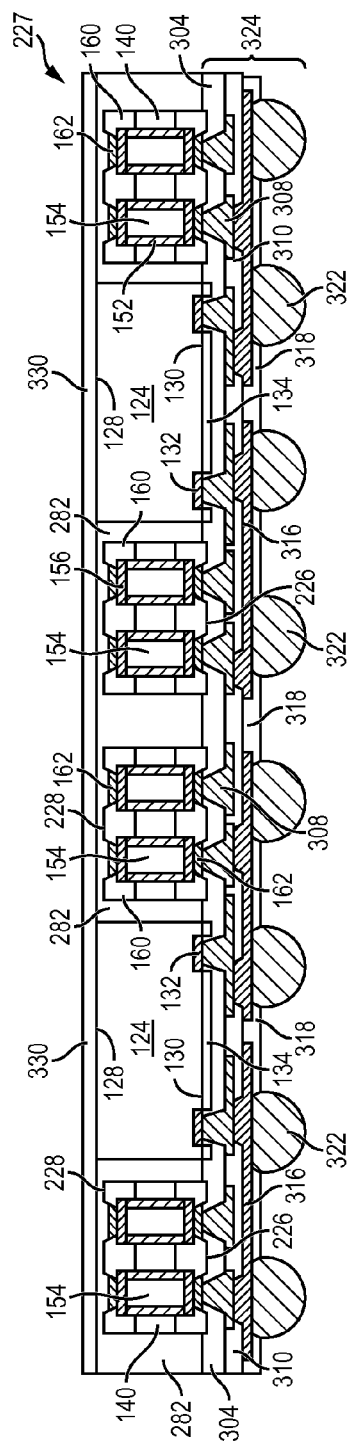

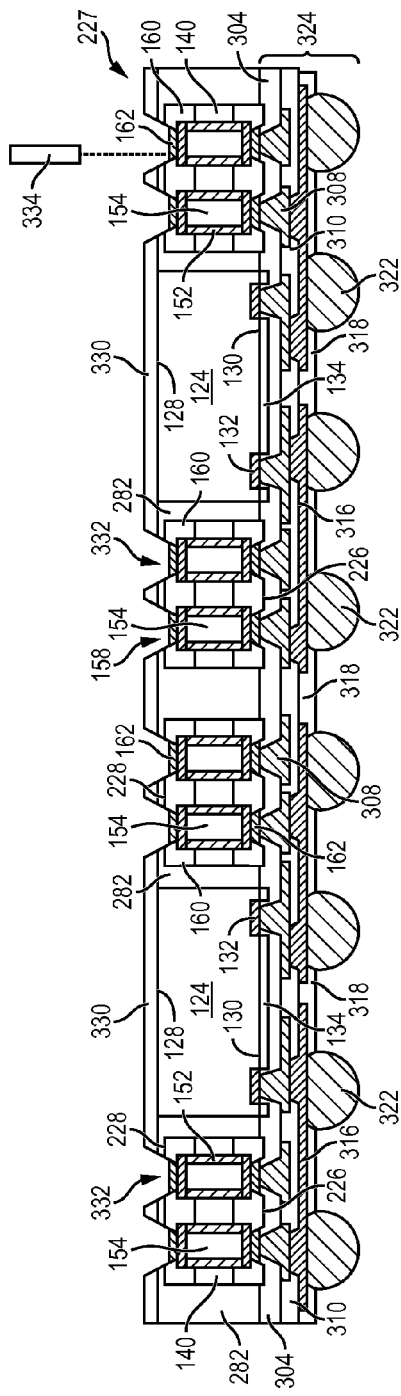
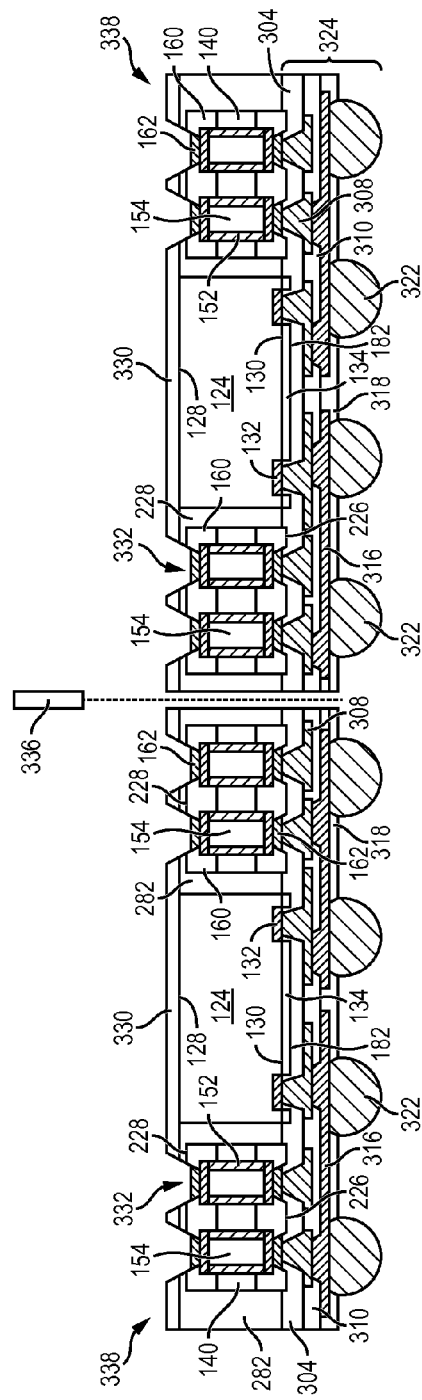
FIG. 6r
FIG. 6s

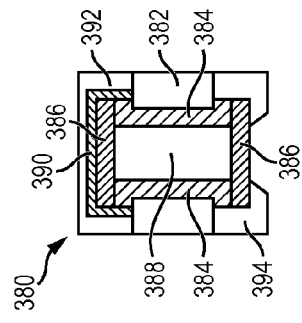
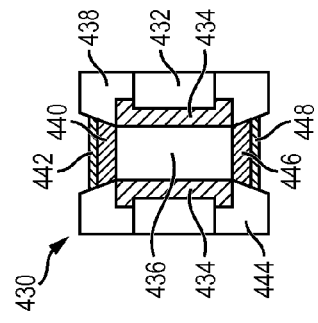
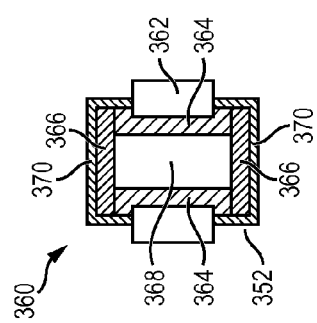
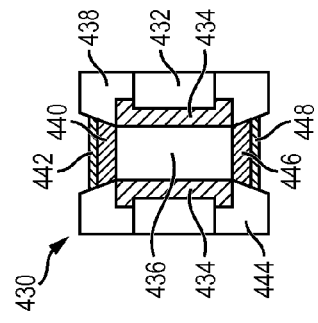
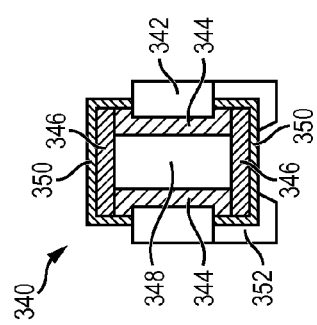
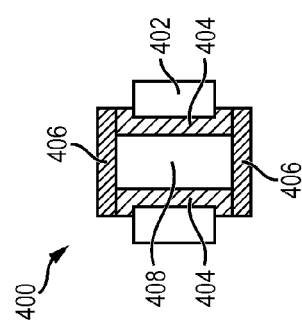

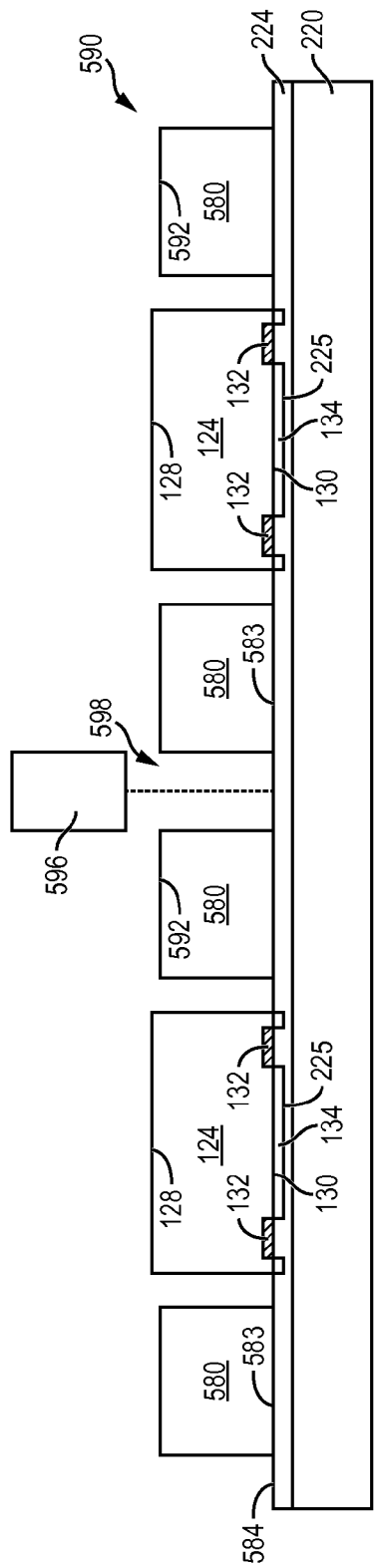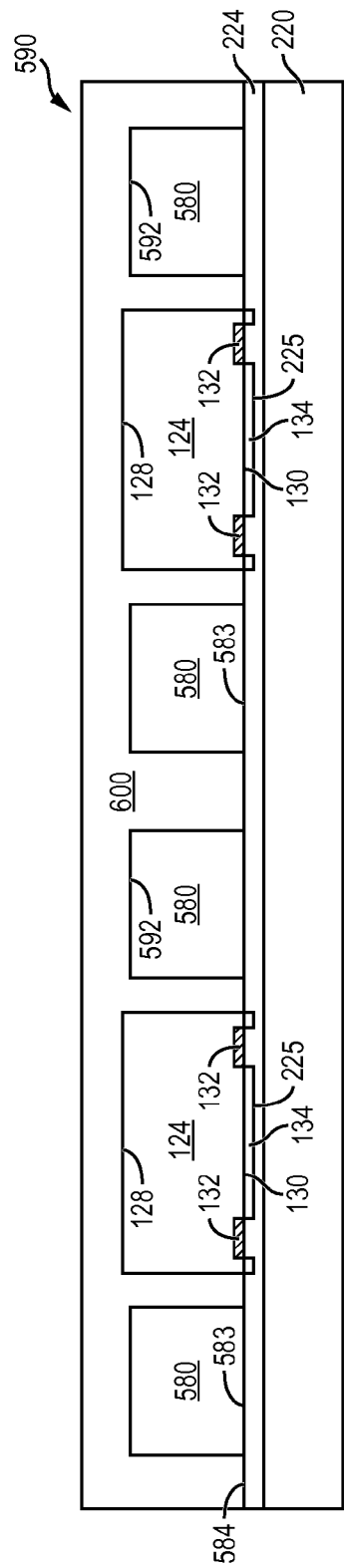

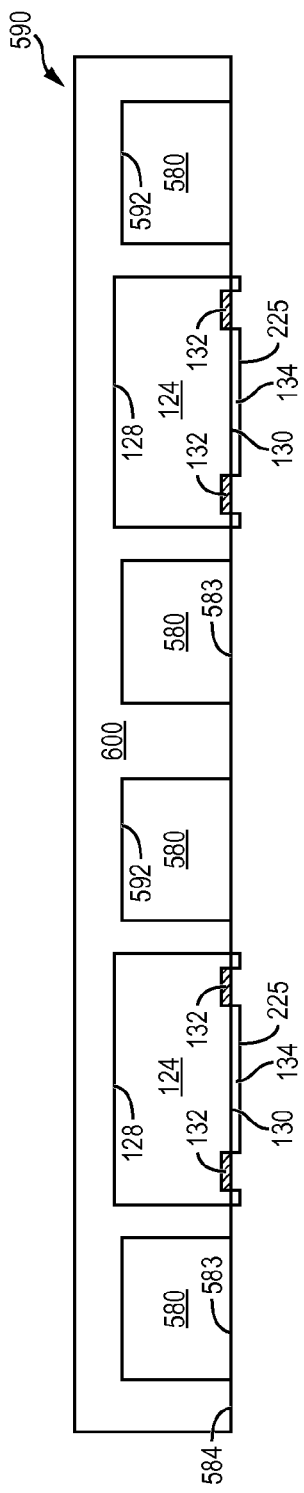
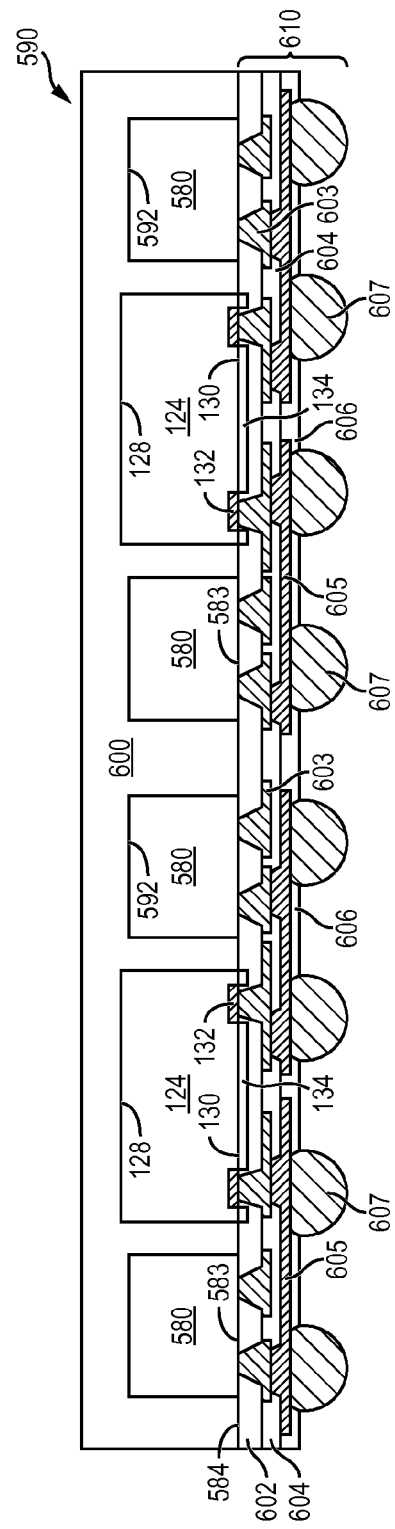
FIG. 13d
FIG. 13e

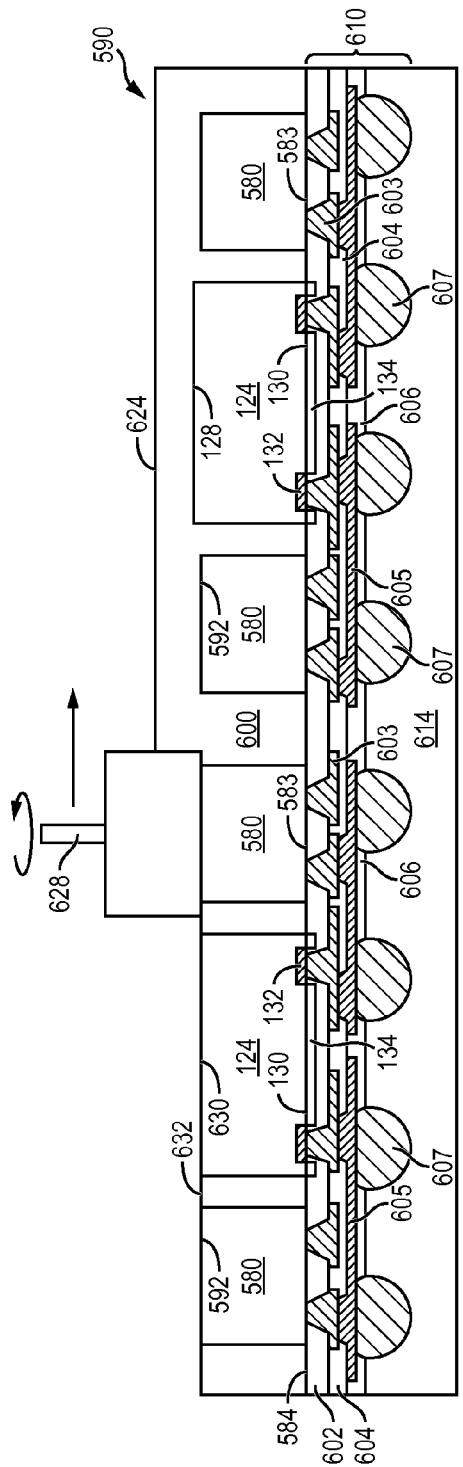
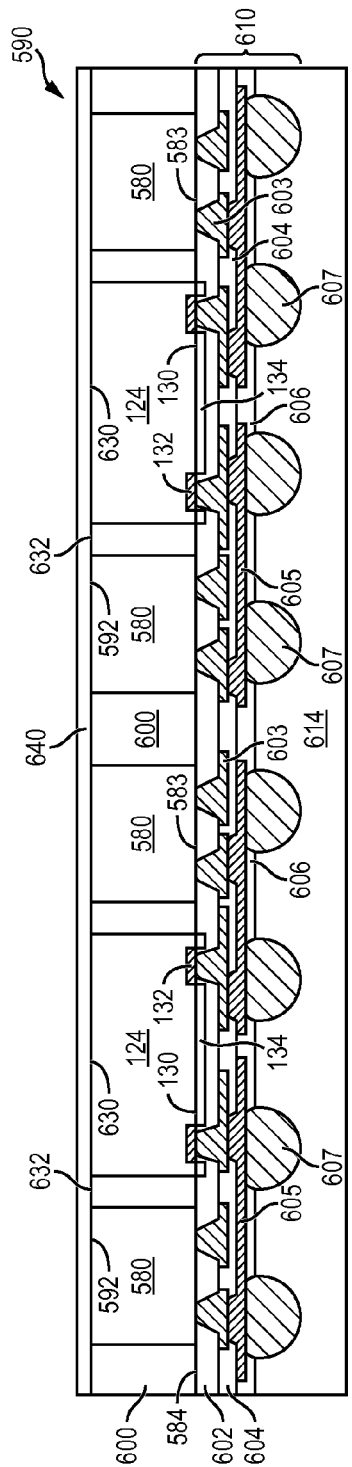
FIG. 13f
FIG. 13g

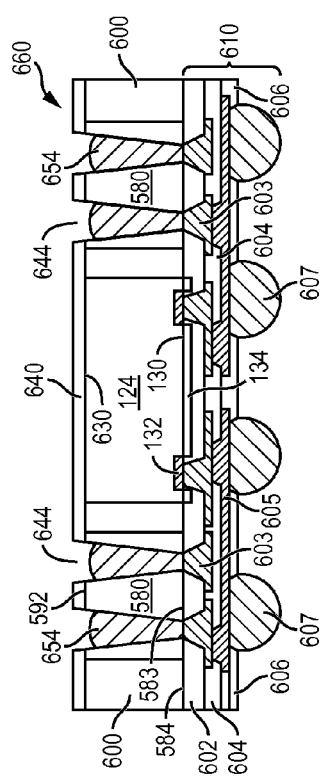
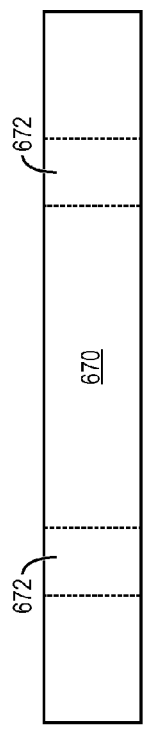
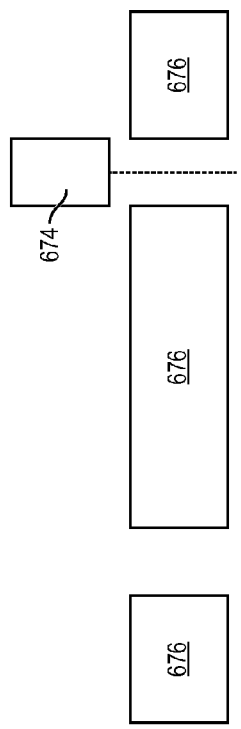
FIG. 14
FIG. 15a
FIG. 15b

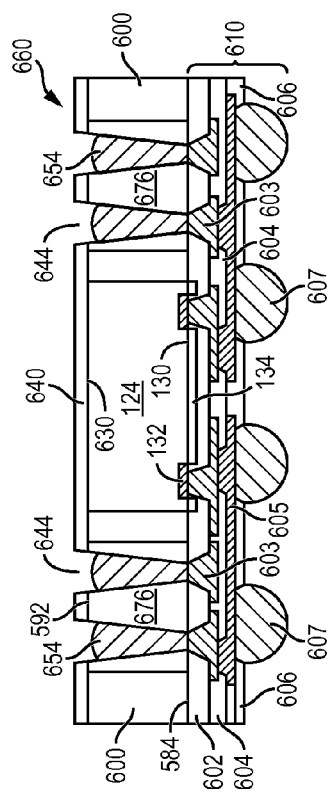
FIG. 16
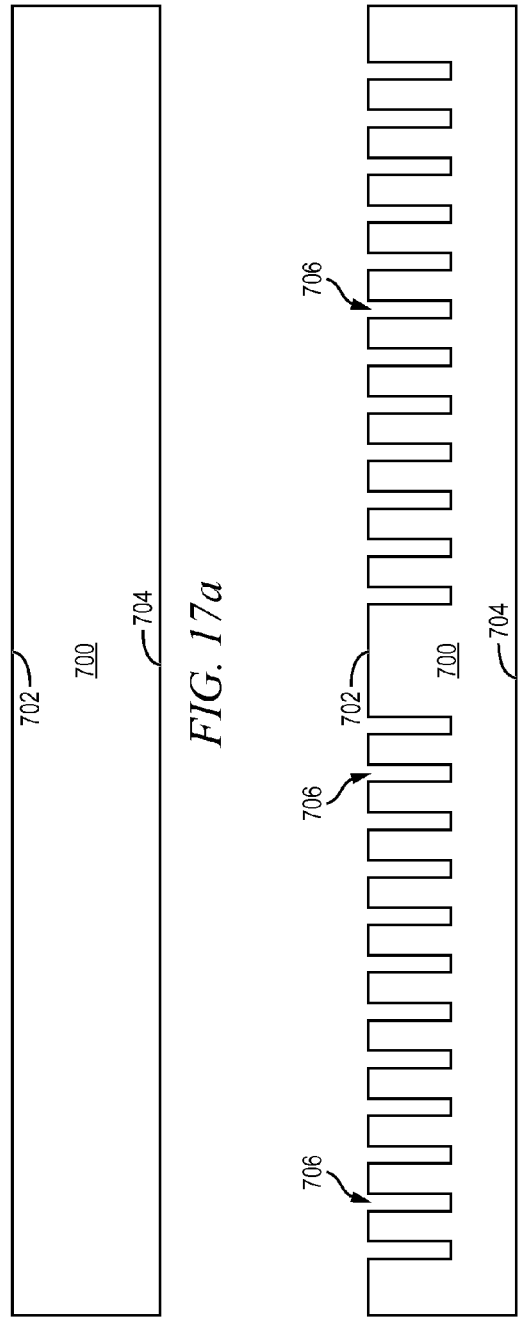
FIG. 17a
FIG. 17b

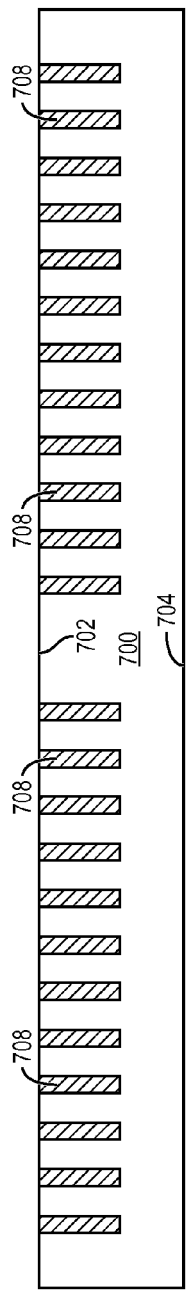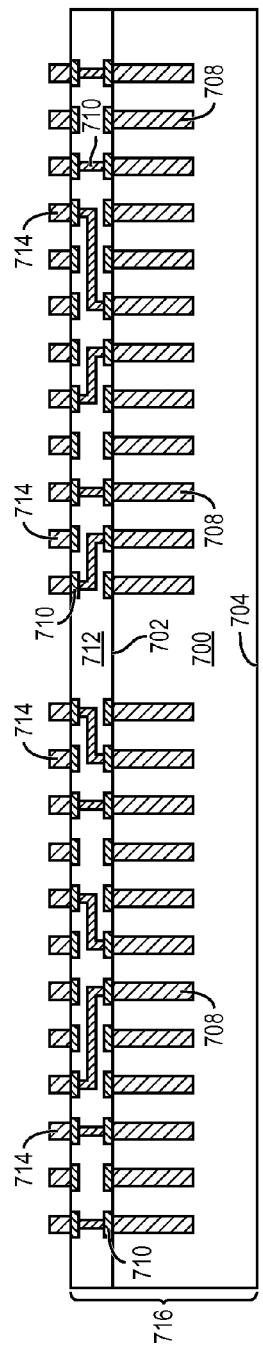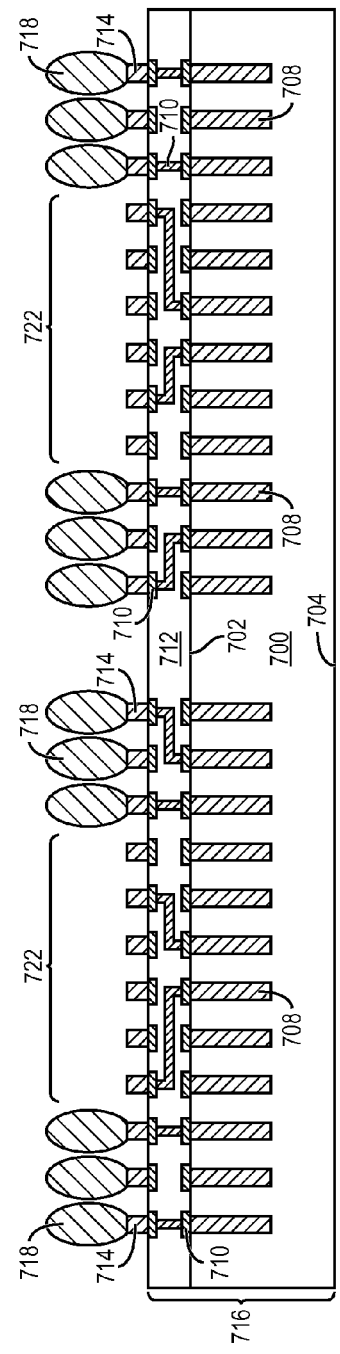
FIG. 17c
FIG. 17d
FIG. 17e

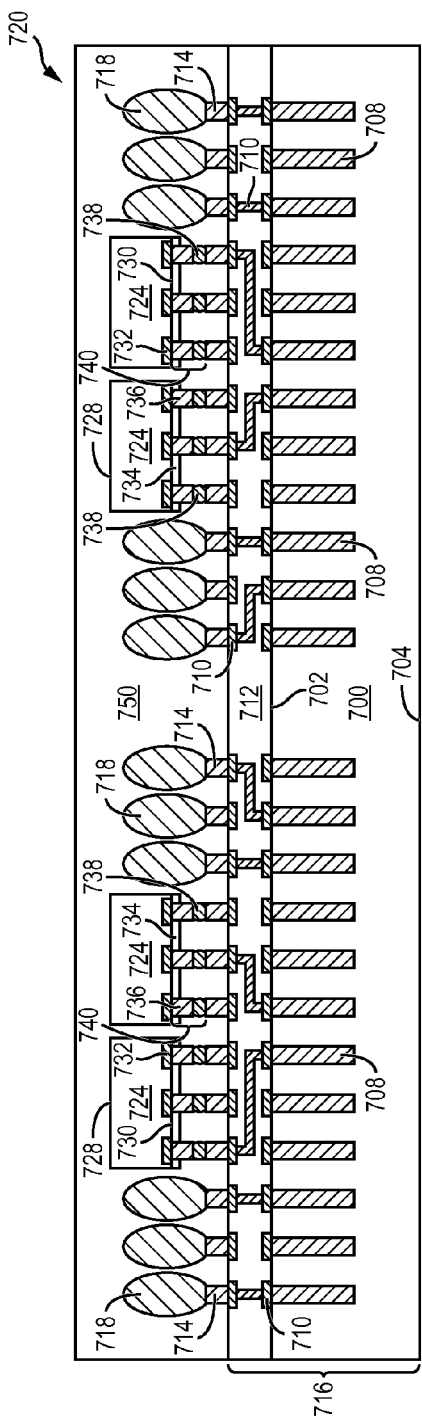
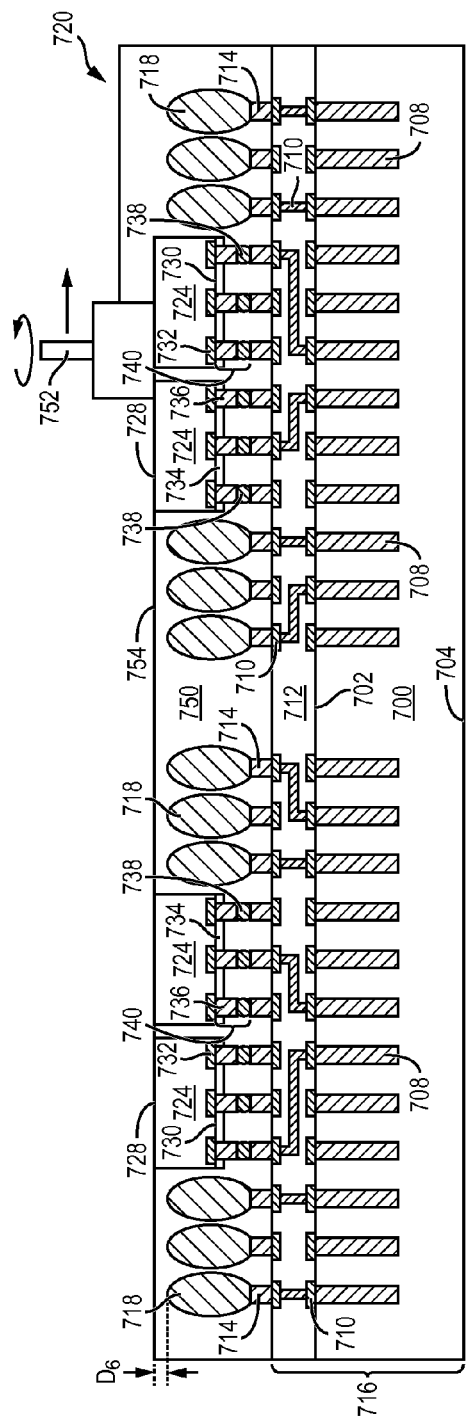
FIG. 17h
FIG. 17i

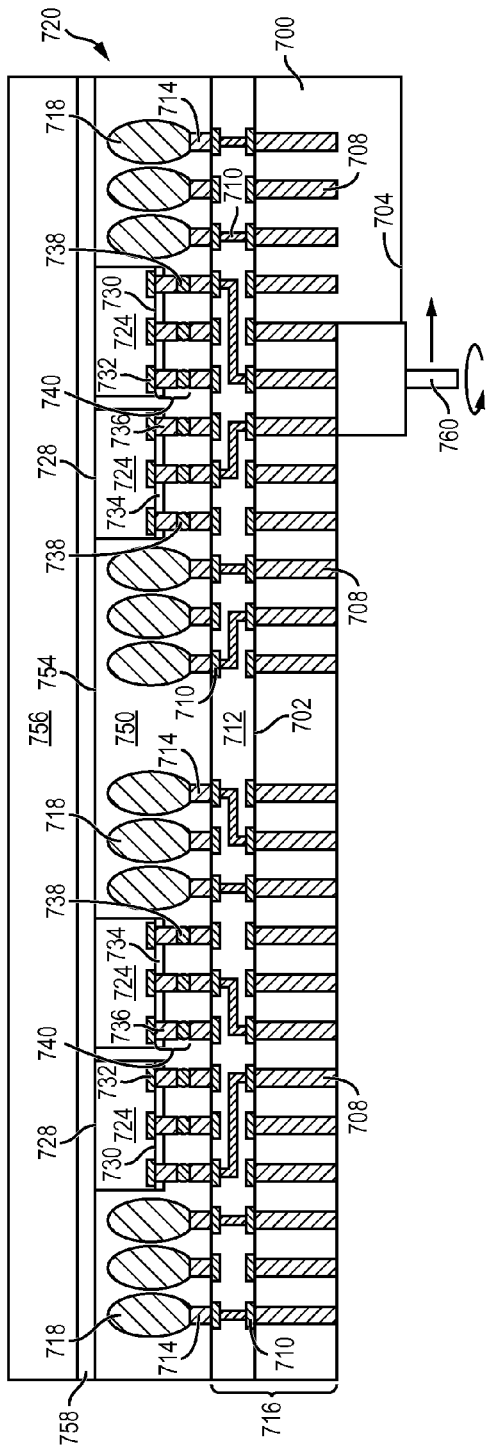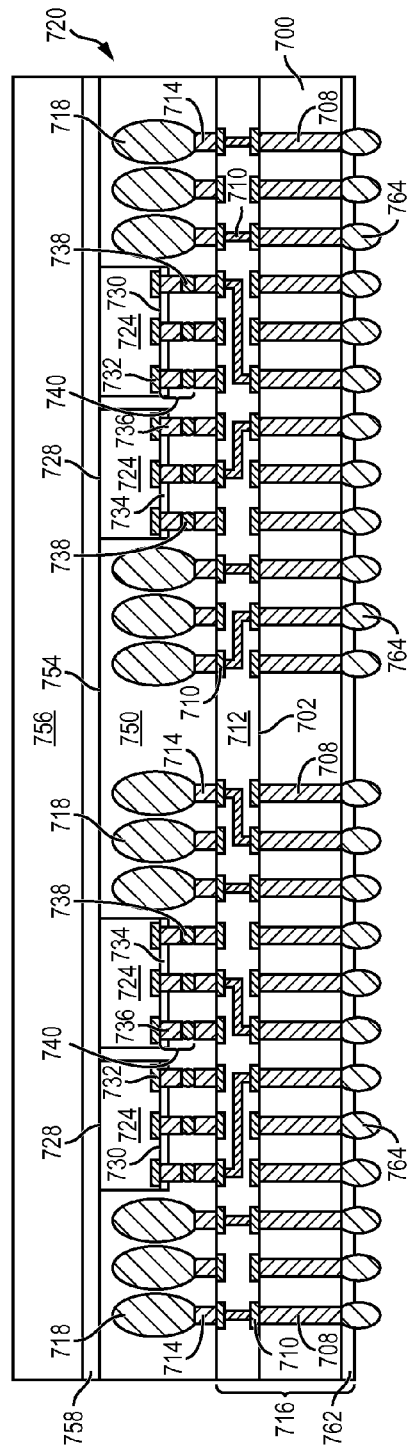
FIG. 17j
FIG. 17k

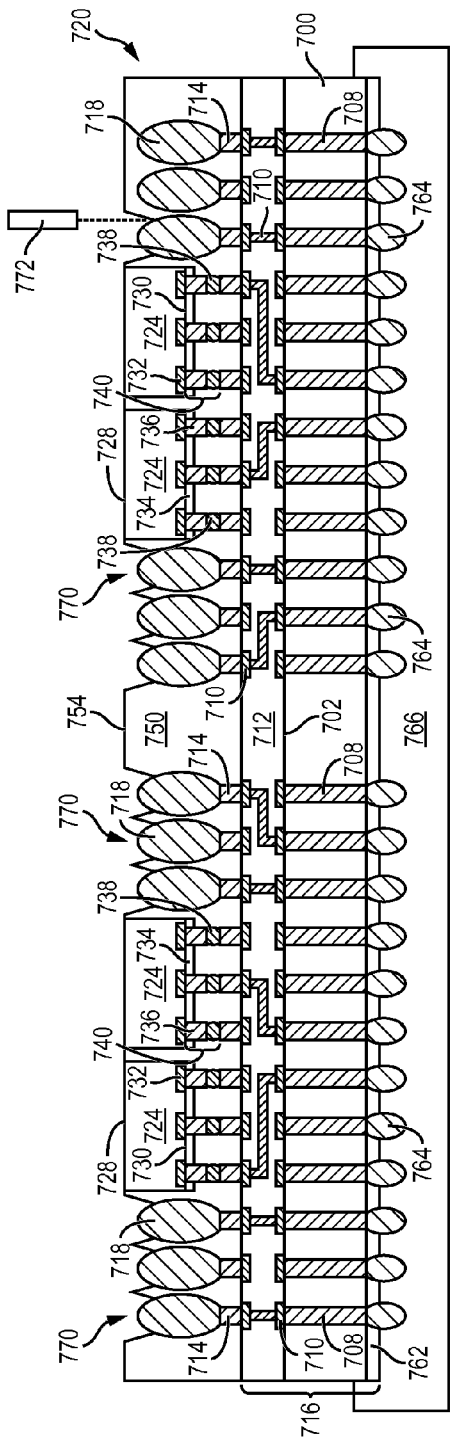
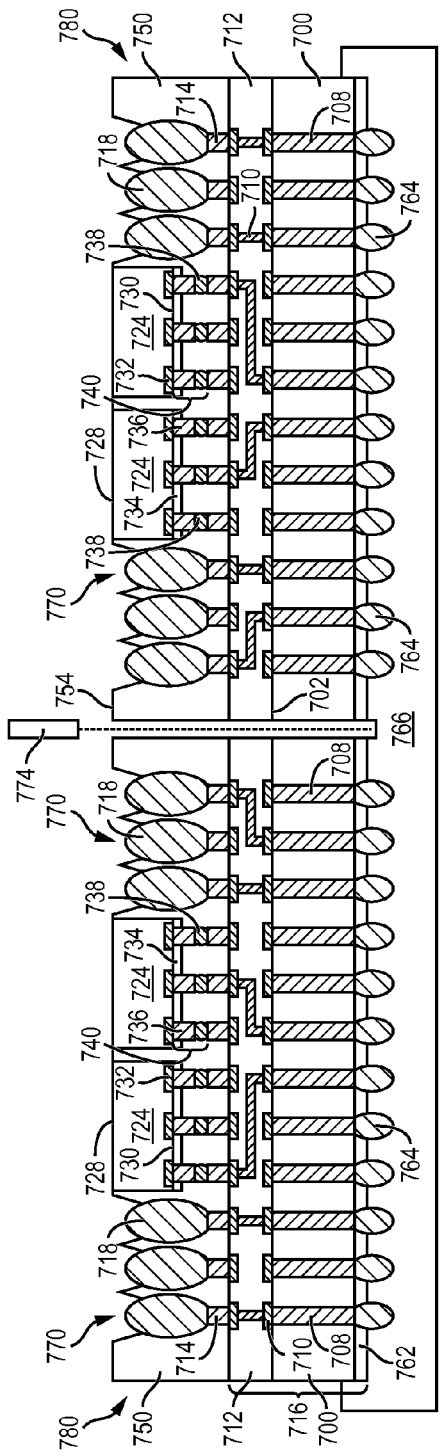
FIG. 17l
FIG. 17m

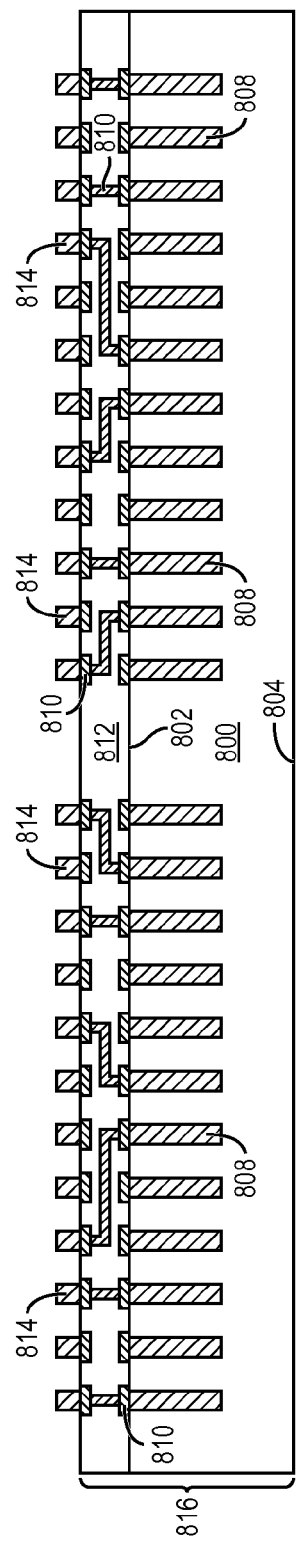
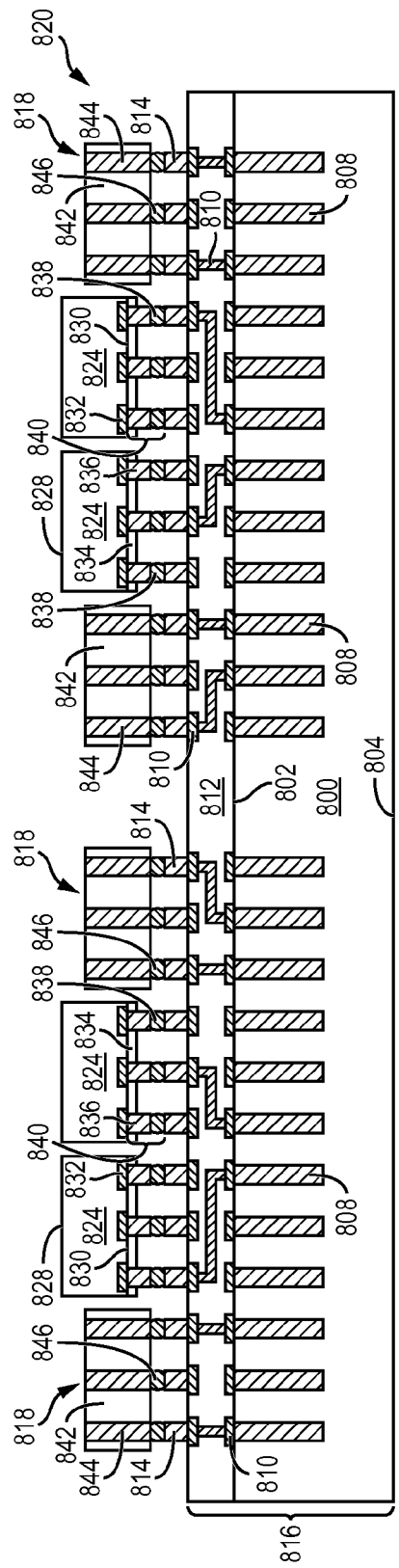
FIG. 19a
FIG. 19b

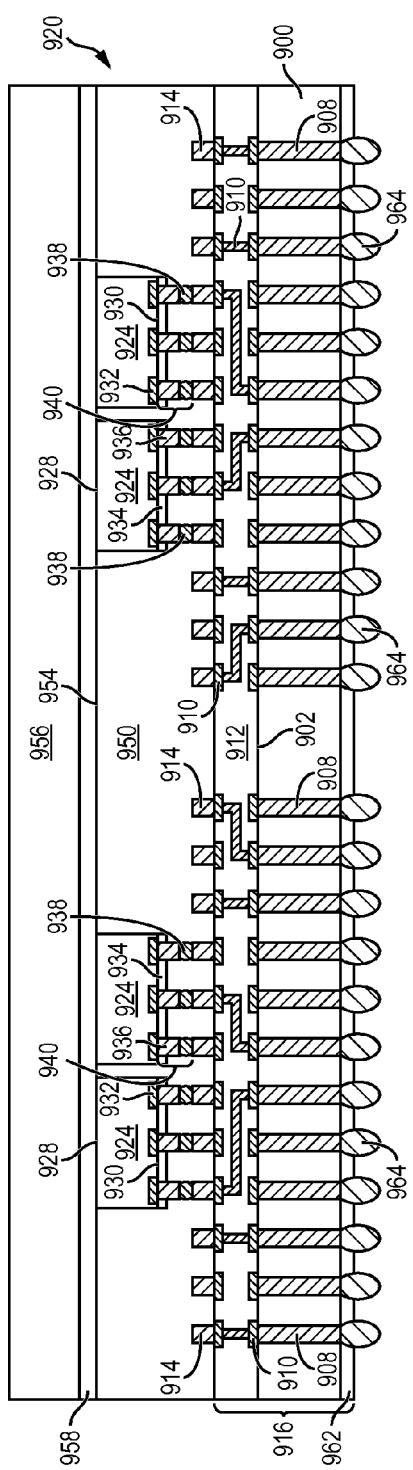
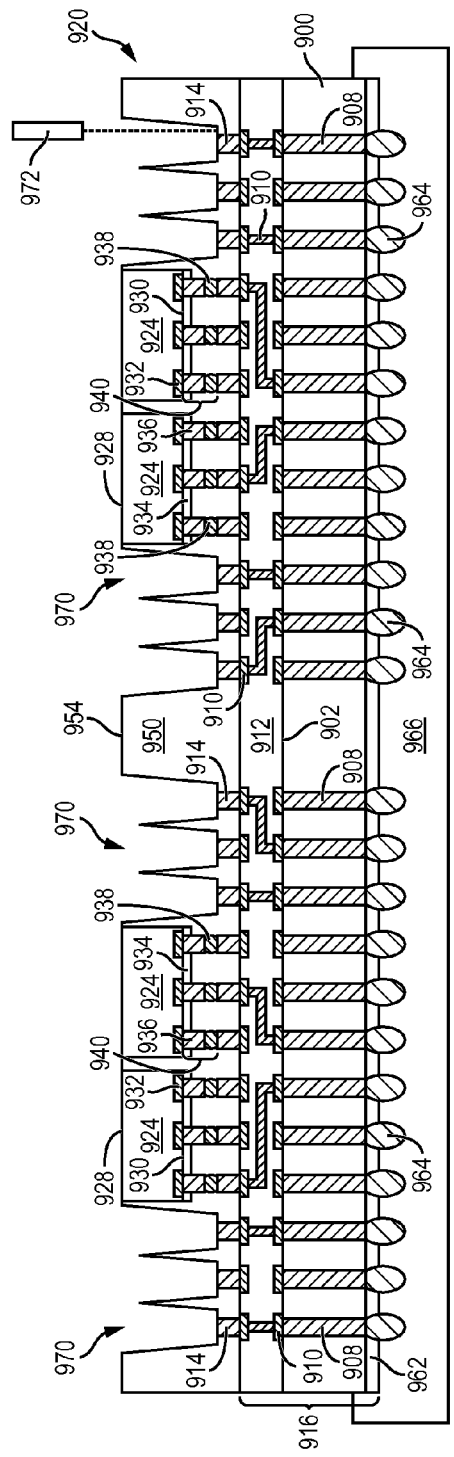
FIG. 21e
FIG. 21f

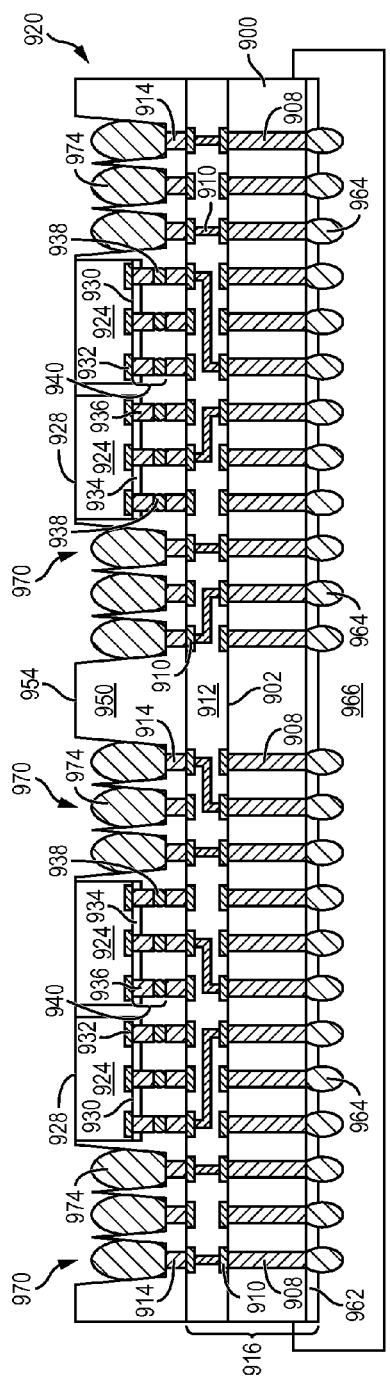
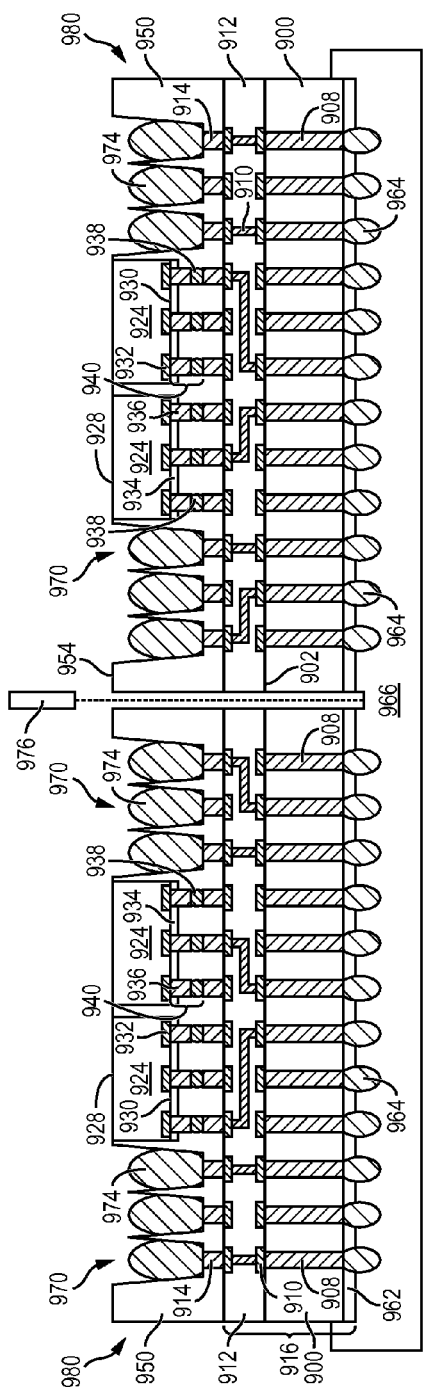
FIG. 21g
FIG. 21h

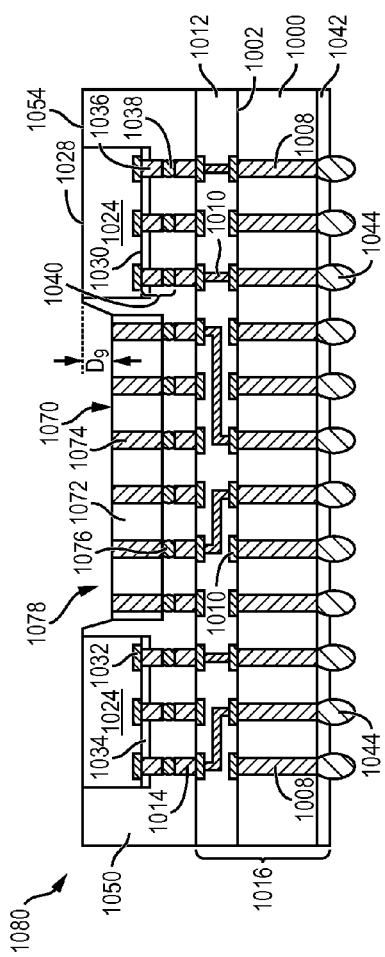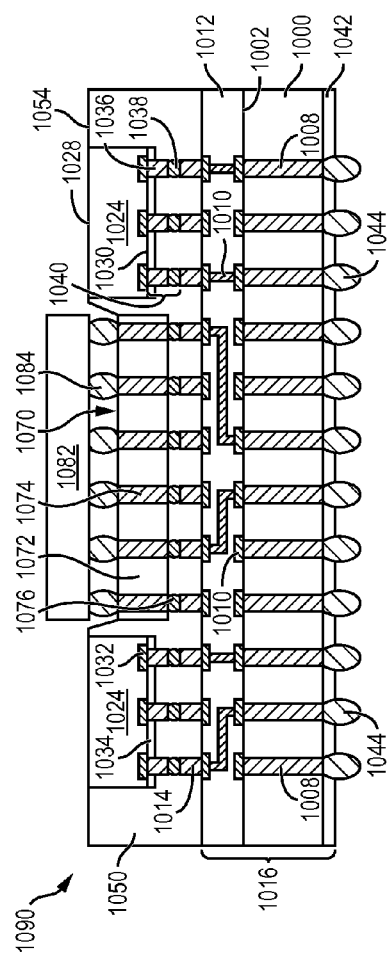
FIG. 24a
FIG. 24b

SEMICONDUCTOR DEVICE AND METHOD OF FORMING A POP DEVICE WITH EMBEDDED VERTICAL INTERCONNECT UNITS

CLAIM TO DOMESTIC PRIORITY

The present application is a continuation-in-part of U.S. patent application Ser. No. 13/477,982, filed May 22, 2012, which is a continuation-in-part of U.S. patent application Ser. No. 13/429,119, now U.S. Pat. No. 8,810,024, filed Mar. 23, 2012, which applications are incorporated herein by reference.

FIELD OF THE INVENTION

The present invention relates in general to semiconductor devices and, more particularly, to a semiconductor device and method of forming a package-on-package (PoP) with embedded vertical interconnect units.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the semiconductor material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to achieving the objectives of greater integration and smaller semiconductor devices is to focus on three-dimensional (3-D) packaging technologies including PoP. However, PoP often require laser drilling to form interconnect structures, which increases equipment cost and requires drilling through an entire package thickness. Laser drilling increases cycle time and decreases manufacturing throughput. Vertical interconnections formed exclusively by a laser drilling process can result in reduced control for vertical interconnections. Unprotected contacts can also lead to increases in yield loss for interconnections formed with subsequent surface mount technology (SMT). Furthermore, conductive materials used for forming vertical interconnects within PoP, such as copper (Cu), can incidentally be transferred to semiconductor die during package formation, thereby contaminating the semiconductor die within the package.

SUMMARY OF THE INVENTION

A need exists for vertical interconnects in a PoP semiconductor device formed without laser drilling through the package. Accordingly, in one embodiment, the present invention is a method of making a semiconductor device comprising the steps of providing a substrate, forming a plurality of conductive vias through the substrate, forming a plurality of bumps over the substrate, disposing a first semiconductor die over the substrate, depositing an encapsulant over the first semiconductor die and the bumps, removing a portion of the encapsulant to expose the bumps, and disposing a second semiconductor die over the first semiconductor die.

In another embodiment, the present invention is a method of making a semiconductor device comprising the steps of providing a substrate including a conductive via formed through the substrate, disposing a modular interconnect unit including a vertical interconnect structure over the substrate, disposing a first semiconductor die over the substrate, depositing an encapsulant over the first semiconductor die and modular interconnect unit, and removing a portion of the encapsulant to expose the vertical interconnect structure of the modular interconnect unit.

In another embodiment, the present invention is a semiconductor device comprising a first substrate including a conductive via formed through the substrate. An interconnect structure is disposed over the first substrate. A first semiconductor die is disposed over the first substrate. An encapsulant including an opening exposing the interconnect structure is deposited over the first substrate.

In another embodiment, the present invention is a semiconductor device comprising a substrate including a conductive via formed through the substrate. An interconnect structure is disposed over the substrate. A first semiconductor die is disposed over the substrate.

BRIEF DESCRIPTION OF THE DRAWINGS

FIGS. 5a-5i illustrate a process of forming a fan-out package-on-package (Fo-PoP) with semiconductor die interconnected by PWB modular units having vertical interconnect structures;

FIGS. 7a-7i illustrate various conductive vertical interconnect structures for PWB modular units;

FIGS. 13a-13i illustrate another process of forming a Fo-PoP with a modular unit formed from an encapsulant panel without embedded conductive pillars or bumps;

FIG. 14 illustrates another Fo-PoP with a modular unit formed from an encapsulant panel without embedded conductive pillars or bumps;

FIGS. 15a-15b illustrate a process of forming modular units from a PCB panel;

FIG. 16 illustrates another Fo-PoP with a modular unit formed from a PCB panel without embedded conductive pillars or bumps;

FIGS. 19a-19g illustrate another process of forming a 3-D semiconductor package including a TSV interposer PoP with embedded vertical interconnect structures;

FIGS. 21a-21h illustrate another process of forming a 3-D semiconductor package including a TSV interposer PoP with embedded vertical interconnect structures;

FIGS. 24a-24b illustrate a 3-D semiconductor package including a TSV interposer PoP with embedded vertical interconnect structures.

DETAILED DESCRIPTION OF THE DRAWINGS

Figure 1:
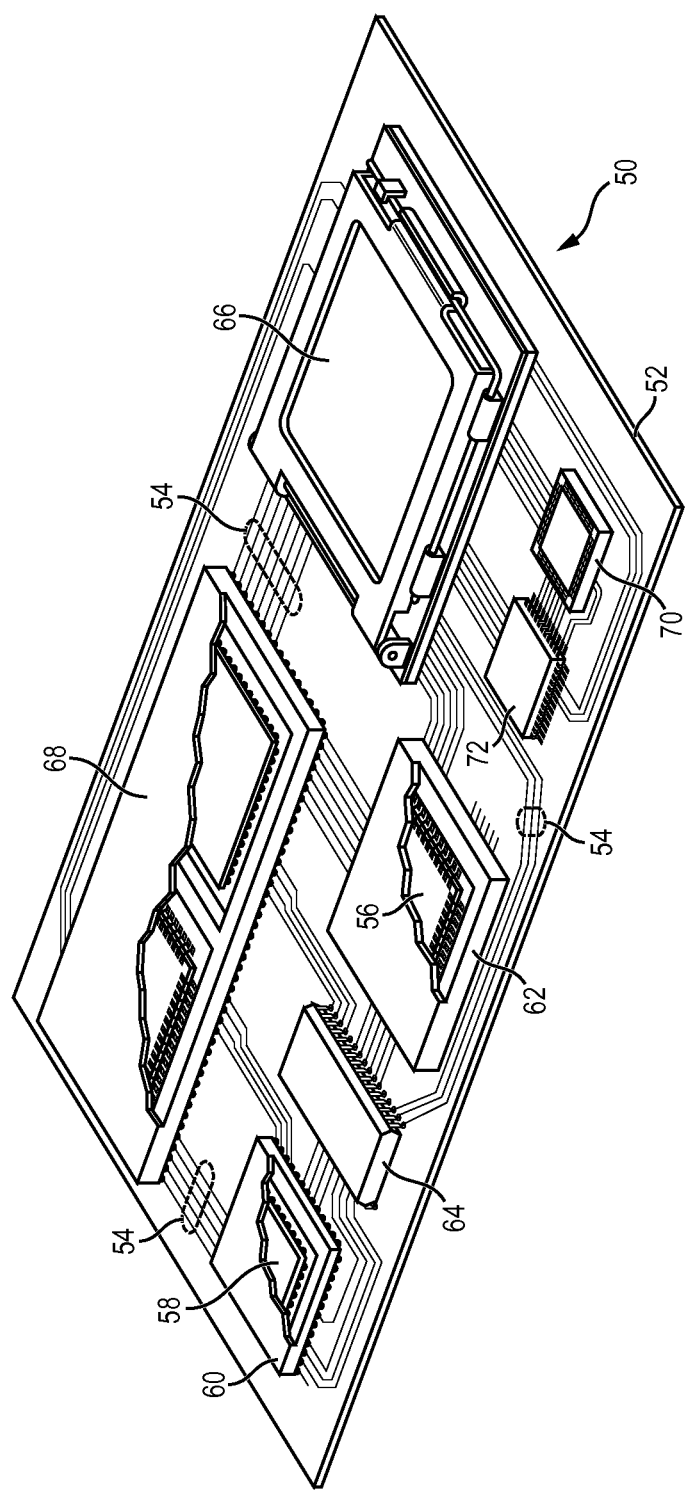
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
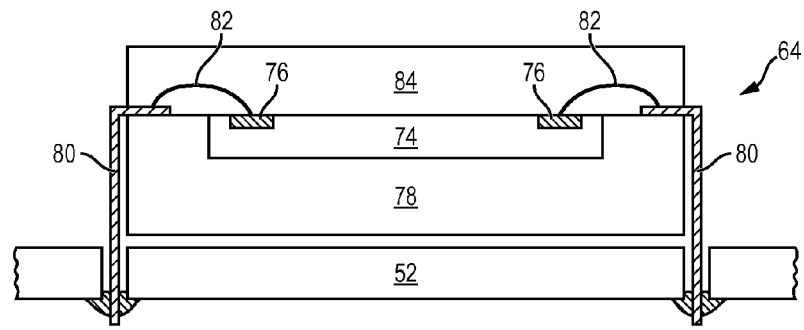
FIGS. 2a-2c illustrate further detail of the representative semiconductor packages mounted to the PCB.
Figure 2B:
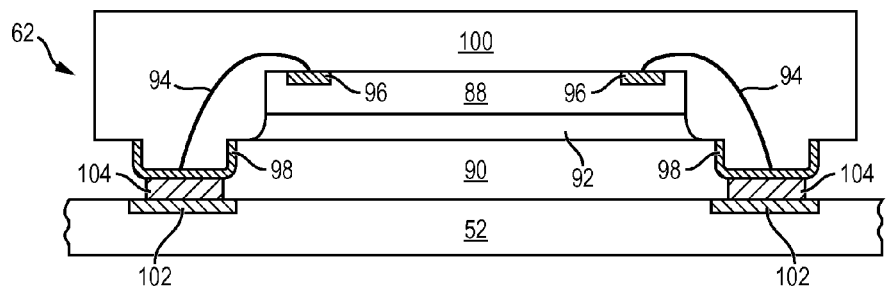
Figure 2C:
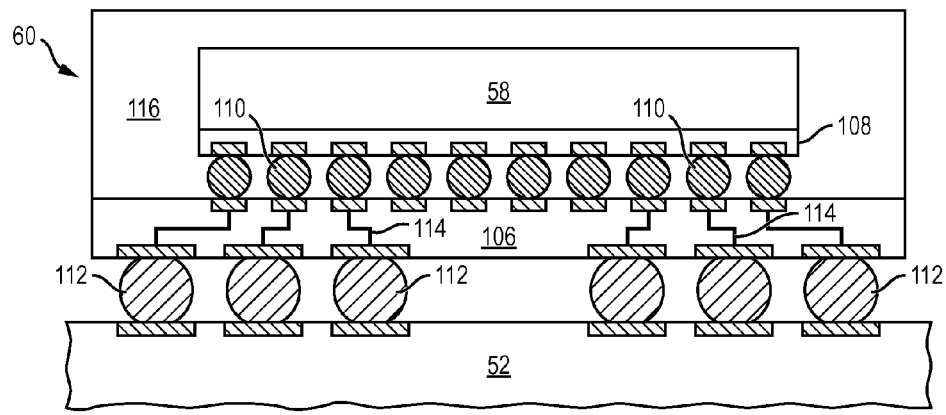

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), Cu, tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
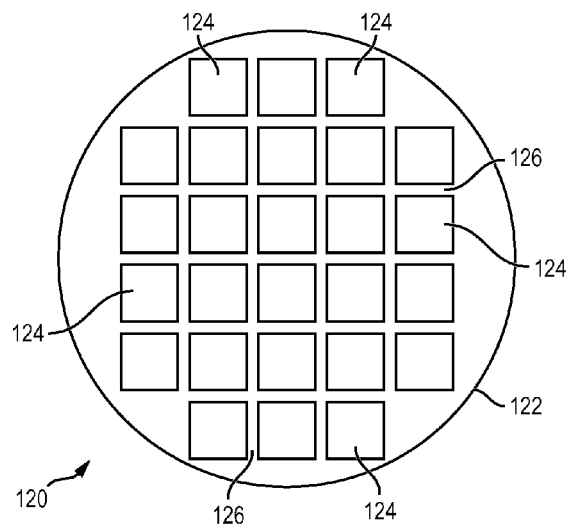
FIGS. 3a-3d illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 3B:
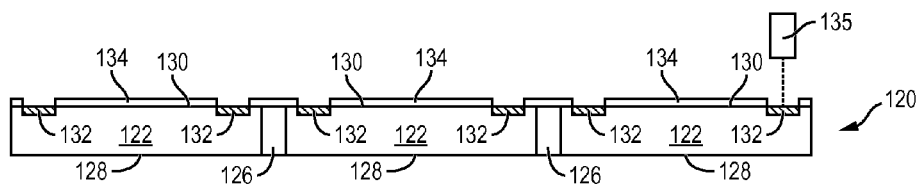

FIG. 3b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An optional insulating or passivation layer 134 is formed over active surface 130 using PVD, CVD, screen printing, spin coating, spray coating, sintering, or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 134 covers and provides protection for active surface 130. A portion of insulating layer 134 is removed by an etching process or by laser direct ablation (LDA) using laser 135 to expose conductive layer 132 for subsequent electrical interconnect.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 3C:
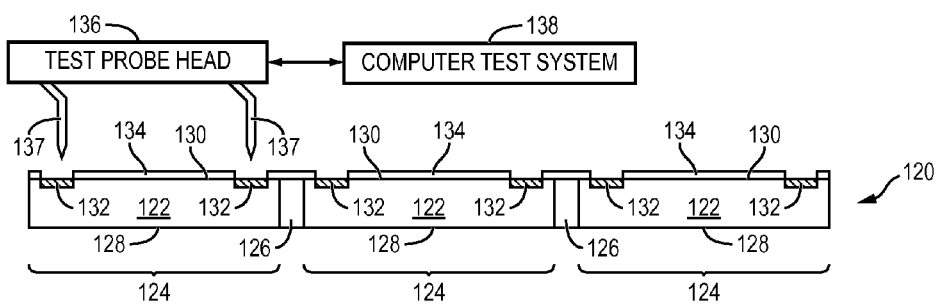

The active and passive components within semiconductor die 124 undergo testing at the wafer level for electrical performance and circuit function. Each semiconductor die 124 is tested for functionality and electrical parameters, as shown in FIG. 3c, using a probe 136 or other testing device. Test probe head 136 includes a plurality of probes 137. Probes 137 are used to make electrical contact with nodes or contact pads 132 on each semiconductor die 124 and provide electrical stimuli to the contact pads. Semiconductor die 124 responds to the electrical stimuli, which is measured by computer test system 138 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3D:
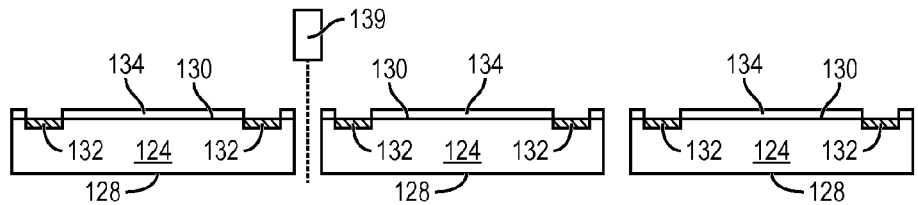

In FIG. 3d, semiconductor wafer 120 is singulated through saw street 126 using a saw blade or laser cutting tool 139 into individual semiconductor die 124. The individual semiconductor die 124 can be inspected and electrically tested for identification of KGD post singulation.

Figure 4A:
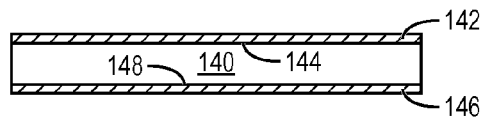
FIGS. 4a-4h illustrate a process of forming PWB modular units with vertical interconnect structures.

FIGS. 4a-4h and 5a-5i illustrate, in relation to FIGS. 1 and 2a-2c, a process of forming a Fo-PoP with PWB modular vertical interconnect units. FIG. 4a shows a cross-sectional view of a portion of laminate core 140. An optional conductive layer 142 is formed over surface 144 of core 140, and optional conductive layer 146 is formed over surface 148 of the core. Conductive layers 142 and 146 are formed using a metal deposition process such as Cu foil lamination, printing, PVD, CVD, sputtering, electrolytic plating, and electroless plating. Conductive layers 142 and 146 can be one or more layers of Al, Cu, Sn, Ni, Au, Ag, titanium (Ti), tungsten (W), or other suitable electrically conductive material. In one embodiment, conductive layers 142 and 146 are Cu foil having a thickness of 20-200 micrometers (µm). Conductive layers 142 and 146 can be thinned by a wet etching process.

Figure 4B:
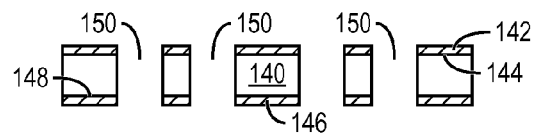

In FIG. 4b, a plurality of vias 150 is formed through laminate core 140 and conductive layers 142 and 146 using laser drilling, mechanical drilling, deep reactive ion etching (DRIE), or other suitable process. Vias 150 extend through laminate core 140. Vias 150 are cleaned by desmearing process.

Figure 4C:
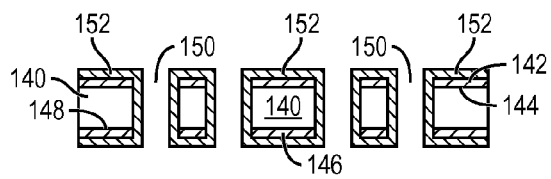

In FIG. 4c, a conductive layer 152 is formed over laminate core 140, conductive layers 142 and 146, and sidewalls of vias 150 using a metal deposition process such as printing, PVD, CVD, sputtering, electrolytic plating, and electroless plating. Conductive layer 152 can be one or more layers of Al, Cu, Sn, Ni, Ag, Ti, W, or other suitable electrically conductive material. In one embodiment, conductive layer 152 includes a first Cu layer formed by electroless plating, followed by a second Cu layer formed by electrolytic plating.

Figure 4D:
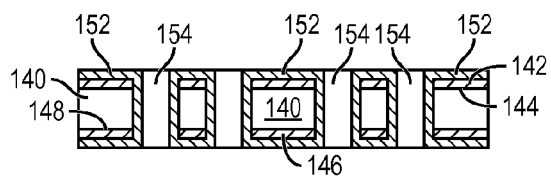

In FIG. 4d, the remaining portion of vias 150 is filled with an insulating or conductive material with filler material 154. The insulating material with insulating filler can be polymer dielectric material with filler and one or more of SiO2, Si3N4, SiON, Ta2O5, Al2O3, or other material having similar insulating and structural properties. The conductive filler material can be one or more layers of Al, Cu, Sn, Ni, Au, Ag, or other suitable electrically conductive material. In one embodiment, filler material 154 can be a polymer plug. Alternatively, filler material 154 is Cu paste. Vias 150 can also be left as a void, i.e., without filler material. Filler material 154 is selected to be softer or more compliant than conductive layer 152. Vias 150 with filler material 154 reduce the incidence of cracking or delamination by allowing deformation or change of shape of conductive layer 152 under stress. Vias 150 can also be completely filled with conductive layer 152.

Figure 4E:
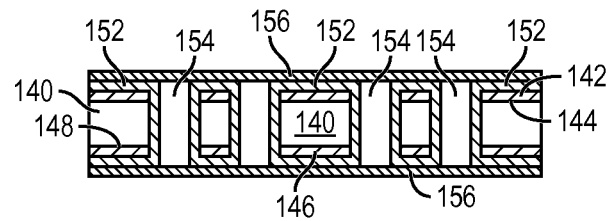

In FIG. 4e, a conductive layer 156 is formed over conductive layer 152 and filler material 154 using a metal deposition process such as printing, PVD, CVD, sputtering, electrolytic plating, and electroless plating. Conductive layer 156 can be one or more layers of Al, Cu, Sn, Ni, Au, Ag, Ti, W, or other suitable electrically conductive material. In one embodiment, conductive layer 156 includes a first Cu layer formed by electroless plating, followed by a second Cu layer formed by electrolytic plating.

Figure 4F:
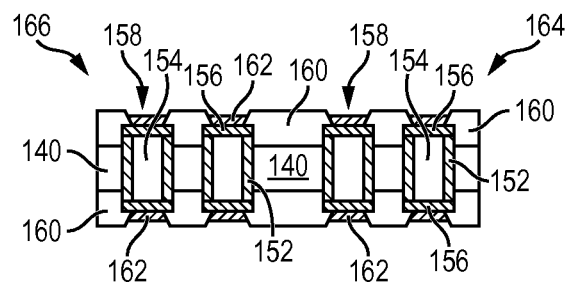

In FIG. 4f, a portion of conductive layers 142, 146, 152, and 156 is removed by a wet etching process through a patterned photoresist layer to expose laminate core 140 and leave conductive pillars or conductive vertical interconnect structures 158 through laminate core 140. An insulating or passivation layer 160 is formed over laminate core 140 and conductive vertical interconnect structures 158 using vacuum lamination, spin coating, spray coating, screen printing, or other printing process. The insulating layer 160 contains one or more layers of SiO2, Si3N4, SiON, Ta2O5, Al2O3, polymer dielectric material with or without insulating filler, or other material having similar insulating and structural properties. A portion of insulating layer 160 is removed by an etching process or LDA to expose conductive layer 156 and facilitate the formation of subsequent conductive layers.

An optional conductive layer 162 can be formed over the exposed conductive layer 156 using a metal deposition process such as electrolytic plating and electroless plating. Conductive layer 162 can be one or more layers of Al, Cu, Sn, Ni, Au, Ag, Ti, W, or other suitable electrically conductive material. In one embodiment, conductive layer 162 is a Cu protective layer.

Figure 4H:
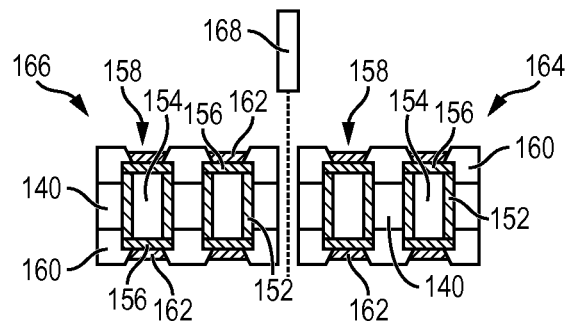
Figure 4G:
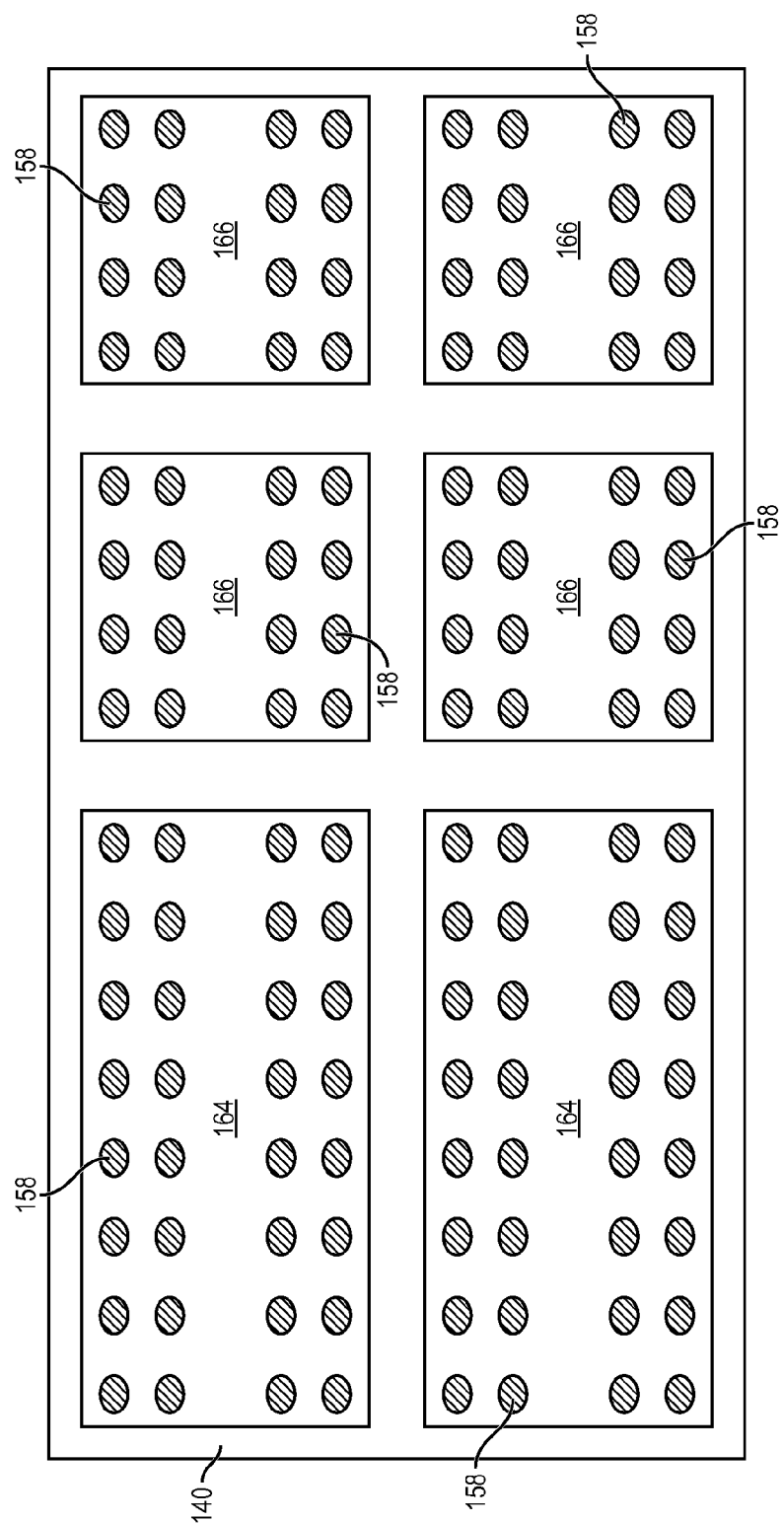

Laminate core 140 with vertical interconnect structures 158 constitute one or more PWB modular vertical interconnect units, which are disposed between semiconductor die or packages to facilitate electrical interconnect for a Fo-PoP. FIG. 4g shows a plan view of laminate core 140 organized into PWB modular units 164-166. PWB modular units 164-166 contain multiple rows of vertical interconnect structures 158 extending between opposing surfaces of the PWB units. PWB units 164-166 are configured for integration into Fo-PoP, and as such, differ in size one from another according to a final device configuration as discussed in more detail below. While PWB units 164-166 are illustrated in FIG. 4g as including square or rectangular footprints, alternatively, the PWB units can include cross-shaped (+), angled or "L-shaped," circular, oval, hexagonal, octagonal, star shaped, or any geometrically shaped footprint. FIG. 4h shows laminate core 140 singulated into individual PWB modular units 164 and 166 using saw blade or laser cutting tool 168.

FIG. 5a shows a cross-sectional view of a portion of a carrier or temporary substrate 170 containing sacrificial base material such as silicon, polymer, beryllium oxide, glass, or other suitable low-cost, rigid material for structural support. An interface layer or double-sided tape 172 is formed over carrier 170 as a temporary adhesive bonding film, etch-stop layer, or thermal release layer.

Carrier 170 can be a round or rectangular panel (greater than 300 mm) with capacity for multiple semiconductor die 124. Carrier 170 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 170 is selected independent of the size of semiconductor die 124 or size of semiconductor wafer 120. That is, carrier 170 has a fixed or standardized size, which can accommodate various size semiconductor die 124 singulated from one or more semiconductor wafers 120. In one embodiment, carrier 170 is circular with a diameter of 330 mm. In another embodiment, carrier 170 is rectangular with a width of 560 mm and length of 600 mm. Semiconductor die 124 may have dimensions of 10 mm by 10 mm, which are placed on the standardized carrier 170. Alternatively, semiconductor die 124 may have dimensions of 20 mm by 20 mm, which are placed on the same standardized carrier 170. Accordingly, standardized carrier 170 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 170 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

PWB modular units 164-166 from FIG. 4h are mounted to interface layer 172 and carrier 170 using a pick and place operation. After placing PWB units 164-166, semiconductor die 124 from FIG. 3d are mounted to interface layer 172 and carrier 170 using a pick and place operation with active surface 130 oriented toward the carrier. FIG. 5b shows semiconductor die 124 and PWB units 164-166 mounted to carrier 170 as a reconstituted wafer 174. Semiconductor die 124 extend above PWB units 164-166 by a distance D1 that is greater than or equal to 1 µm, e.g., 1-150 µm. The offset between PWB units 164-166 and semiconductor die 124 reduces contamination during a subsequent backgrinding step.

In FIG. 5c, an encapsulant or molding compound 176 is deposited over semiconductor die 124, PWB units 164-166, and carrier 170 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. Encapsulant 176 is non-conductive and environmentally protects the semiconductor device from external elements and contaminants. Encapsulant 176 also protects semiconductor die 124 from degradation due to exposure to light.

In FIG. 5d, carrier 170 and interface layer 172 are removed by chemical etching, mechanical peeling, chemical mechanical polishing (CMP), mechanical grinding, thermal bake, UV light, laser scanning, or wet stripping to expose insulating layer 134 of semiconductor die 124, PWB units 164-166, and encapsulant 176.

In FIG. 5e, a build-up interconnect structure 180 is formed over semiconductor die 124, PWB units 164-166, and encapsulant 176. An insulating or passivation layer 182 is formed over semiconductor die 124, PWB units 164-166, and encapsulant 176 using PVD, CVD, lamination, printing, spin coating, spray coating, sintering, or thermal oxidation. The insulating layer 182 contains one or more layers of low temperature (less than 250° C.) curing polymer dielectric with or without insulating fillers, like SiO2, Si3N4, SiON, Ta2O5, Al2O3, rubber particles, or other material having similar insulating and structural properties. A portion of insulating layer 182 is removed by etching, LDA, or other suitable process to expose vertical interconnect structures 158 of PWB units 164-166 and conductive layer 132 of semiconductor die 124.

An electrically conductive layer or RDL 184 formed over insulating layer 182 using a patterning and metal deposition process such as sputtering, electrolytic plating, and electroless plating. Conductive layer 184 can be one or more layers of Al, Cu, Sn, Ni, Au, Ag, or other suitable electrically conductive material. In one embodiment, conductive layer 184 contains Ti/Cu, TiW/Cu, or Ti/NiV/Cu. One portion of conductive layer 184 is electrically connected to contact pads 132 of semiconductor die 124. Another portion of conductive layer 184 is electrically connected to vertical interconnect structures 158 of PWB units 164-166. Other portions of conductive layer 184 can be electrically common or electrically isolated depending on the design and function of semiconductor die 124.

An insulating or passivation layer 186 is formed over insulating layer 182 and conductive layer 184 using PVD, CVD, lamination, printing, spin coating, or spray coating. The insulating layer 186 contains one or more layers of low temperature (less than 250° C.) curing polymer dielectric with or without insulating fillers, like SiO2, Si3N4, SiON, Ta2O5, Al2O3, rubber particles, or other material having similar insulating and structural properties. A portion of insulating layer 186 is removed by an etching process to expose conductive layer 184.

An electrically conductive layer or RDL 188 formed over conductive layer 184 and insulating layer 186 using a patterning and metal deposition process such as sputtering, electrolytic plating, and electroless plating. Conductive layer 188 can be one or more layers of Al, Cu, Sn, Ni, Au, Ag, or other suitable electrically conductive material. In one embodiment, conductive layer 188 contains Ti/Cu, TiW/Cu, or Ti/NiV/Cu. One portion of conductive layer 188 is electrically connected to conductive layer 184. Other portions of conductive layer 188 can be electrically common or electrically isolated depending on the design and function of semiconductor die 124.

An insulating or passivation layer 190 is formed over insulating layer 186 and conductive layer 188 using PVD, CVD, printing, spin coating, or spray coating. The insulating layer 190 contains one or more layers of SiO2, Si3N4, SiON, Ta2O5, Al2O3, low temperature (less than 250° C.) curing polymer dielectric with or without insulating fillers, or other material having similar insulating and structural properties. A portion of insulating layer 190 is removed by etching, LDA, or other suitable process to expose conductive layer 188.

The number of insulating and conductive layers included within build-up interconnect structure 180 depends on, and varies with, the complexity of the circuit routing design. Accordingly, build-up interconnect structure 180 can include any number of insulating and conductive layers to facilitate electrical interconnect with respect to semiconductor die 124.

An electrically conductive bump material is deposited over build-up interconnect structure 180 and electrically connected to the exposed portion of conductive layer 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 188 using a suitable attachment or bonding process. In one embodiment, the bump material is reflowed by heating the material above the material's melting point to form spherical balls or bumps 192. In some applications, bumps 192 are reflowed a second time to improve electrical contact to conductive layer 188. In one embodiment, bumps 192 are formed over an under bump metallization (UBM) layer. Bumps 192 can also be compression bonded or thermocompression bonded to conductive layer 188. Bumps 192 represent one type of interconnect structure that can be formed over conductive layer 188. The interconnect structure can also use bond wire, conductive paste, stud bump, micro bump, or other electrical interconnect.

In FIG. 5f, a portion of encapsulant 176 and semiconductor die 124 is removed by a grinding operation with grinder 194 to planarize the surface and reduce a thickness of the encapsulant. Encapsulant 176 remains over PWB units 164-166. A thickness D2 between back surface 128 of semiconductor die and PWB units 164-166 is 1-150 µm. In one embodiment, D2 is 100 µm. A chemical etch, CMP, or plasma dry etch can also be used to remove back grinding damage and residue stress on semiconductor die 124 and encapsulant 176 to enhance the package strength.

Figure 5G:
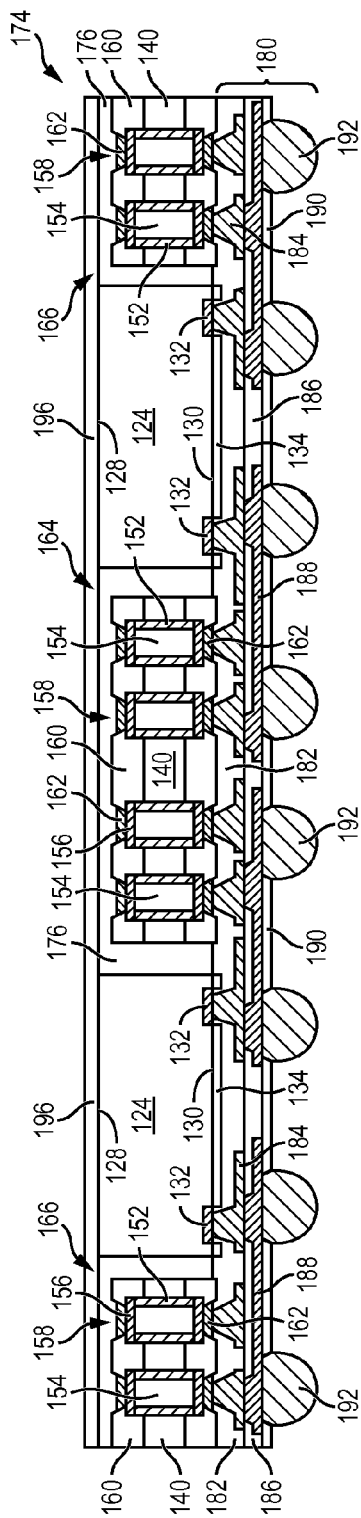

In FIG. 5g, a backside balance layer 196 is applied over encapsulant 176, PWB units 164-166, and semiconductor die 124. Backside balance layer 196 balances the coefficient of thermal expansion (CTE), e.g., 30-150 ppm/K, of conductive layers 184 and 188 and reduces warpage in the package. In one embodiment, backside balance layer 196 has a thickness of 10-100 µm. Backside balance layer 196 can be any suitable balance layer with suitable thermal and structural properties, such as resin coated copper (RCC) tape.

Figure 5H:
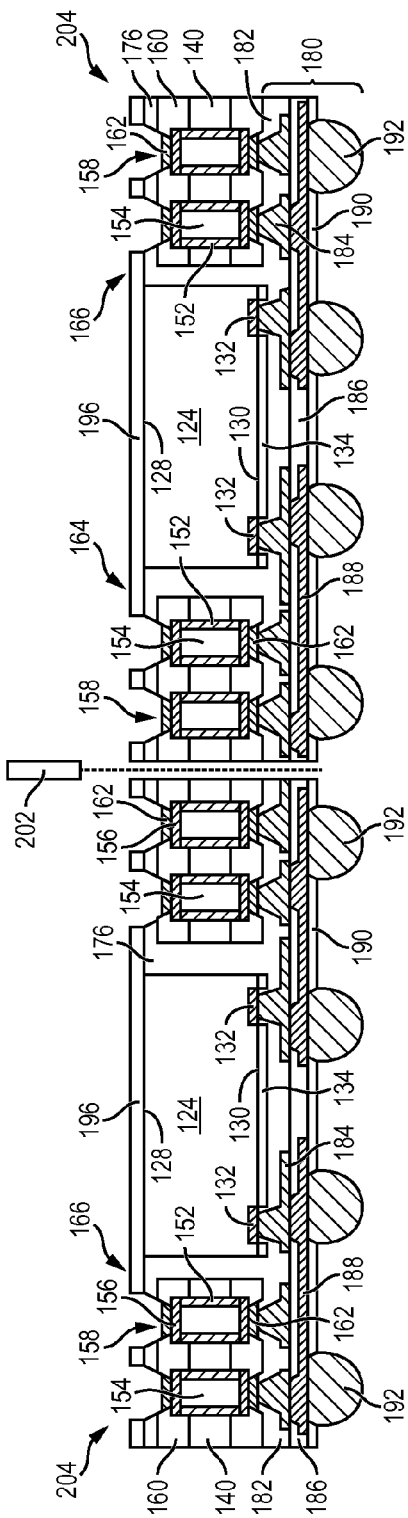

In FIG. 5h, a portion of backside balance layer 196 and encapsulant 176 is removed to expose vertical interconnect structures 158. Reconstituted wafer 174 is singulated through PWB modular unit 164 using saw blade or laser cutting tool 202 into separate Fo-PoP 204.

Figure 5I:
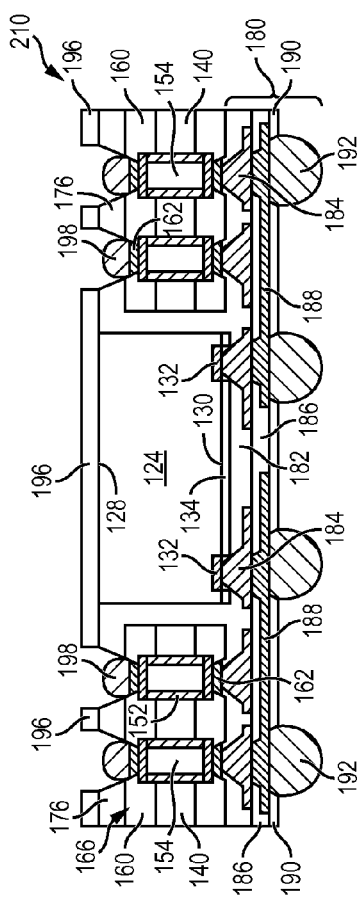

FIG. 5i shows Fo-PoP 210 with bumps 198 formed over the exposed vertical interconnect structures 158. Bumps 198 are disposed at least 1 µm below back surface 128 of semiconductor die 124. Alternatively, bumps 198 extend above backside balance layer 196 and can have a height of 25-67% of the thickness of semiconductor die 124.

PWB modular units 164-166 disposed within Fo-PoP 204 can differ in size and shape one from another while still providing through vertical interconnect for the Fo-PoP. PWB modular units 164-166 include interlocking footprints having square and rectangular shapes, a cross-shape (+), an angled or "L-shape," a circular or oval shape, a hexagonal shape, an octagonal shape, a star shape, or any other geometric shape. At the wafer level, before singulation, PWB modular units 164-166 are disposed around semiconductor die 124 in an interlocking pattern such that different sides of the semiconductor die are aligned with, and correspond to, a number of different sides of the PWB units in a repeating pattern. PWB units 164-166 may include additional metal layers to facilitate design integration and increased routing flexibility.

PWB modular units 164-166 provide a cost effective alternative to using standard laser drilling processes for vertical interconnection in Fo-PoP for a number of reasons. First, PWB units 164-166 can be made with low cost manufacturing technology such as substrate manufacturing technology. Second, standard laser drilling includes high equipment cost and requires drilling through an entire package thickness, which increases cycle time and decrease manufacturing throughput. Furthermore, the use of PWB units 164-166 for vertical interconnection provides an advantage of improved control for vertical interconnection with respect to vertical interconnections formed exclusively by a laser drilling process.

Figure 6A:
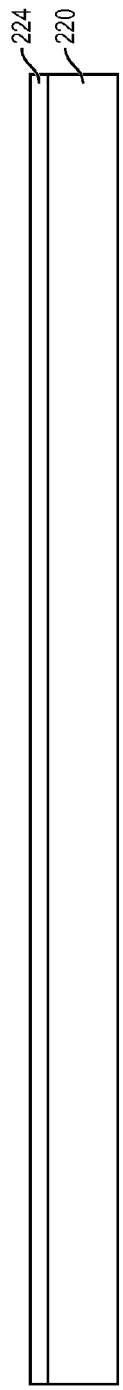
FIGS. 6a-6s illustrate another process of forming a Fo-PoP with semiconductor die interconnected by PWB modular units having vertical interconnect structures.

In another embodiment, FIG. 6a shows a cross-sectional view of a portion of a carrier or temporary substrate 220 containing sacrificial base material such as silicon, polymer, beryllium oxide, glass, or other suitable low-cost, rigid material for structural support. An interface layer or double-sided tape 224 is formed over carrier 220 as a temporary adhesive bonding film, etch-stop layer, or thermal release layer.

Figure 6B:
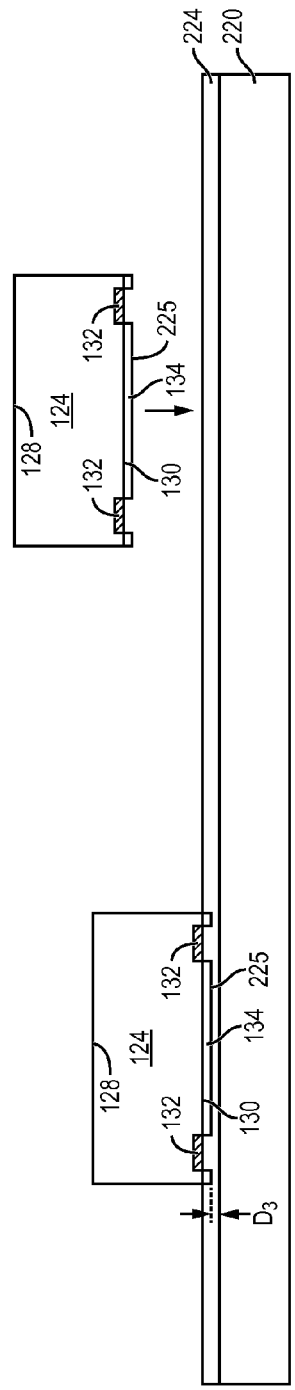

In FIG. 6b, semiconductor die 124 from FIG. 3d are mounted to interface layer 224 and carrier 220 using a pick and place operation with active surface 130 oriented toward the carrier. Semiconductor die 124 are pressed into interface layer 224 such that insulating layer 134 is disposed into the interface layer. When semiconductor die 124 is mounted to interface layer 224, a surface 225 of insulating layer 134 is separated by a distance D3 from carrier 220.

In FIG. 6c, PWB modular units 164-166 from FIG. 4h are mounted to interface layer 224 and carrier 220 using a pick and place operation. PWB units 164-166 are pressed into interface layer 224 such that contacting surface 226 is disposed into the interface layer. When PWB units 164-166 are mounted to interface layer 224, surface 226 is separated by a distance D4 from carrier 220. D4 may be greater than D3 such that surface 226 of PWB units 164-166 is vertically offset with respect to surface 225 of insulating layer 134.

FIG. 6d shows semiconductor die 124 and PWB modular units 164-166 mounted to carrier 220 as a reconstituted wafer 227. A surface 228 of PWB units 164-166, opposite surface 226, is vertically offset with respect to back surface 128 of semiconductor die 124 by a distance of D5, e.g., 1-150 µm. By separating surface 228 of PWB units 166 and back surface 128 of semiconductor die 124 material from vertical interconnect structures 158, such as Cu, is prevented from contaminating a material of semiconductor die 124, such as Si, during a subsequent backgrinding step.

Figure 6E:
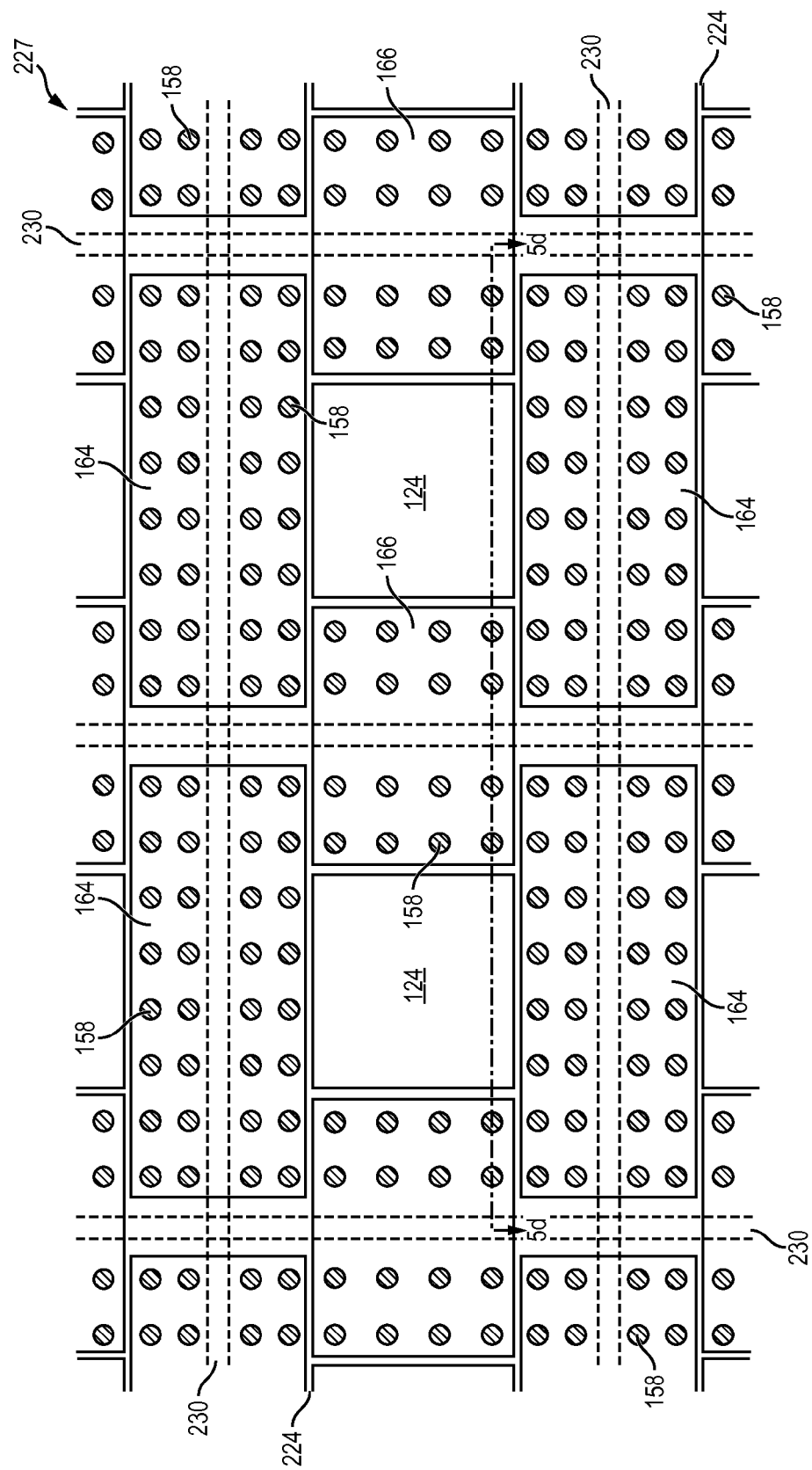

FIG. 6e shows a plan view of a portion of reconstituted wafer 227 having PWB modular units 164-166 mounted over interface layer 224. PWB units 164-166 contain multiple rows of vertical interconnect structures 158 that provide through vertical interconnection between opposing sides of the PWB units. PWB units 164-166 are disposed around semiconductor die 124 in an interlocking pattern. PWB units 164-166 are disposed around semiconductor die 124 in such a way that different sides of the semiconductor die are aligned with, and correspond to, a number of different sides of the PWB units in a repeating pattern across reconstituted wafer 227. A plurality of saw streets 230 are aligned with respect to semiconductor die 124 and extend across PWB units 164-166 such that when reconstituted wafer 227 is singulated along the saw streets, each semiconductor die 124 has a plurality of vertical interconnect structures 158 from singulated PWB units 164-166 disposed around or in a peripheral region around the semiconductor die. While PWB units 164-166 are illustrated with interlocking square and rectangular footprints, the PWB units disposed around semiconductor die 124 can include PWB units having footprints with a cross-shape (+), an angled or "L-shape," a circular or oval shape, a hexagonal shape, an octagonal shape, a star shape, or any other geometric shape.

Figure 6F:
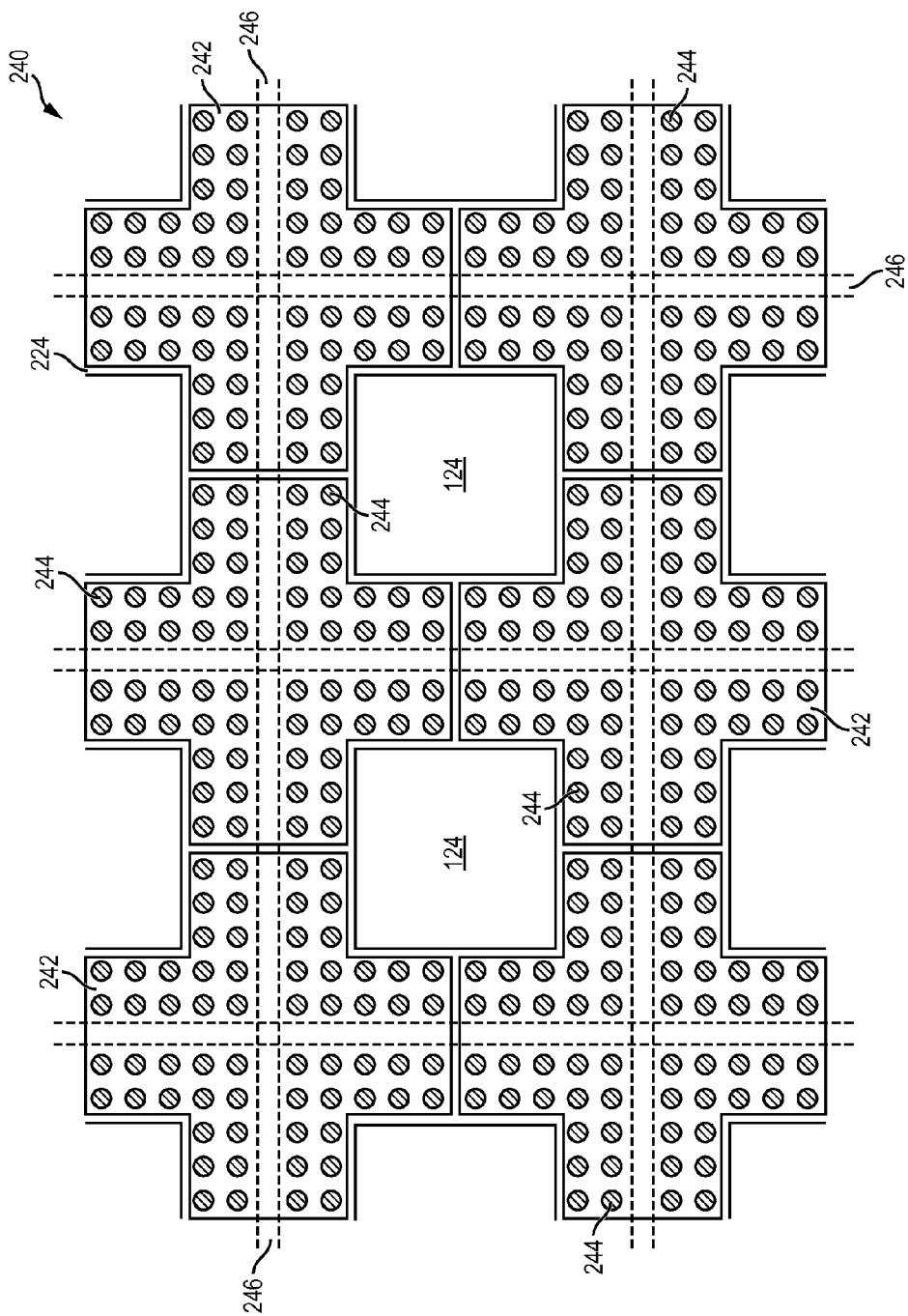

FIG. 6f shows a plan view of a portion of a reconstituted wafer 240 having cross-shaped (+) PWB modular units 242 mounted over interface layer 224. PWB units 242 are formed in a process similar to PWB units 164-166 as shown in FIGS. 4a-4h. PWB units 242 contain multiple rows of vertical interconnect structures 244 that are similar to vertical interconnect structures 158, and provide through vertical interconnection between opposing sides of the PWB units. PWB units 242 are disposed around semiconductor die 124 in an interlocking pattern. PWB units 242 are disposed around semiconductor die 124 in such a way that different sides of the semiconductor die are aligned with, and correspond to, a number of different sides of the PWB units in a repeating pattern across reconstituted wafer 240. A plurality of saw streets 246 are aligned with respect to semiconductor die 124 and extend across PWB units 242 such that when reconstituted wafer 240 is singulated along the saw streets, each semiconductor die 124 has a plurality of vertical interconnect structures 244 from singulated PWB units 242 disposed around or in a peripheral region around the semiconductor die. Vertical interconnect structures 244 are disposed in one or more rows offset from a perimeter of the semiconductor die after singulation through saw streets 246.

FIG. 6g shows a plan view of a portion of a reconstituted wafer 250 having angled or "L-shaped" PWB modular units 252 mounted over interface layer 224. PWB units 252 are formed in a process similar to PWB units 164-166 as shown in FIGS. 4a-4h. PWB units 252 contain multiple rows of vertical interconnect structures 254 that are similar to vertical interconnect structures 158, and provide through vertical interconnection between opposing sides of the PWB units. PWB units 252 are disposed around semiconductor die 124 in an interlocking pattern. PWB units 252 are disposed around semiconductor die 124 in such a way that different sides of the semiconductor die are aligned with, and correspond to, a number of different sides of the PWB units in a repeating pattern across reconstituted wafer 250. A plurality of saw streets 256 are aligned with respect to semiconductor die 124 and extend across PWB units 252 such that when reconstituted wafer 250 is singulated along the saw streets, each semiconductor die 124 has a plurality of vertical interconnect structures 254 from singulated PWB units 252 disposed around or in a peripheral region around the semiconductor die. Vertical interconnect structures 254 are disposed in one or more rows offset from a perimeter of the semiconductor die after singulation through saw streets 256.

Figure 6H:
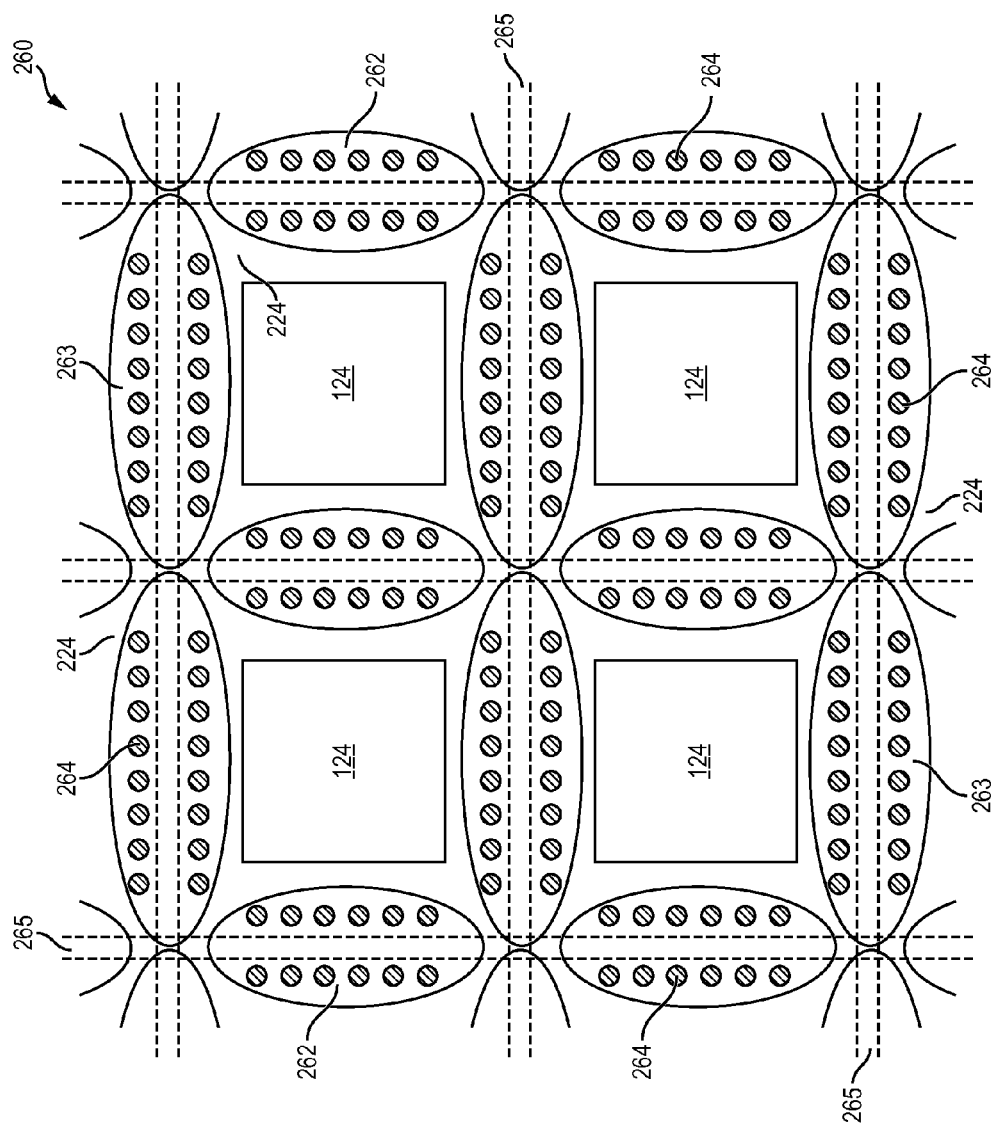

FIG. 6h shows a plan view of a portion of a reconstituted wafer 260 having circular or oval shaped PWB modular units 262 and 263 mounted over interface layer 224. PWB units 262 and 263 are formed in a process similar to PWB units 164-166 as shown in FIGS. 4a-4h. PWB units 262 and 263 contain multiple rows of vertical interconnect structures 264 that are similar to vertical interconnect structures 158, and provide through vertical interconnection between opposing sides of the PWB units. PWB units 262 and 263 are disposed around semiconductor die 124 in an interlocking pattern. PWB units 262-263 are disposed around semiconductor die 124 in such a way that different sides of the semiconductor die are aligned with, and correspond to, a number of different portions of the PWB units in a repeating pattern across reconstituted wafer 260. A plurality of saw streets 265 are aligned with respect to semiconductor die 124 and extend across PWB units 262 and 263 such that when reconstituted wafer 260 is singulated along the saw streets, each semiconductor die 124 has a plurality of vertical interconnect structures 264 from singulated PWB units 262 and 263 disposed around or in a peripheral region around the semiconductor die. Vertical interconnect structures 264 are disposed in one or more rows offset from a perimeter of the semiconductor die after singulation through saw streets 265.

Figure 6I:
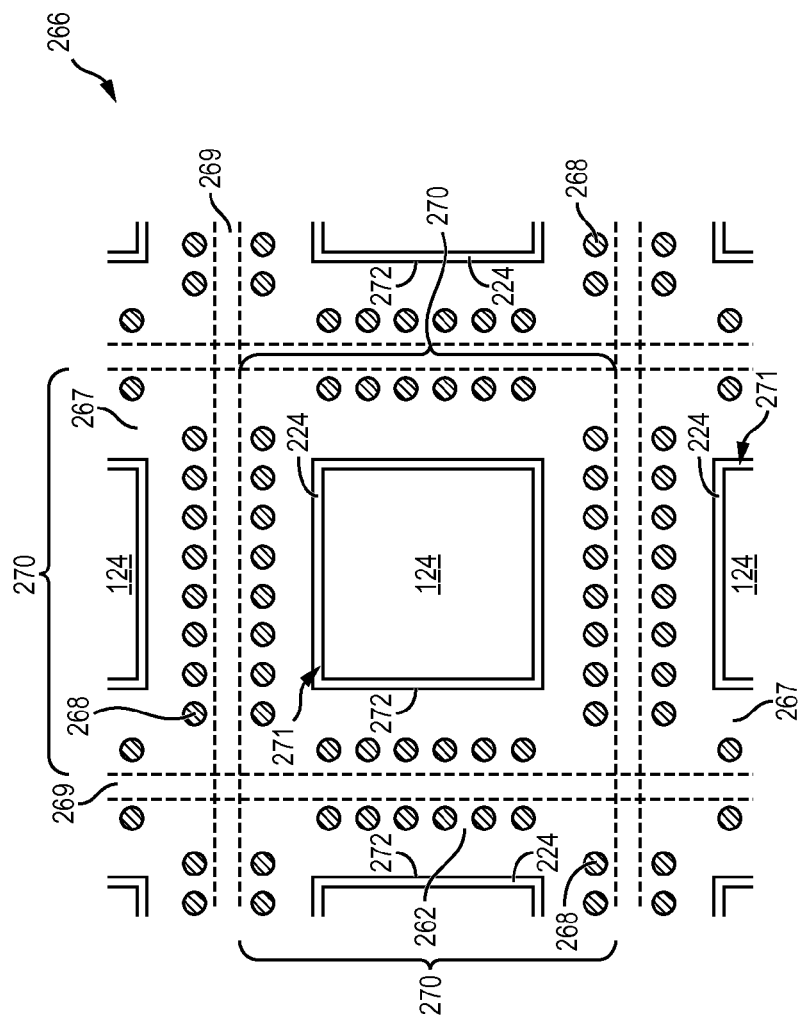

FIG. 6i shows a plan view of a portion of a reconstituted wafer 266 having a continuous PWB or PCB panel 267 mounted over interface layer 224. PWB panel 267 is aligned with and laminated on interface layer 224 on temporary carrier 220. PWB panel 267 is formed in a process similar to PWB units 164-166 as shown in FIGS. 4a-4h, and is formed at panel scale, for example as a 300-325 mm round panel or 470 mm×370 mm rectangular panel. The final panel size is about 5 mm to 15 mm smaller than final fan-out panel substrate size in either diameter or length or width. PWB panel 267 has a thickness ranging from 50-250 μm. In one embodiment, PWB panel 267 has a thickness of 80 μm. Multiple rows of vertical interconnect structures 268 that are similar to vertical interconnect structures 158 are formed through PWB panel 267. A plurality of saw streets 265 separate PWB panel into individual PWB units 270. Vertical interconnect structures 268 are formed around a peripheral area of PWB unit 270.

A central portion of each PWB unit 270 is removed by punching, etching, LDA, or other suitable process to form openings 271. Openings 271 are formed centrally with respect to the vertical interconnect structures 268 of each PWB unit 270 and are formed through PWB units 270 to expose interface layer 224. Openings 271 have a generally square footprint and are formed large enough to accommodate semiconductor die 124 from FIG. 3d. Semiconductor die 124 are mounted to interface layer 224 within openings 271 using a pick and place operation with active surface 130 of semiconductor die 124 oriented toward interface layer 224. The clearance or distance between the edge 272 of opening 271 and semiconductor die 124 is at least 50 μm. PWB panel 267 is singulated along saw streets 269 into individual PWB units 270, and each semiconductor die 124 has a plurality of vertical interconnect structures 268 disposed around or in a peripheral region of the semiconductor die. Vertical interconnect structures 268 can be disposed in the peripheral region of semiconductor 124 as one or more rows offset from a perimeter of the semiconductor die after singulation through saw streets 269.

Figure 6J:
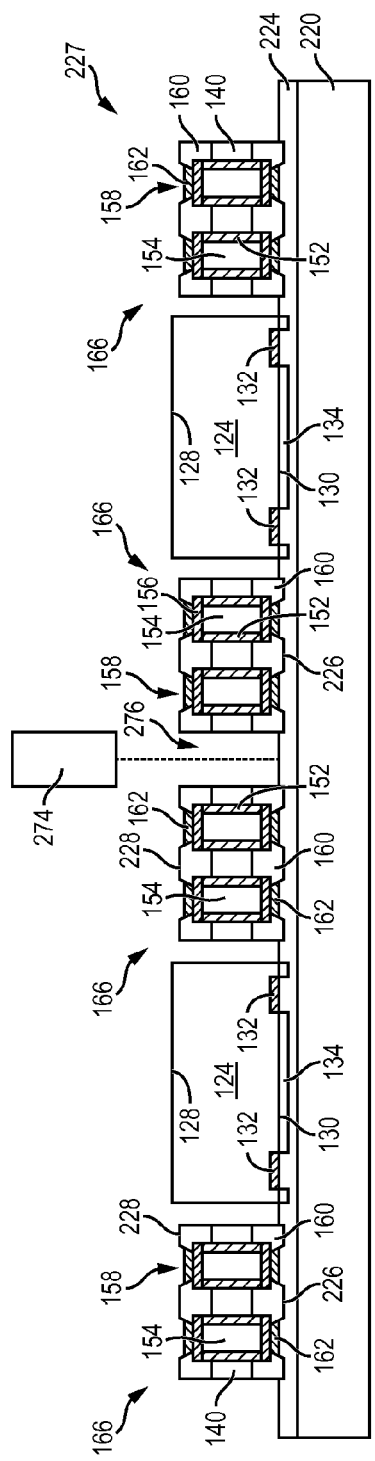

Continuing from FIG. 6d, FIG. 6j shows that after semiconductor die 124 and PWB modular units 164-166 are mounted to interface layer 224, reconstituted wafer 227 is partially singulated through saw street 230 using a saw blade or laser cutting tool 274 to form channels or openings 276. Channel 276 extends through PWB units 164-166, and additionally may extend through interface layer 224 and partially but not completely through carrier 220. Channel 276 forms a separation among vertical interconnect structures 158 and the semiconductor die 124 to which the conductive vias will be subsequently joined in a Fo-PoP.

Figure 6K:
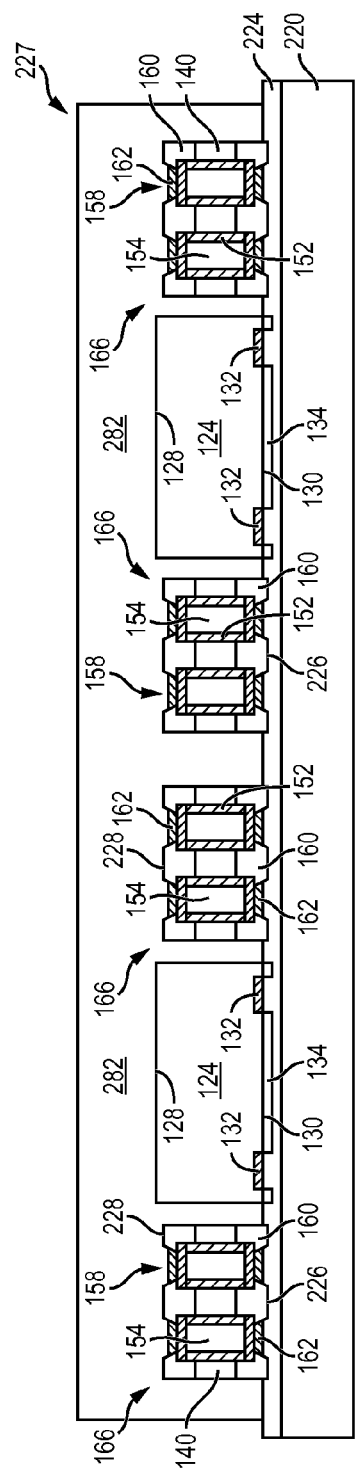

In FIG. 6k, an encapsulant or molding compound 282 is deposited over semiconductor die 124, PWB units 164-166, and carrier 220 using a paste printing, compressive molding, transfer molding, liquid encapsulant molding, vacuum lamination, spin coating, or other suitable applicator. Encapsulant 282 can be polymer composite material, such as epoxy resin with filler, epoxy acrylate with filler, or polymer with proper filler. Encapsulant 282 is non-conductive and environmentally protects the semiconductor device from external elements and contaminants. Encapsulant 282 also protects semiconductor die 124 from degradation due to exposure to light.

Figure 6L:
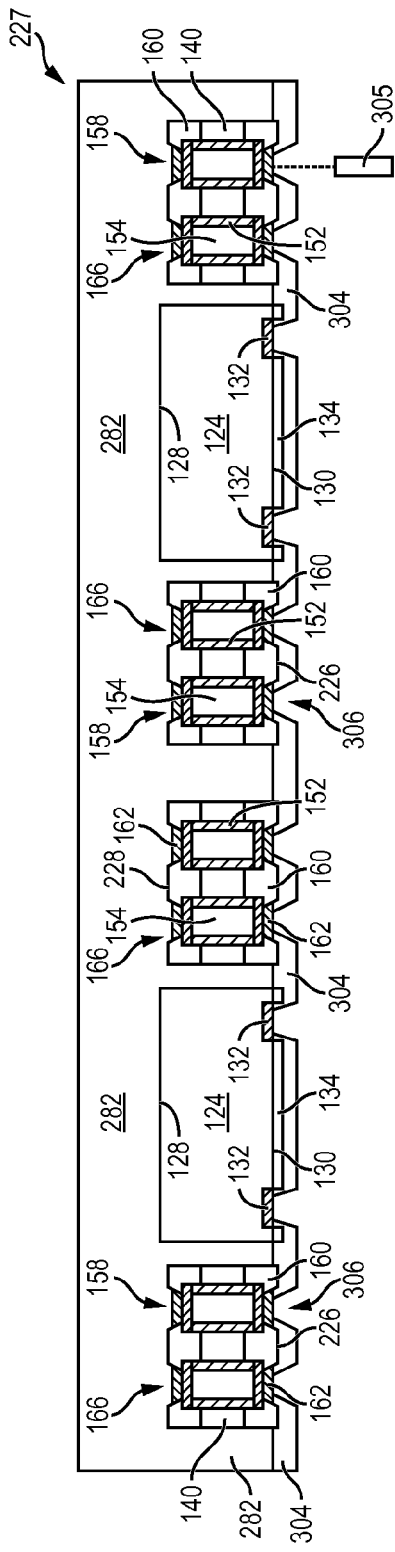

In FIG. 6l, carrier 220 and interface layer 224 are removed from reconstituted wafer 227 by chemical etching, mechanical peeling, CMP, mechanical grinding, thermal bake, UV light, laser scanning, or wet stripping to facilitate the formation of an interconnect structure over active surface 130 of semiconductor die 124 and vertical interconnect structures 158 of PWB units 164-166.

FIG. 6l also shows an insulating or passivation layer 304 is conformally applied to, and has a first surface that follows the contours of, encapsulant 282, PWB units 164-166, and semiconductor die 124. The insulating layer 304 has a second planar surface opposite the first surface. The insulating layer 304 contains one or more layers of SiO2, Si3N4, SiON, Ta2O5, Al2O3, low temperature (less than 250° C.) curing polymer dielectric with or without filler, or other material having similar insulating and structural properties. The insulating layer 304 is deposited using PVD, CVD, printing, spin coating, spray coating, or other suitable process. A portion of insulating layer 304 is removed by LDA using laser 305, etching, or other suitable process to form openings 306 over vertical interconnect structures 158 and conductive layer 132. Openings 306 expose vertical interconnect structures 158 and conductive layer 132 of semiconductor die 124 for subsequent electrical connection according to the configuration and design of semiconductor die 124.

Figure 6M:
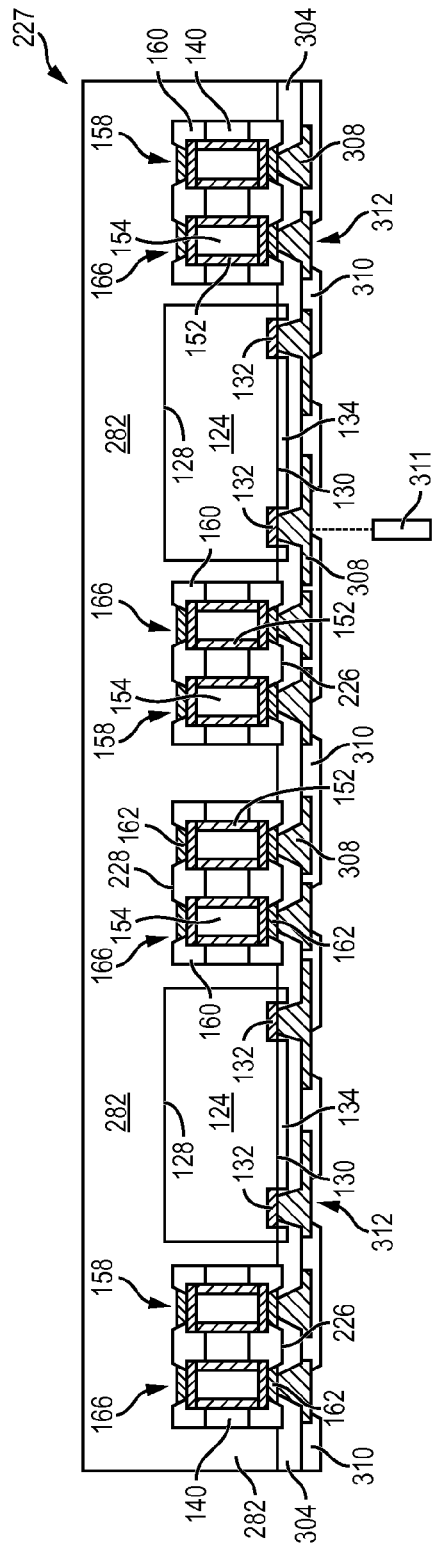

In FIG. 6m, an electrically conductive layer 308 is patterned and deposited over insulating layer 304, over semiconductor die 124, and disposed within openings 306 to fill the openings and contact vertical interconnect structures 158 as well as conductive layer 132. Conductive layer 308 can be one or more layers of Al, Cu, Sn, Ni, Au, Ag, or other suitable electrically conductive material. The deposition of conductive layer 308 uses PVD, CVD, electrolytic plating, electroless plating, or other suitable process. Conductive layer 308 operates as an RDL to extend electrical connection from semiconductor die 124 to points external to semiconductor die 124.

FIG. 6m also shows an insulating or passivation layer 310 is conformally applied to, and follows the contours of, insulating layer 304 and conductive layer 308. The insulating layer 310 contains one or more layers of SiO2, Si3N4, SiON, Ta2O5, Al2O3, low temperature (less than 250° C.) curing polymer dielectric with or without filler, or other material having similar insulating and structural properties. The insulating layer 310 is deposited using PVD, CVD, printing, spin coating, spray coating, or other suitable process. A portion of insulating layer 310 is removed by LDA using laser 311, etching, or other suitable process to form openings 312, which expose portions of conductive layer 308 for subsequent electrical interconnection.

Figure 6N:
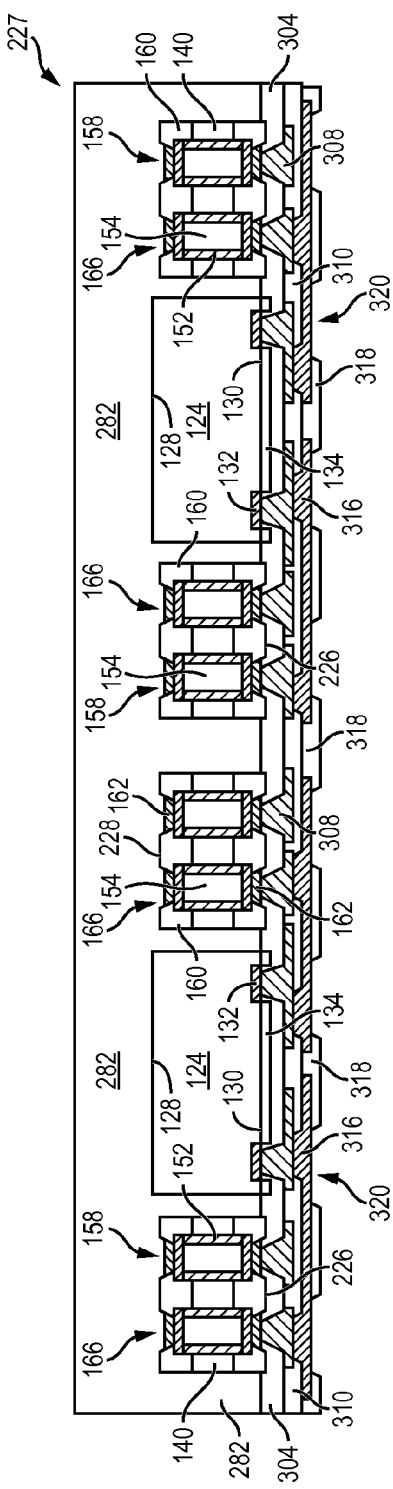

In FIG. 6n, an electrically conductive layer 316 is patterned and deposited over insulating layer 310 and conductive layer 308, and within openings 312 to fill the openings and contact conductive layer 308. Conductive layer 316 can be one or more layers of Al, Cu, Sn, Ni, Au, Ag, or other suitable electrically conductive material. The deposition of conductive layer 316 uses PVD, CVD, electrolytic plating, electroless plating, or other suitable process. Conductive layer 316 operates as an RDL to extend electrical connection from semiconductor die 124 to points external to semiconductor die 124.

FIG. 6n also shows an insulating or passivation layer 318 is conformally applied to, and follows the contours of, insulating layer 310 and conductive layer 316. The insulating layer 318 contains one or more layers of SiO2, Si3N4, SiON, Ta2O5, Al2O3, low temperature (less than 250° C.) curing polymer dielectric with or without filler, or other material having similar insulating and structural properties. The insulating layer 318 is deposited using PVD, CVD, printing, spin coating, spray coating, or other suitable process. A portion of insulating layer 318 is removed by LDA, etching, or other suitable process to form openings 320, which expose portions of conductive layer 316 for subsequent electrical interconnection.

Figure 6O:
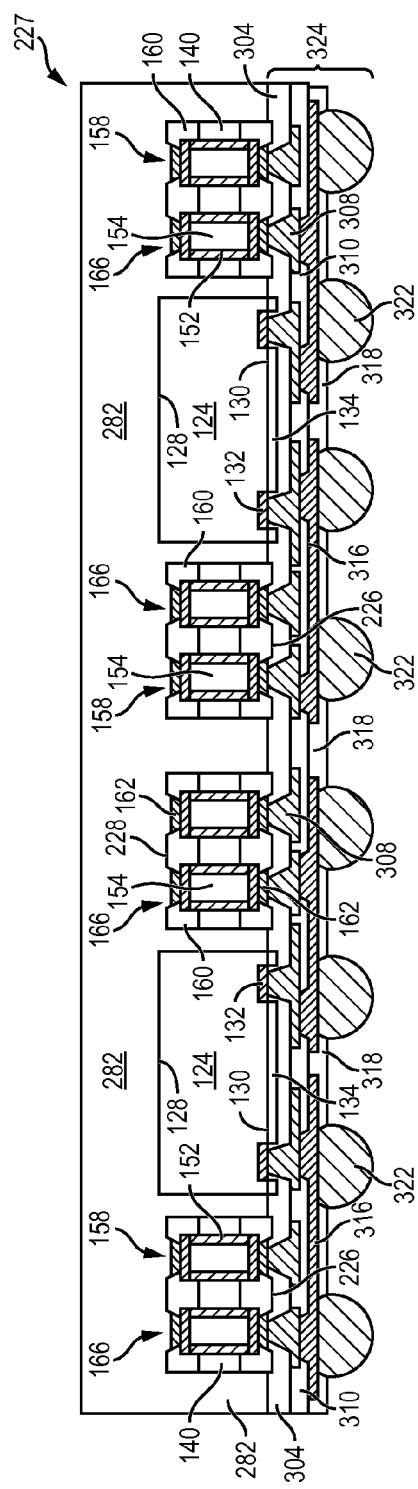

In FIG. 6o, an electrically conductive bump material is deposited over conductive layer 316 and within openings 320 of insulating layer 318 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 316 using a suitable attachment or bonding process. In one embodiment, the bump material is reflowed by heating the material above the material's melting point to form spherical balls or bumps 322. In some applications, bumps 322 are reflowed a second time to improve electrical contact to conductive layer 316. In one embodiment, bumps 322 are formed over a UBM having a wetting layer, barrier layer, and adhesive layer. Bumps 322 can also be compression bonded or thermocompression bonded to conductive layer 316. Bumps 322 represent one type of interconnect structure that can be formed over conductive layer 316. The interconnect structure can also use bond wires, conductive paste, stud bump, micro bump, or other electrical interconnect.

Taken together, insulating layers 304, 310, and 318 as well as conductive layers 308, 316, and conductive bumps 322 form a build-up interconnect structure 324. The number of insulating and conductive layers included within build-up interconnect structure 324 depends on, and varies with, the complexity of the circuit routing design. Accordingly, build-up interconnect structure 324 can include any number of insulating and conductive layers to facilitate electrical interconnect with respect to semiconductor die 124. Similarly, PWB units 164-166 may include additional metal layers to facilitate design integration and increased routing flexibility. Furthermore, elements that would otherwise be included in a backside interconnect structure or RDL can be integrated as part of build-up interconnect structure 324 to simplify manufacturing and reduce fabrication costs with respect to a package including both front side and backside interconnects or RDL.

In FIG. 6p, surface 326 of encapsulant 282 undergoes a grinding operation with grinder 328 to planarize the surface and reduce a thickness of the encapsulant. The grinding operation removes a portion of encapsulant material down to back surface 128 of semiconductor die 124. A chemical etch can also be used to remove and planarize encapsulant 282. Because surface 228 of PWB units 166 is vertically offset with respect to back surface 128 of semiconductor die 124 by distance D5, the removal of encapsulant 282 can be achieved without removing, and incidentally transferring, material from vertical interconnect structures 158, such as Cu, to semiconductor die 124. Preventing the transfer of conductive material from vertical interconnect structures 158 to semiconductor die 124 reduces a risk of contaminating a material of the semiconductor die, such as Si.

In FIG. 6q, an insulating or passivation layer 330 is conformally applied over encapsulant 282 and semiconductor die 124 using PVD, CVD, screen printing, spin coating, or spray coating. The insulating layer 330 contains one or more layers of SiO2, Si3N4, SiON, Ta2O5, Al2O3, or other material having similar insulating and structural properties. The insulating layer 330 uniformly covers encapsulant 282 and semiconductor die 124, and is formed over PWB units 164-166. The insulating layer 330 is formed after the removal of a first portion of encapsulant 282 and contacts the exposed back surface 128 of semiconductor die 124. The insulating layer 330 is formed before a second portion of encapsulant 282 is removed to expose PWB units 164-166. In one embodiment, properties of insulating layer 330 are selected to help control warping of the subsequently formed Fo-PoP.

In FIG. 6r, a portion of insulating layer 330 and encapsulant 282 is removed by LDA using laser 334 to form openings 332. Alternatively, openings 332 may be formed by etching or other suitable process. Openings 332 expose vertical interconnect structures 158. Material from vertical interconnect structures 158 is prevented from contacting semiconductor die 124 during removal of encapsulant 282 because openings 332 are formed over vertical interconnect structures 158 around or in a peripheral region around semiconductor die 124, such that vertical interconnect structures 158 are offset with respect to semiconductor die 124 and do not extend to back surface 128. Furthermore, openings 332 are not formed at a time when encapsulant 282 is being removed from over back surface 128 and at a time when semiconductor die 124 is exposed and susceptible to contamination. Because openings 332 are formed after insulating layer 330 is disposed over semiconductor die 124, the insulating layer acts as a barrier to material from vertical interconnect structures 158 being transferred to semiconductor die 124. Alternatively, insulating layer 330 is disposed over semiconductor die 124 and encapsulant 154, and openings 332 are formed prior to forming build-up interconnect structure 324.

In FIG. 6s, reconstituted wafer 227 with build-up interconnect structure 324 is singulated using a saw blade or laser cutting tool 336 to form individual Fo-PoP 338. In one embodiment, Fo-PoP 338 has a height of less than 1 mm. PWB modular units 164-166 within Fo-PoP 338 provide a cost effective alternative to using standard laser drilling processes for vertical interconnection in Fo-PoP for a number of reasons. First, PWB units 164-166 can be made with low cost manufacturing technology such as substrate manufacturing technology rather than standard laser drilling that includes high equipment cost and requires drilling through an entire package thickness, which increases cycle time and decreases manufacturing throughput. Furthermore, the use of PWB units 164-166 for Fo-PoP vertical interconnection provides an advantage of improved control for vertical interconnection with respect to vertical interconnections formed exclusively by a laser drilling process.

PWB modular units 164-166 contain one or multiple rows of vertical interconnect structures 158 that provide through vertical interconnection between opposing sides of the PWB units and are configured to be integrated into subsequently formed Fo-PoP. Vertical interconnect structures 158 include vias 150 that are left void or alternatively filled with filler material 154, e.g., conductive material or insulating material. Filler material 154 is specially selected to be softer or more compliant than conductive layer 152. Filler material 154 reduces the incidence of cracking or delamination by allowing vertical interconnect structures 158 to deform or change shape under stress. In one embodiment, vertical interconnect structures 158 include conductive layer 162 that is a copper protection layer for preventing oxidation of the conductive via, thereby reducing yield loss in SMT applications.

PWB modular units 164-166 are disposed within Fo-PoP 338 such that surface 228 of PWB units 166 and a corresponding surface of PWB units 164 are vertically offset with respect to back surface 128 of semiconductor die 124 by a distance D5. The separation of D5 prevents material from vertical interconnect structures 158, such as Cu, from incidentally transferring to, and contaminating a material of, semiconductor die 124, such as Si. Preventing contamination of semiconductor die 124 from material of vertical interconnect structures 158 is further facilitated by exposing conductive layer 162 by LDA or another removal process separate from the grinding operation of shown in FIG. 6p. Furthermore, the presence of insulating layer 330 over back surface 128 of semiconductor die 124 before the formation of openings 332 serves as a barrier to material from vertical interconnect structures 158 reaching the semiconductor die.

PWB modular units 164-166 disposed within Fo-PoP 338 can differ in size and shape one from another while still providing through vertical interconnect for the Fo-PoP. PWB units 164-166 include interlocking footprints having square and rectangular shapes, a cross-shape (+), an angled or "L-shape," a circular or oval shape, a hexagonal shape, an octagonal shape, a star shape, or any other geometric shape. At the wafer level, and before singulation, PWB units 164-166 are disposed around semiconductor die 124 in an interlocking pattern such that different sides of the semiconductor die are aligned with, and correspond to, a number of different sides of the PWB units in a repeating pattern. PWB units 164-166 may also include additional metal layers to facilitate design integration and increased routing flexibility.

PWB modular units 164-166 provide a cost effective alternative to using standard laser drilling processes for vertical interconnection in Fo-PoP for a number of reasons. First, PWB units 164-166 can be made with low cost manufacturing technology such as substrate manufacturing technology. Second, standard laser drilling includes high equipment cost and requires drilling through an entire package thickness, which increases cycle time and decrease manufacturing throughput. Furthermore, the use of PWB units 164-166 for vertical interconnection provides an advantage of improved control for vertical interconnection with respect to vertical interconnections formed exclusively by a laser drilling process.

FIG. 7a shows an embodiment of conductive pillar or conductive vertical interconnect structure 340 with laminate core 342, conductive layers 344 and 346, and filler material 348. Filler material 348 can be conductive material or insulating material. Conductive layer 344 overlaps laminate core 342 by 0-200 µm. A Cu protective layer 350 is formed over conductive layer 346. An insulating layer 352 is formed over one surface of laminate core 342. A portion of insulating layer 352 is removed to expose Cu protective layer 350.

FIG. 7b shows an embodiment of conductive pillar or conductive vertical interconnect structure 360 with laminate core 362, conductive layers 364 and 366, and filler material 368. Filler material 368 can be conductive material or insulating material. Conductive layer 364 overlaps laminate core 362 by 0-200 µm. A Cu protective layer 370 is formed over conductive layer 366.

FIG. 7c shows an embodiment of conductive pillar or conductive vertical interconnect structure 380 with laminate core 382, conductive layers 384 and 386, and filler material 388. Filler material 388 can be conductive material or insulating material. Conductive layer 384 overlaps laminate core 382 by 0-200 µm. A Cu protective layer 390 is formed over conductive layer 386. An insulating layer 392 is formed over one surface of laminate core 382. An insulating layer 394 is formed over an opposite surface of laminate core 382. A portion of insulating layer 394 is removed to expose conductive layer 386.

FIG. 7d shows an embodiment of conductive pillar or conductive vertical interconnect structure 400 with laminate core 402, conductive layers 404 and 406, and filler material 408. Filler material 408 can be conductive material or insulating material. Conductive layer 404 overlaps laminate core 402 by 0-200 µm.

FIG. 7e shows an embodiment of conductive pillar or conductive vertical interconnect structure 410 with laminate core 412, conductive layer 414, and filler material 416. Filler material 416 can be conductive material or insulating material. Conductive layer 414 overlaps laminate core 412 by 0-200 µm. An insulating layer 418 is formed over one surface of laminate core 412. A portion of insulating layer 418 is removed to expose conductive layer 414. A conductive layer 420 is formed over the exposed portion of conductive layer 414 and filler 416. A Cu protective layer 422 is formed over conductive layer 420. An insulating layer 424 is formed over a surface of laminate core 412 opposite insulating layer 418. A portion of insulating layer 424 is removed to expose a portion of conductive layer 414 and filler 416. A conductive layer 426 is formed over the exposed portion of conductive layer 414.

FIG. 7f shows an embodiment of conductive pillar or conductive vertical interconnect structure 430 with laminate core 432, conductive layer 434, and filler material 436. Filler material 436 can be conductive material or insulating material. Conductive layer 434 overlaps laminate core 432 by 0-200 µm. An insulating layer 438 is formed over one surface of laminate core 432. A portion of insulating layer 438 is removed to expose conductive layer 434. A conductive layer 440 is formed over the expose conductive layer 434. A Cu protective layer 442 is formed over conductive layer 420. An insulating layer 444 is formed over an opposite surface of laminate core 432. A conductive layer 446 is formed over the expose conductive layer 434. A Cu protective layer 446 is formed over conductive layer 446.

Figure 7I:
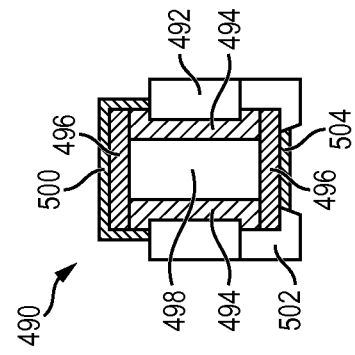
Figure 7H:
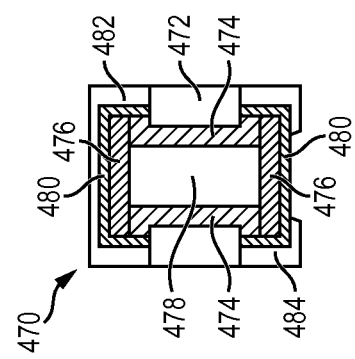
Figure 7G:
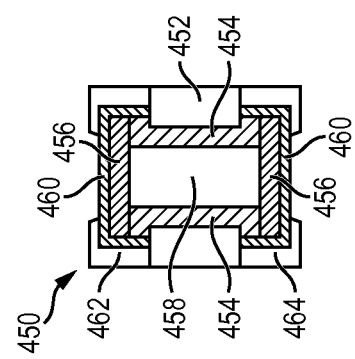

FIG. 7g shows an embodiment of conductive pillar or conductive vertical interconnect structure 450 with laminate core 452, conductive layers 454 and 456, and filler material 458. Filler material 458 can be conductive material or insulating material. Conductive layer 454 overlaps laminate core 452 by 0-200 µm. A Cu protective layer 460 is formed over conductive layer 456. An insulating layer 462 is formed over one surface of laminate core 452. A portion of insulating layer 462 is removed to expose Cu protective layer 460. An insulating layer 464 is formed over an opposite surface of laminate core 452. A portion of insulating layer 464 is removed to expose Cu protective layer 460.

FIG. 7h shows an embodiment of conductive pillar or conductive vertical interconnect structure 470 with laminate core 472, conductive layers 474 and 476, and filler material 478. Filler material 478 can be conductive material or insulating material. Conductive layer 474 overlaps laminate core 472 by 0-200 µm. A Cu protective layer 480 is formed over conductive layer 476. An insulating layer 482 is formed over one surface of laminate core 472. An insulating layer 484 is formed over an opposite surface of laminate core 472. A portion of insulating layer 484 is removed to expose Cu protective layer 480.

FIG. 7i shows an embodiment of conductive pillar or conductive vertical interconnect structure 490 with laminate core 492, conductive layers 494 and 496, and filler material 498. Filler material 498 can be conductive material or insulating material. Conductive layer 494 overlaps laminate core 492 by 0-200 µm. A Cu protective layer 500 is formed over conductive layer 496. An insulating layer 502 is formed over an opposite surface of laminate core 492. A portion of insulating layer 502 is removed to expose Cu protective layer 480. A Cu protective layer 504 is formed over the exposed conductive layer 496.

Figure 8A:
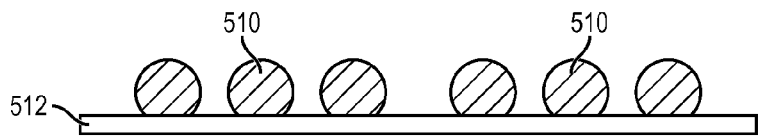
FIGS. 8a-8c illustrate a process of forming a PWB modular unit with a vertical interconnect structures containing bumps.
Figure 8B:
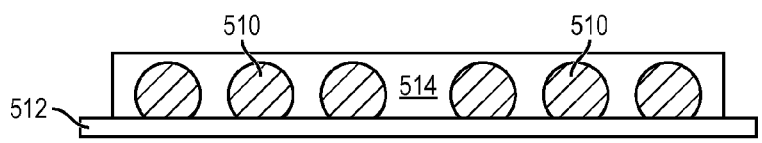
Figure 8C:
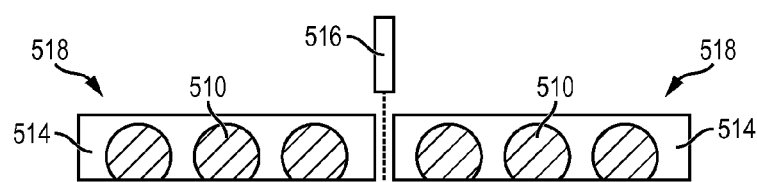

In FIG. 8a, a plurality of bumps 510 is formed over Cu foil 512, or other foil or carrier with thin patterned Cu or other wetting material layer. The foil or supporting layer can be evenly bonded to temporary carrier with thermal releasing tape, which can stand reflow temperature. In FIG. 8b, an encapsulant 514 is formed over bumps 510 and Cu foil 512. In FIG. 8c, Cu foil 512 is removed and bumps 510 embedded in encapsulant 514 is singulated using saw blade or laser cutting tool 516 into PWB vertical interconnect units 518.

Figure 9:
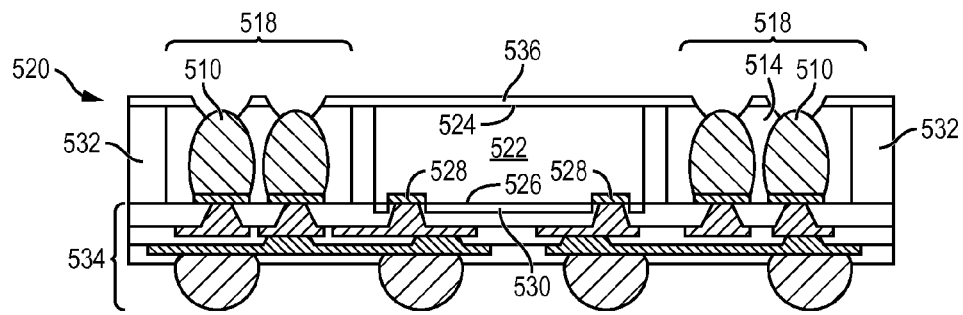
FIG. 9 illustrates a Fo-PoP with semiconductor die interconnected by PWB modular units having vertical interconnect structures containing bumps.

FIG. 9 shows a Fo-PoP 520 including semiconductor die 522, which is similar to semiconductor die 124 from FIG. 3d. Semiconductor die 522 has a back surface 524 and active surface 526 opposite back surface 524 containing analog or digital circuits implemented as active devices, passive devices, conductive layers, and dielectric layers formed within the die and electrically interconnected according to the electrical design and function of the die. An electrically conductive layer 528 is formed over active surface 526 and operates as contact pads that are electrically connected to the circuits on active surface 526. An insulating or passivation layer 530 is conformally applied over active surface 526.

FIG. 9 also shows PWB modular units 518 from FIGS. 8a-8c laterally offset from, and disposed around or in a peripheral region around semiconductor die 522. Back surface 524 of semiconductor die 522 is offset from PWB modular units 518 by at least 1 µm, similar to FIG. 5b. Encapsulant 532 is deposited around PWB units 518. A build-up interconnect structure 534, similar to build-up interconnect structure 180 in FIG. 5e, is formed over encapsulant 532, PWB units 518, and semiconductor die 522. An insulating or passivation layer 536 is formed over encapsulant 532, PWB units 518, and semiconductor die 522. A portion of encapsulant 514 and insulating layer 536 is removed to expose bumps 510. Bumps 510 are offset from back surface 524 of semiconductor die 522 by at least 1 µm.

Figure 10:
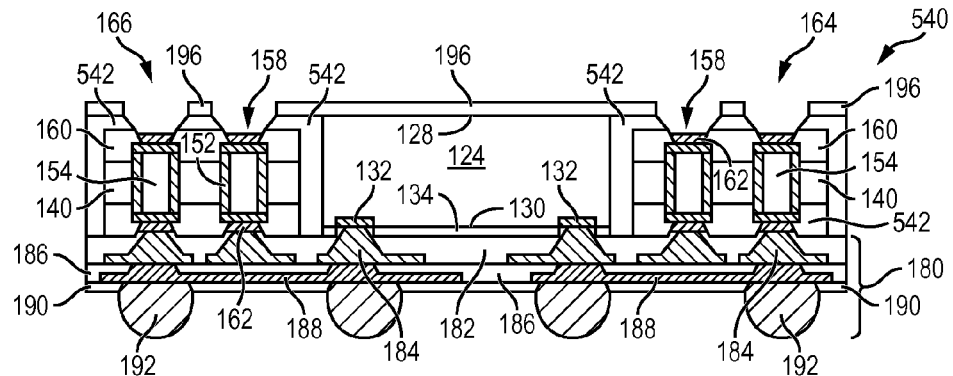
FIG. 10 illustrates another Fo-PoP with semiconductor die interconnected by PWB modular units having vertical interconnect structures.

FIG. 10 shows an embodiment of Fo-PoP 540, similar to FIG. 5h, with encapsulant 542 disposed around PWB units 164-166.

Figure 11A:
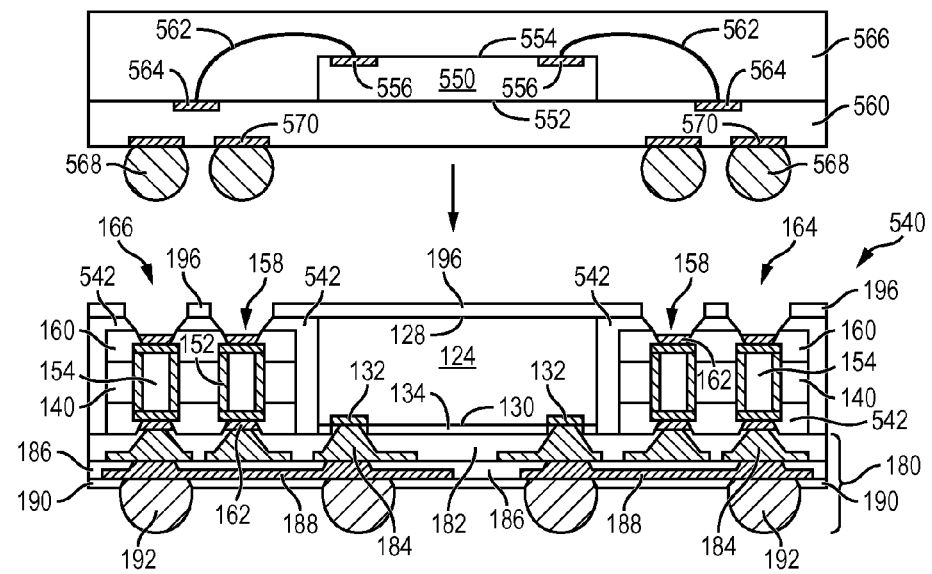
FIGS. 11a-11b illustrate mounting a second semiconductor die to the PWB modular unit.

In FIG. 11a, semiconductor die 550 has a back surface 552 and active surface 554 containing analog or digital circuits implemented as active devices, passive devices, conductive layers, and dielectric layers formed within the die and electrically interconnected according to the electrical design and function of the die. An electrically conductive layer 556 is formed over active surface 554 and operates as contact pads that are electrically connected to the circuits on active surface 554.

Semiconductor die 550 is mounted back surface 552 oriented to substrate 560. Substrate 560 can be a PCB. A plurality of bond wires 562 is formed between conductive layer 556 and trace lines or contact pads 564 formed on substrate 560. An encapsulant 566 is deposited over semiconductor die 550, substrate 560, and bond wires 562. Bumps 568 are formed over contact pads 570 on substrate 560.

Figure 11B:
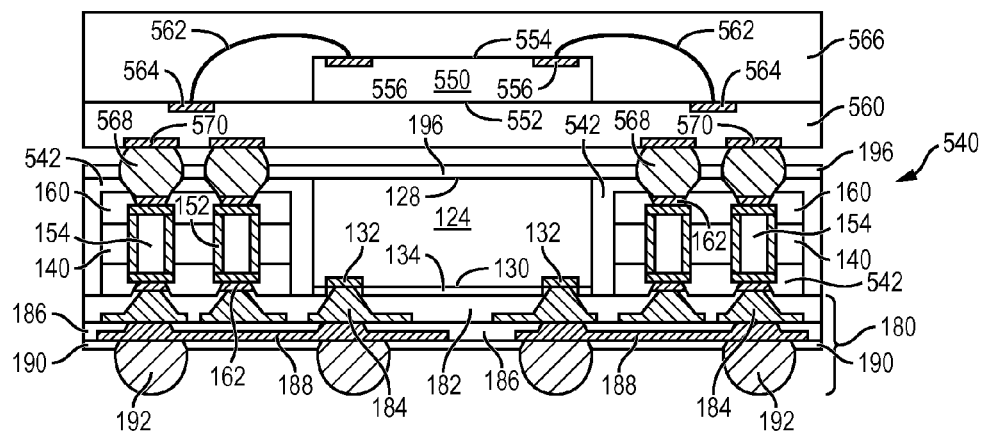

FIG. 11b shows Fo-PoP 540 from FIG. 10 with PWB modular units 164-166 laterally offset and disposed around or in a peripheral region around semiconductor die 124. Substrate 560 with semiconductor die 550 is mounted to Fo-PoP 540 with bumps 568 metallically and electrically connected to PWB modular units 164-166. Semiconductor die 124 of Fo-PoP 540 is electrically connected through bond wires 562, substrate 560, bumps 568, and PWB modular units 164-166 to build-up interconnect structure 180 for vertical interconnect.

Figure 12A:
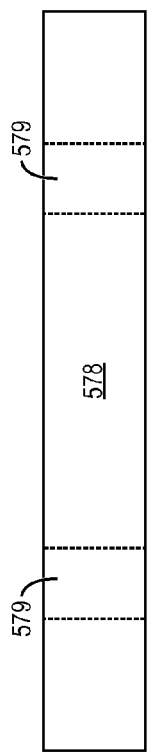
FIGS. 12a-12b illustrate a process of forming modular units from an encapsulant panel with fine filler.
Figure 12B:
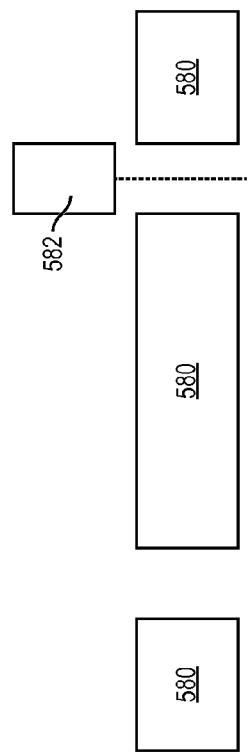

FIGS. 12a-12b illustrate a process of forming modular units from an encapsulant panel with fine filler. FIG. 12a shows a cross-sectional view of a portion of encapsulant panel 578. Encapsulant panel 578 includes a polymer composite material, such as epoxy resin, epoxy acrylate, or polymer, with a suitable fine filler material (i.e., less than 45 µm) deposited within the polymer composite material. The fine filler material enables the CTE of encapsulant panel 578 to be adjusted such that the CTE of encapsulant panel 578 is greater than subsequently deposited package encapsulant material. Encapsulant panel 578 has a plurality of saw streets 579 for singulating encapsulant panel 578 into individual modular units.

In FIG. 12b, encapsulant panel 578 is singulated through saw streets 579 into individual modular units 580 using saw blade or laser cutting tool 582. Modular units 580 have a shape or footprint similar to PWB modular units 164-166 shown in FIGS. 6e-6i, but do not have embedded conductive pillars or conductive bumps. The CTE of modular units 580 is greater than the CTE of subsequently deposited encapsulant material to reduce the incidence of warpage under thermal stress. The fine filler within the encapsulant material of modular units 580 also enables improved laser drilling for subsequently formed openings, which are formed through modular units 580.

FIGS. 13a-13i illustrate another process of forming a Fo-PoP with a modular unit formed from an encapsulant panel without embedded conductive pillars or bumps. Continuing from FIG. 6b, modular units 580 from FIG. 12b are mounted to interface layer 224 over carrier 220 using a pick and place operation. In another embodiment, encapsulant panel 578 from FIG. 12a is mounted to interface layer 224, prior to mounting semiconductor die 124, as a 300-325 mm round panel or 470 mm×370 mm rectangular panel, and openings are punched through encapsulant panel 578 to accommodate semiconductor die 124, and encapsulant panel 578 is singulated into individual modular units 580, similar to FIG. 6i.

When modular units 580 are mounted to interface layer 224, surface 583 of modular units 580 is coplanar with exposed surface 584 of interface layer 224, such that surface 583 is not embedded within interface layer 224. Thus, surface 583 of modular units 580 is vertically offset with respect to surface 225 of insulating layer 134.

FIG. 13b shows semiconductor die 124 and modular units 580 mounted over carrier 220 as a reconstituted wafer 590. A surface 592 of modular units 580 is vertically offset with respect to back surface 128 of semiconductor die 124. Reconstituted wafer 590 is partially singulated through modular units 580 between semiconductor die 124 using a saw blade or laser cutting tool 596 to form channel or opening 598. Channel 598 extends through modular units 580, and additionally may extend through interface layer 224 and partially but not completely through carrier 220. Channel 598 forms a separation among modular units 580 and semiconductor die 124.

In FIG. 13c, an encapsulant or molding compound 600 is deposited over semiconductor die 124, modular units 580, and carrier 220 using a paste printing, compressive molding, transfer molding, liquid encapsulant molding, vacuum lamination, spin coating, or other suitable applicator. Encapsulant 600 can be polymer composite material, such as epoxy resin with filler, epoxy acrylate with filler, or polymer with proper filler. Encapsulant 600 is non-conductive and environmentally protects the semiconductor device from external elements and contaminants. Encapsulant 600 has a lower CTE than modular units 580. In FIG. 13d, carrier 220 and interface layer 224 are removed from reconstituted wafer by chemical etching, mechanical peeling, CMP, mechanical grinding, thermal bake, UV light, laser scanning, or wet stripping to facilitate the formation of an interconnect structure over active surface 130 of semiconductor die 124 and modular units 580.

In FIG. 13e, an insulating or passivation layer 602 is formed over encapsulant 600, modular units 580, and semiconductor die 124. Insulating layer 602 contains one or more layers of SiO2, Si3N4, SiON, Ta2O5, Al2O3, or other material having similar insulating and structural properties. Insulating layer 602 is deposited using PVD, CVD, printing, spin coating, spray coating, or other suitable process. A portion of insulating layer 602 is removed by LDA, etching, or other suitable process to expose conductive layer 132 and surface 583 of modular units 580.

An electrically conductive layer 603 is patterned and deposited over insulating layer 602, over semiconductor die 124, and within the openings formed through insulating layer 602. Conductive layer 603 is electrically connected to conductive layer 132 of semiconductor die 124. Conductive layer 603 can be one or more layers of Al, Cu, Sn, Ni, Au, Ag, or other suitable electrically conductive material. In one embodiment, conductive layer 603 contains Ti/Cu, TiW/Cu, or Ti/NiV/Cu. The deposition of conductive layer 603 uses PVD, CVD, electrolytic plating, electroless plating, or other suitable process. Conductive layer 603 operates as an RDL to extend electrical connection from semiconductor die 124 to points external to semiconductor die 124 to laterally redistribute the electrical signals of semiconductor die 124 across the package. Portions of conductive layer 603 can be electrically common or electrically isolated according to the design and function of semiconductor die 124.

An insulating or passivation layer 604 is formed over conductive layer 603 and insulating layer 602. Insulating layer 604 contains one or more layers of SiO2, Si3N4, SiON, Ta2O5, Al2O3, or other material having similar insulating and structural properties. Insulating layer 604 is deposited using PVD, CVD, printing, spin coating, spray coating, or other suitable process. A portion of insulating layer 604 is removed by LDA, etching, or other suitable process to expose portions of conductive layer 603 for subsequent electrical interconnection.

An electrically conductive layer 605 is patterned and deposited over insulating layer 604, within the openings formed through insulating layer 604, and is electrically connected to conductive layers 603 and 132. Conductive layer 605 can be one or more layers of Al, Cu, Sn, Ni, Au, Ag, or other suitable electrically conductive material. In one embodiment, conductive layer 605 contains Ti/Cu, TiW/Cu, or Ti/NiV/Cu. The deposition of conductive layer 605 uses PVD, CVD, electrolytic plating, electroless plating, or other suitable process. Conductive layer 605 operates as an RDL to extend electrical connection from semiconductor die 124 to points external to semiconductor die 124 to laterally redistribute the electrical signals of semiconductor die 124 across the package. Portions of conductive layer 605 can be electrically common or electrically isolated according to the design and function of semiconductor die 124.

An insulating layer 606 is formed over insulating layer 604 and conductive layer 605. Insulating layer 606 contains one or more layers of SiO2, Si3N4, SiON, Ta2O5, Al2O3, or other material having similar insulating and structural properties. Insulating layer 606 is deposited using PVD, CVD, printing, spin coating, spray coating, or other suitable process. A portion of insulating layer 606 is removed by LDA, etching, or other suitable process to form openings to expose portions of conductive layer 605 for subsequent electrical interconnection.

An electrically conductive bump material is deposited over the exposed portion of conductive layer 605 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 605 using a suitable attachment or bonding process. In one embodiment, the bump material is reflowed by heating the material above the material's melting point to form spherical balls or bumps 607. In some applications, bumps 607 are reflowed a second time to improve electrical contact to conductive layer 605. In one embodiment, bumps 607 are formed over a UBM having a wetting layer, barrier layer, and adhesive layer. The bumps can also be compression bonded to conductive layer 605. Bumps 607 represent one type of interconnect structure that can be formed over conductive layer 605. The interconnect structure can also use bond wires, conductive paste, stud bump, micro bump, or other electrical interconnect.

Collectively, insulating layers 602, 604, and 606, conductive layers 603, 605, and conductive bumps 607 constitute a build-up interconnect structure 610. The number of insulating and conductive layers included within build-up interconnect structure 610 depends on, and varies with, the complexity of the circuit routing design. Accordingly, build-up interconnect structure 610 can include any number of insulating and conductive layers to facilitate electrical interconnect with respect to semiconductor die 124. Furthermore, elements that would otherwise be included in a backside interconnect structure or RDL can be integrated as part of build-up interconnect structure 610 to simplify manufacturing and reduce fabrication costs with respect to a package including both front side and backside interconnects or RDL.

In FIG. 13f, back grinding tape 614 is applied over build-up interconnect structure 610 using lamination or other suitable application process. Back grinding tape 614 contacts insulating layer 606 and bumps 607 of build-up interconnect structure 610. Back grinding tape 614 follows the contours of a surface of bumps 607. Back grinding tape 614 includes tapes with thermal resistance up to 270° C. Back grinding tape 614 also includes tapes with a thermal release function. Examples of back grinding tape 614 include UV tape HT 440 and non-UV tape MY-595. Back grinding tape 614 provides structural support during the subsequent backgrinding and removal of a portion of encapsulant 600 from a backside surface 624 of encapsulant 600 that is opposite build-up interconnect structure 610.

Backside surface 624 of encapsulant 600 undergoes a grinding operation with grinder 628 to planarize and reduce a thickness of encapsulant 600 and semiconductor die 124. A chemical etch can also be used to planarize and remove a portion of encapsulant 600 and semiconductor die 124. After the grinding operation is completed, exposed back surface 630 of semiconductor die 124 is coplanar with surface 592 of modular units 580 and exposed surface 632 of encapsulant 600.

In FIG. 13g, a backside balance layer 640 is applied over encapsulant 600, modular units 580, and semiconductor die 124 with back grinding tape 614 providing structural support to reconstituted wafer 590. In another embodiment, back grinding tape 614 is removed prior to forming backside balance layer 640. The CTE of backside balance layer 640 can be adjusted to balance the CTE of build-up interconnect structure 610 in order to reduce warpage of the package. In one embodiment, backside balance layer 640 balances the CTE, e.g. 30-150 ppm/K, of build-up interconnect structure 610 and reduces warpage in the package. Backside balance layer 640 also provides structural support to the package. In one embodiment, backside balance layer 640 has a thickness of 10-100 μm. Backside balance layer 640 can also act as a heat sink to enhance thermal dissipation from semiconductor die 124. Backside balance layer 640 can be any suitable balance layer with suitable thermal and structural properties, such as RCC tape.

Figure 13A:
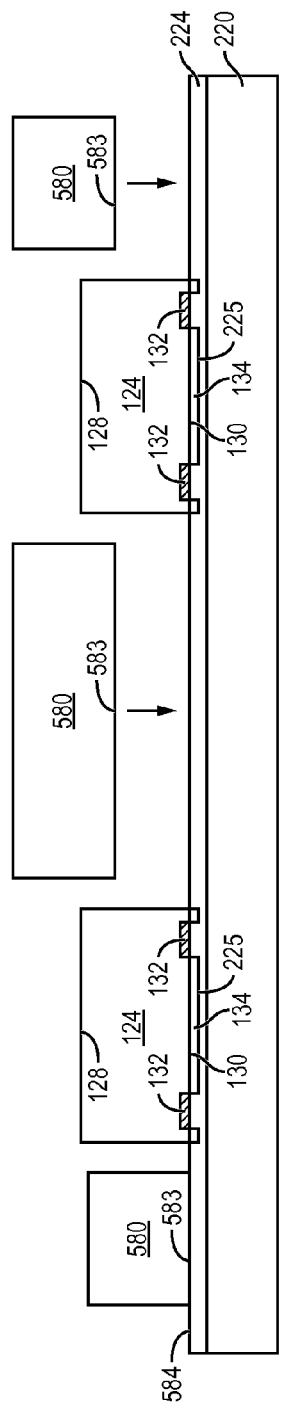
Figure 13H:
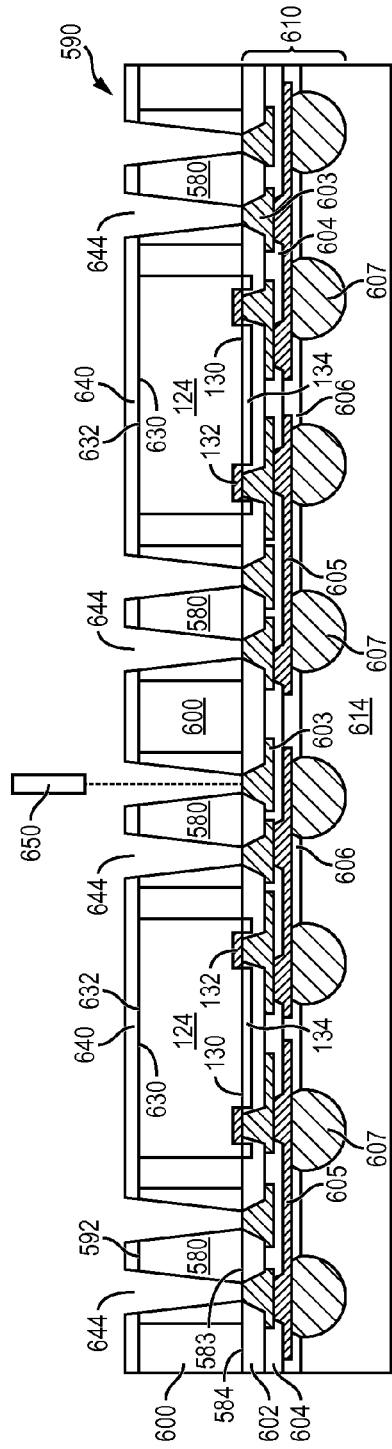

In FIG. 13h, a portion of backside balance layer 640 and modular units 580 is removed to form vias or openings 644 and expose conductive layer 603 of build-up interconnect structure 610 through modular units 580. Openings 644 are formed by etching, laser, or other suitable process, using proper clamping or a vacuum foam chuck with supporting tape for structural support. In one embodiment, openings 644 are formed by LDA using laser 650. The fine filler of modular units 580 enables improved laser drilling to form openings 644. Openings 644 can have vertical, sloped, or stepped sidewalls, and extend through backside balance layer 640 and surface 583 of modular units 580 to expose conductive layer 603. After forming openings 644, openings 644 undergo a desmearing or cleaning process, including a particle and organic residue wet clean, such as a single wafer pressure jetting clean with a suitable solvent, or alkali and carbon dioxide bubbled deionized water, in order to remove any particles or residue from the drilling process. A plasma clean is also performed to clean any contaminants from the exposed conductive layer 603, using reactive ion etching (RIE) or downstream/microwave plasma with O2 and one or more of tetrafluoromethane (CF4), nitrogen (N2), or hydrogen peroxide (H2O2). In embodiments where conductive layer 603 includes a TiW or Ti adhesive layer, the adhesive layer of conductive layer 603 is etched with a wet etchant in either a single wafer or batch process, and followed by a copper oxide clean.

Figure 13I:
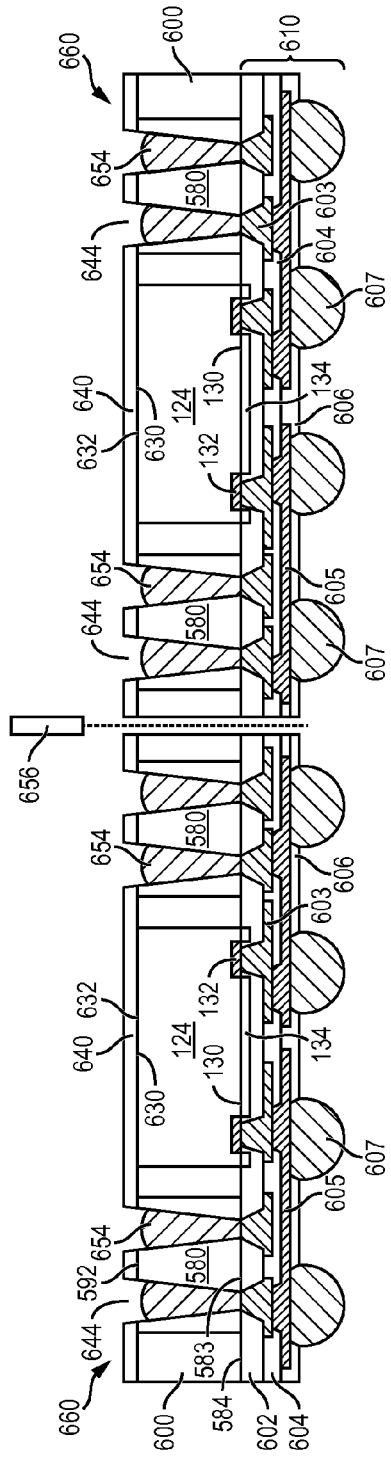

In FIG. 13i, an electrically conductive bump material is deposited over the exposed conductive layer 603 of build-up interconnect structure 610 within openings 644 using an evaporation, electrolytic plating, electroless plating, ball drop, screen printing, jetting, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 603 using a suitable attachment or bonding process. In one embodiment, the bump material is reflowed by heating the material above the material's melting point to form spherical balls or bumps 654. In some applications, bumps 654 are reflowed a second time to improve electrical contact to conductive layer 603. A UBM layer can be formed under bumps 654. The bumps can also be compression bonded to conductive layer 603. Bumps 654 represent one type of conductive interconnect structure that can be formed over conductive layer 603. The interconnect structure can also use bond wires, conductive paste, stud bump, micro bump, or other electrical interconnect. The assembly is singulated using a saw blade or laser cutting tool 656 to form individual Fo-PoP 660, and back grinding tape 614 is removed.

In FIG. 14 shows Fo-PoP 660 after singulation. Modular units 580 are embedded within encapsulant 600 around semiconductor die 124 to provide vertical interconnection in Fo-PoP 660. Modular units 580 are formed from an encapsulant panel with a fine filler, and modular units 580 have a higher CTE than encapsulant 600, which provides flexibility to adjust the overall CTE of Fo-PoP 660. Modular units 580 can have a shape or footprint similar to the modular units shown in FIGS. 6e-6i. After depositing encapsulant 600 over modular units 580 and semiconductor die 124, the package undergoes a backgrinding process to remove a portion of encapsulant 600 and semiconductor die 124, such that modular units 580 have a thickness substantially equal to the thickness of semiconductor die 124. A backside balance layer 640 is formed over modular units 580, encapsulant 600, and semiconductor die 124 to provide additional structural support, and prevent warpage of Fo-PoP 660. Openings 644 are formed through backside balance layer 640 and modular units 580 to expose conductive layer 603 of build-up interconnect structure 610. Bumps 654 are formed within openings 644 to form a 3-D vertical electrical interconnect structure through Fo-PoP 660. Thus, modular units 580 do not have embedded conductive pillars or bump material for vertical electrical interconnect. Forming openings 644 and bumps 654 through modular units 580 reduces the number of manufacturing steps, while still providing modular units for vertical electrical interconnect.

FIGS. 15a-15b illustrate a process of forming modular units from a PCB panel. FIG. 15a shows a cross-sectional view of a portion of PCB panel 670. PCB panel 670 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. PCB panel 670 has a plurality of saw streets 672 for singulating PCB panel 670 into individual modular units. In FIG. 15b, PCB panel 670 is singulated through saw streets 672 using saw blade or laser cutting tool 674 into individual modular units 676. Modular units 676 have a shape or footprint similar to PWB modular units 164-166 shown in FIGS. 6e-6i, but do not have embedded conductive pillars or conductive bumps. The CTE of modular units 676 is greater than the CTE of subsequently deposited encapsulant material to reduce the incidence of warpage under thermal stress.

FIG. 16 shows an embodiment of Fo-PoP 660, similar to FIG. 14, with modular units 676 embedded within encapsulant 600 instead of modular units 580. Modular units 676 are embedded within encapsulant 600 around semiconductor die 124 to provide vertical interconnection in Fo-PoP 660. Modular units 676 are formed from a PCB panel, and modular units 676 have a higher CTE than encapsulant 600, which provides flexibility to adjust the overall CTE of Fo-PoP 660. Modular units 676 can have a shape or footprint similar to the PWB modular units shown in FIGS. 6e-6i. After depositing encapsulant 600 over modular units 676 and semiconductor die 124, the package undergoes a backgrinding process to remove a portion of encapsulant 600 and semiconductor die 124, such that modular units 676 have a thickness substantially equal to the thickness of semiconductor die 124. A backside balance layer 640 is formed over modular units 676, encapsulant 600, and semiconductor die 124 to provide additional structural support, and prevent warpage of Fo-PoP 660. Openings 644 are formed through backside balance layer 640 and modular units 580 to expose conductive layer 603 of build-up interconnect structure 610. Bumps 654 are formed within openings 644 to form a 3-D vertical electrical interconnect structure through Fo-PoP 660. Thus, modular units 676 do not have embedded conductive pillars or bump material for vertical electrical interconnect. Forming openings 644 and bumps 654 through modular units 676 reduces the number of manufacturing steps, while still providing modular units for vertical electrical interconnect.

Figure 17F:
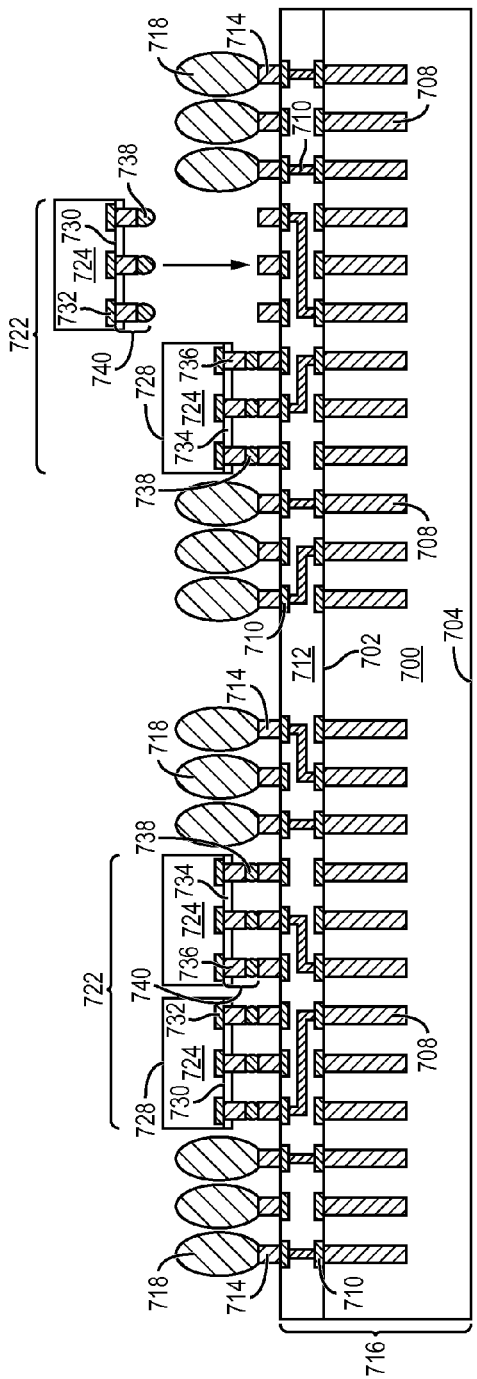
FIGS. 17a-17p illustrate a process of forming a 3-D semiconductor package including a TSV interposer PoP with embedded vertical interconnect structures.
Figure 17G:
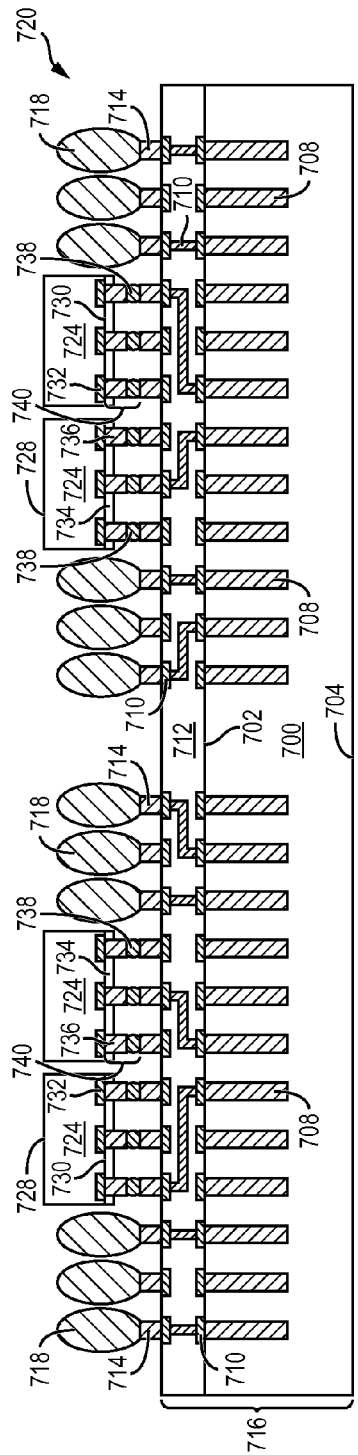
Figure 17N:
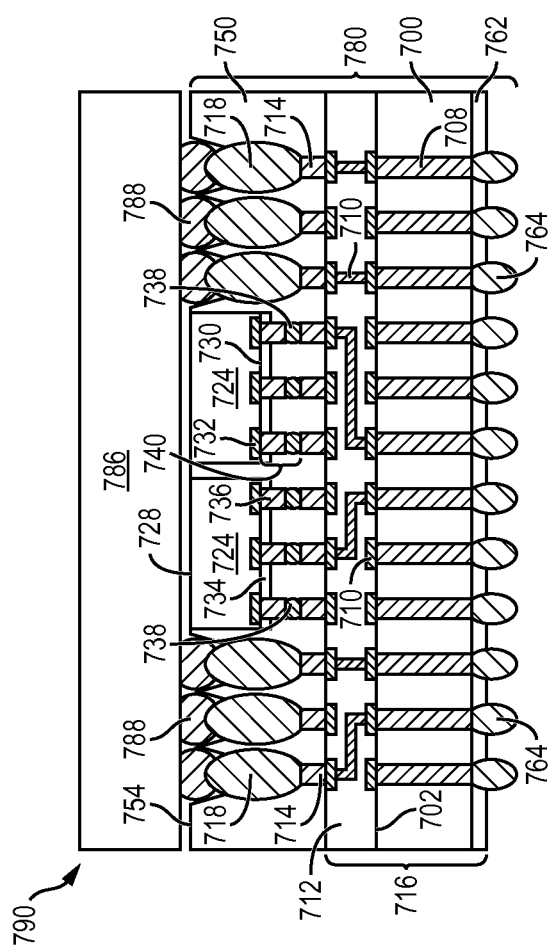
Figure 17O:
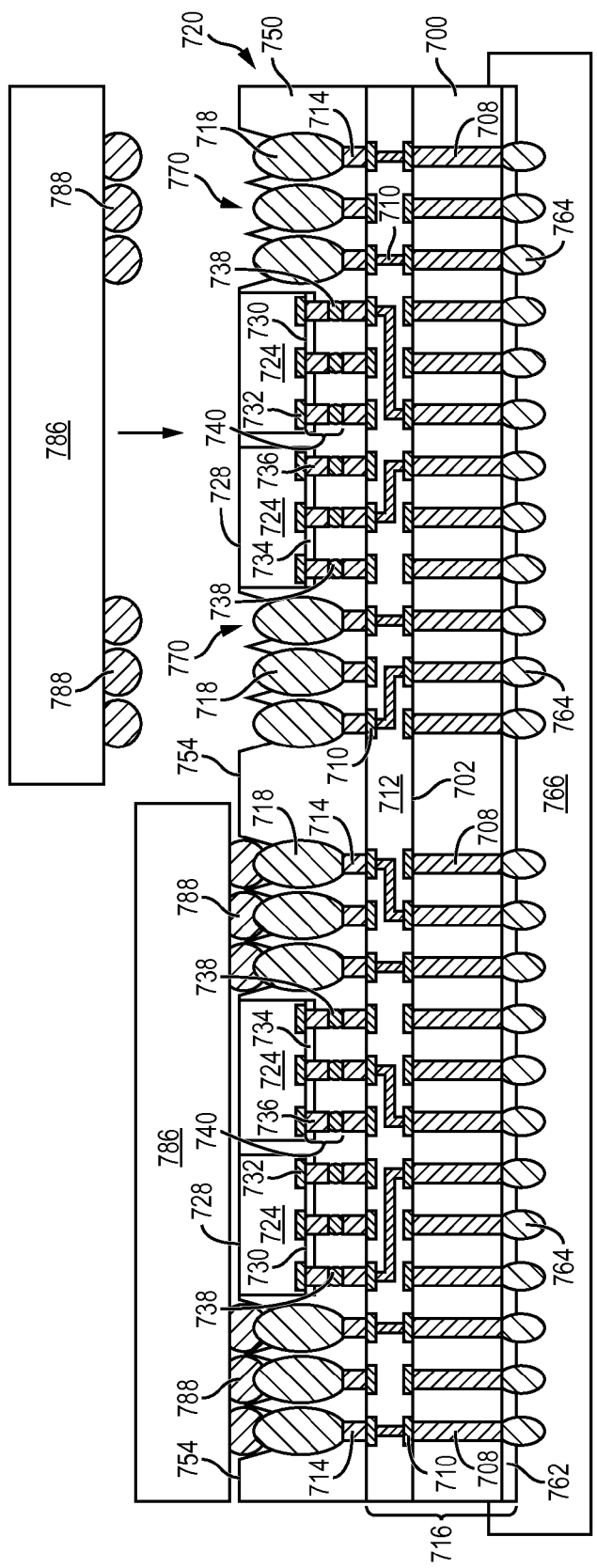
Figure 17P:
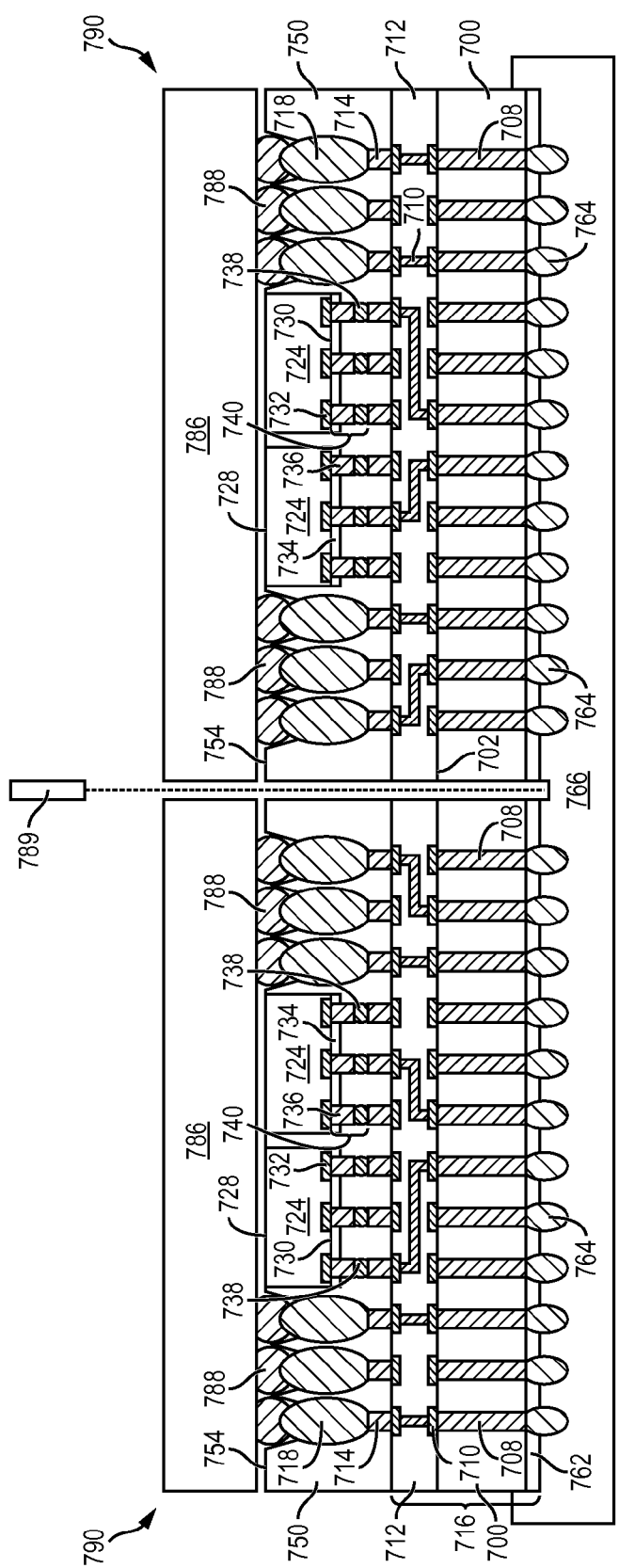

FIGS. 17a-17p illustrate, in relation to FIGS. 1 and 2a-2c, a process of forming a 3-D semiconductor package including a TSV interposer PoP with embedded vertical interconnect structures. FIG. 17a shows a wafer-level substrate or interposer 700 containing a base material such as silicon, germanium, gallium arsenide, indium phosphide, silicon carbide, or other suitable material for structural support. Substrate 700 has opposing surfaces 702 and 704.

In FIG. 17b, a plurality of vias 706 is formed partially through substrate 700 using mechanical drilling, laser drilling, or DRIE. Vias 706 extend from surface 702 partially, but not completely through substrate 700. A portion of substrate 700 remains between vias 706 and surface 704, and provides structural support during subsequent manufacturing steps.

In FIG. 17c, vias 706 are filled with Al, Cu, Sn, Ni, Au, Ag, Ti, W, poly-silicon, or other suitable electrically conductive material using electrolytic plating, electroless plating process, or other suitable deposition process to form z-direction blind conductive through silicon vias (TSV) 708.

In FIG. 17d, an interconnect structure is formed over surface 702 of substrate 700 and conductive TSV 708. The interconnect structure includes electrically conductive layer 710 and insulating layer 712. Conductive layer 710 is formed using a patterning and metal deposition process such as sputtering, electrolytic plating, and electroless plating. Conductive layer 710 can be one or more layers of Al, Cu, Sn, Ni, Au, Ag, or other suitable electrically conductive material. Conductive layer 710 includes lateral redistribution layers (RDL) and z-direction conductive vias for routing electrical signals horizontally and vertically over substrate 700. One portion of conductive layer 710 is electrically connected to conductive TSV 708. Other portions of conductive layer 710 can be electrically common or electrically isolated depending on the design and function of later mounted semiconductor die.

Insulating or passivation layer 712 is formed over substrate 700 and conductive layer 710 using PVD, CVD, printing, spin coating, spray coating, sintering, or thermal oxidation. Insulating layer 712 contains one or more layers of $SiO_2$, $Si_3N_4$, SiON, $Ta_2O_5$, $Al_2O_3$, low temperature (less than 250° C.) curing polymer dielectric with or without filler, or other material having similar insulating and structural properties. A portion of insulating layer 712 is removed by etching, LDA, or other suitable process to expose conductive layer 710. Alternatively, insulating layer 712 is formed over surface 702 and patterned prior to depositing conductive layer 710.

An electrically conductive bump material is deposited over conductive layer 710 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 710 using a suitable attachment or bonding process. In one embodiment, the bump material is reflowed by heating the material above the material's melting point to form balls or bumps 714. In some applications, bumps 714 are reflowed a second time to improve electrical contact to conductive layer 710. In one embodiment, bumps 714 are formed over a UBM layer. Bumps 714 can also be compression bonded or thermocompression bonded to conductive layer 710. Bumps 714 represent one type of interconnect structure that can be formed over conductive layer 710. The interconnect structure can also use bond wires, conductive paste, stud bump, micro bump, or other electrical interconnect. The combination of substrate 700, conductive TSV 708, conductive layers 710, insulating layers 712, and bumps 714 constitutes a TSV interposer 716.

In FIG. 17e, an electrically conductive bump material is deposited over bumps 714 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bumps 714 using a suitable attachment or bonding process. In one embodiment, the bump material is reflowed by heating the material above the material's melting point to form balls or bumps 718. In some applications, bumps 718 are reflowed a second time to improve electrical contact to bumps 714. Bumps 718 can also be compression bonded or thermocompression bonded to bumps 714. Bumps 718 represent one type of interconnect structure that can be formed over bumps 714. The interconnect structure can also use stud bump, micro bump, conductive pillar, or other electrical interconnect.

Bumps 718 are disposed around a peripheral region of TSV interposer 716. The placement of bumps 718 forms a plurality of semiconductor die mounting areas 722 over TSV interposer 716.

In FIG. 17f, semiconductor die 724, singulated from a semiconductor wafer similar to FIGS. 3a-3d, are disposed over TSV interposer 716 within area 722. Semiconductor die 724 has a back or non-active surface 728 and an active surface 730 containing analog or digital circuits implemented as active devices, passive devices, conductive layers, and dielectric layers formed within the die and electrically interconnected according to the electrical design and function of the die. An electrically conductive layer 732 is formed over active surface 730 using PVD, CVD, electrolytic plating, electroless plating process, or other suitable metal deposition process. Conductive layer 732 can be one or more layers of Al, Cu, Sn, Ni, Au, Ag, or other suitable electrically conductive material. Conductive layer 732 operates as contact pads electrically connected to the circuits on active surface 730.

An insulating or passivation layer 734 is formed over active surface 730 using PVD, CVD, screen printing, spin coating, spray coating, sintering, or thermal oxidation. The insulating layer 734 contains one or more layers of SiO2, Si3N4, SiON, Ta2O5, Al2O3, or other material having similar insulating and structural properties. Insulating layer 734 covers and provides protection for active surface 730. A portion of insulating layer 734 is removed by LDA or other suitable process to expose conductive layer 732.

A plurality of conductive pillars 736 is formed over conductive layer 732. Conductive pillars 736 are formed by depositing a patterning or photoresist layer over insulating layer 734. A portion of the photoresist layer is removed by etching, LDA, or other suitable process to form vias extending down to conductive layer 732. An electrically conductive material is deposited within the vias over conductive layer 732 using an evaporation, sputtering, electrolytic plating, electroless plating, screen printing, or other suitable metal deposition process. The conductive material can be Cu, Al, W, Au, solder, or other suitable electrically conductive material.

In one embodiment, the conductive material is deposited by plating Cu in the vias. The photoresist layer is then removed to leave individual conductive pillars 736. Conductive pillars 736 can have a cylindrical shape with a circular or oval cross-section, or conductive pillars 736 can have a cubic shape with a rectangular cross-section. In one embodiment, conductive pillars 736 can be implemented with stacked bumps or stud bumps.

An electrically conductive bump material is deposited over conductive pillars 736 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is reflowed to form a rounded bump cap 738. The combination of conductive pillars 736 and bump cap 738 constitutes a composite interconnect structure 740 with a non-fusible portion (conductive pillar 736) and a fusible portion (bump cap 738). Composite interconnect structures 740 represent one type of interconnect structure that can be formed over semiconductor die 724. The interconnect structure can also use bond wire, bumps, conductive paste, stud bump, micro bump, or other electrical interconnect.

Semiconductor die 724 are disposed over TSV interposer 716 using a pick and place or other suitable operation. Interconnect structures 740 are aligned with bumps 714 within area 722. Alternatively, semiconductor die 724 are mounted to TSV interposer 716 prior to forming bumps 718.

FIG. 17g shows semiconductor die 724 mounted to TSV interposer 716 with bumps 718 disposed in a peripheral region around semiconductor die 724. Bump caps 738 are reflowed to metallurgically and electrically connect semiconductor die 724 to TSV interposer 716. In some applications, bump caps 738 are reflowed a second time to improve electrical contact to bumps 714. Bump caps 738 can also be compression bonded or thermocompression bonded to bumps 714. Semiconductor die 724 are electrically connected to conductive TSV 708 through interconnect structure 740, bumps 714, and conductive layers 710. Semiconductor die 724 are electrically connected to bumps 718 through TSV interposer 716. Semiconductor die 724 are tested prior to mounting semiconductor die 724 to TSV interposer 716 to assure that only known good die are mounted to TSV interposer 716. Semiconductor die 724 disposed over TSV interposer 716 form a reconstituted or reconfigured wafer 720.

In FIG. 17h, an encapsulant or molding compound 750 is deposited over TSV interposer 716, semiconductor die 724, and bumps 718 using a paste printing, compressive molding, transfer molding, liquid encapsulant molding, vacuum lamination, spin coating, or other suitable applicator. Encapsulant 750 can be polymer composite material, such as epoxy resin with filler, epoxy acrylate with filler, or polymer with proper filler. Encapsulant 750 is non-conductive and environmentally protects the semiconductor device from external elements and contaminants. Encapsulant 750 also protects semiconductor die 724 from degradation due to exposure to light.

In FIG. 17i, a portion of encapsulant 750 is removed by backgrinding using grinder 752, or by CMP, etching processes, or LDA. The backgrinding operation removes encapsulant 750 from over back surface 728 of semiconductor die 724. Removing encapsulant 750 reduces a thickness of reconstituted wafer 720. Removing encapsulant 750 also reduces warpage of reconstituted wafer 720. In one embodiment, a portion of semiconductor die 724 is removed from back surface 728 during the backgrinding operation to further thin reconstituted wafer 720. After backgrinding, encapsulant 750 remains over bumps 718, and a surface 754 of encapsulant 750 is coplanar with surface 728 of semiconductor die 724. A thickness D6 between surface 754 of encapsulant 750 and bumps 718 is 1-150 µm.

In FIG. 17j, a carrier or temporary substrate 756 containing sacrificial base material such as silicon, polymer, beryllium oxide, glass, or other suitable low-cost, rigid material for structural support is disposed over encapsulant 750 and semiconductor die 724 opposite TSV interposer 716. An interface layer or double-sided tape 758 is disposed between carrier 756 and reconstituted wafer 720 as a temporary adhesive bonding film, etch-stop layer, or thermal release layer. Carrier 756 supports reconstituted wafer 720 during subsequent manufacturing steps.

After attaching carrier 756, a portion of substrate 700 is removed from surface 704 by grinder 760, CMP, etching processes, LDA, or other suitable process to expose conductive TSV 708. The grinding operation exposes conductive TSV 708 and reduces a thickness of TSV interposer 716.

In FIG. 17k, an insulating or passivation layer 762 is formed over a surface substrate 700 and conductive TSV 708 opposite conductive layer 710. Insulating layer 762 is formed using PVD, CVD, lamination, printing, spin coating, or spray coating. Insulating layer 762 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 762 is removed by LDA, etching, or other suitable process to expose conductive TSV 708.

An electrically conductive bump material is deposited over insulating layer 762 and electrically connected to the exposed portion of conductive TSV 708 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 708 using a suitable attachment or bonding process. In one embodiment, the bump material is reflowed by heating the material above the material's melting point to form spherical balls or bumps 764. In some applications, bumps 764 are reflowed a second time to improve electrical contact to conductive TSV 708. In one embodiment, bumps 764 are formed over a UBM layer. Bumps 764 can also be compression bonded or thermocompression bonded to conductive TSV 708. Bumps 764 represent one type of interconnect structure that can be formed over conductive TSV 708. The interconnect structure can also use bond wire, conductive paste, stud bump, micro bump, or other electrical interconnect.

In FIG. 17*l*, carrier 756 and interface layer 758 are removed from reconstituted wafer 720 by chemical etching, mechanical peeling, CMP, mechanical grinding, thermal bake, UV light, laser scanning, or wet stripping. FIG. 17*l* also shows a dicing tape or support carrier 766 is applied to reconstituted wafer 720 opposite surface 754 of encapsulant 750. Dicing tape 766 covers insulating layer 762 and bumps 764. Dicing tape 766 supports reconstituted wafer 720 during subsequent manufacturing steps and during singulation into individual semiconductor packages.

A portion of encapsulant 750 is selectively removed from over bumps 718 to form openings 770. Openings 770 expose a portion of bumps 718. Openings 770 are formed by LDA using laser 772, etching, or other suitable process. Openings 770 extend from surface 754 of encapsulant 750 to bumps 718. In one embodiment, a backside balance layer, similar to backside balance layer 196 in FIG. 5*g*, or an insulating layer, similar to insulating layer 330 in FIG. 6*q*, is applied over surface 754 of encapsulant 750 and surface 728 of semiconductor die 724 prior to forming openings 770.

In FIG. 17*m*, reconstituted wafer 720 is singulated using a saw blade or laser cutting tool 774 into individual TSV interposer PoP 780 including semiconductor die 724 and embedded bumps 718. Embedded bumps 718 are electrically connected to TSV interposer 716 to form vertical interconnect structures within TSV interposer PoP 780.

In FIG. 17*n*, TSV interposer PoP 780 is removed from dicing tape 766 and a semiconductor die or device 786 is disposed TSV interposer PoP 780 using pick and place or other suitable operation. Semiconductor device 786 may include filter, memory, or other IC chips, processors, microcontrollers, known-good packages, or any other packaged device containing semiconductor die or other electronic devices or circuitry. In one embodiment, semiconductor device 786 is a memory device. Bumps 788 of semiconductor device 786 are aligned with exposed bumps 718 and are disposed into openings 770 of TSV interposer PoP 780. Bumps 788 are Al, Sn, Ni, Au, Ag, Pb, Bi, Cu, solder, and combinations thereof. Bumps 788 can be eutectic Sn/Pb, high-lead solder, or lead-free solder. Bumps 788 represent one type of interconnect structure that can be formed between semiconductor device 786 and TSV interposer PoP 780. The interconnect structure can also use bond wire, conductive paste, stud bump, micro bump, conductive pillar, composite interconnect structure, or other electrical interconnect.

Bumps 788 are reflowed to metallurgically and electrically connect semiconductor device 786 to bumps 718. In some applications, bumps 788 are reflowed a second time to improve electrical contact to bumps 718. Semiconductor device 786 is electrically connected to semiconductor die 724 through bumps 788, bumps 718, and TSV interposer 716. Semiconductor device 786 is tested prior to mounting semiconductor device 786 to TSV interposer PoP 780 to assure only known good devices are mounted to TSV interposer PoP 780. TSV interposer PoP 780 and semiconductor device 786 form a 3-D semiconductor package 790.

In another embodiment, continuing from FIG. 17*l*, semiconductor die or device 786 is disposed over reconstituted wafer 720 prior to singulation, as shown in FIG. 17*o*. Bumps 788 of semiconductor device 786 are aligned with exposed bumps 718 and extend into openings 770. Bumps 788 are reflowed to metallurgically and electrically connect semiconductor device 786 to bumps 718. Semiconductor device 786 is tested prior to mounting semiconductor device 786 to reconstituted wafer 720 to assure only known good devices are incorporated into the semiconductor package.

In FIG. 17*p*, reconstituted wafer 720 is singulated using saw blade or laser cutting tool 782 into 3-D semiconductor package 790 including TSV interposer PoP 780 and semiconductor device 786.

Figure 18:
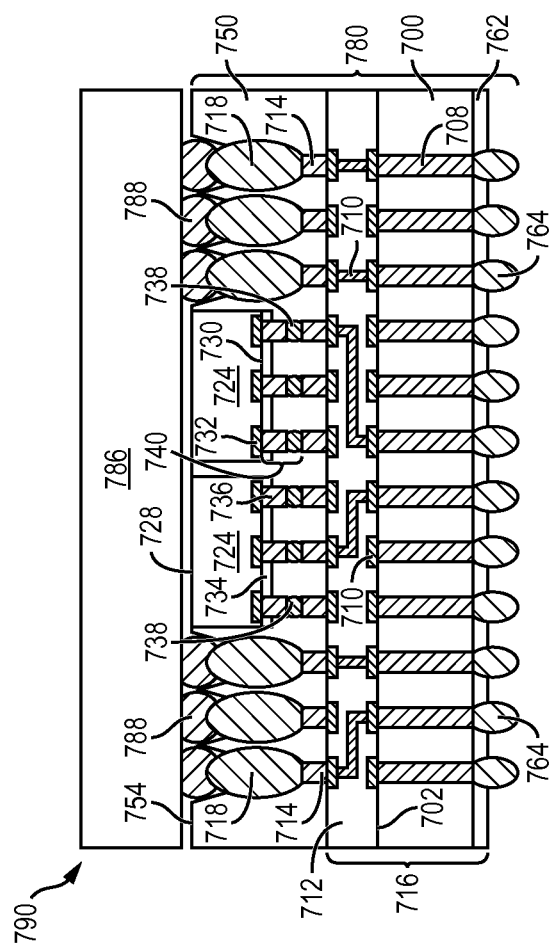
FIG. 18 illustrates the 3-D semiconductor package including a TSV interposer PoP with embedded vertical interconnect structures of FIGS. 17a-17p.

FIG. 18 shows 3-D semiconductor package 790 including TSV interposer PoP 780 and semiconductor device 786. TSV interposer PoP 780 includes TSV interposer 716 and semiconductor die 724. Semiconductor die 724 are electrically connected through TSV interposer 716 to bumps 764 for connection to external devices. Semiconductor device 786 is electrically connected to TSV interposer 716 and semiconductor die 724 through bumps 718. Bumps 718 are embedded within encapsulant 750 and are disposed in a peripheral region around semiconductor die 724. Openings 770 expose a portion of bumps 718. Exposed bumps 718 allow subsequent semiconductor die or packages, for example, semiconductor device 786, to be easily stacked on and electrically connected to TSV interposer PoP 780. Connecting semiconductor device 786 to TSV interposer 716 through bumps 718 eliminates the need for a substrate and/or additional RDL over surface 728 of semiconductor die 724. Connecting semiconductor device 786 to TSV interposer 716 through bumps 718, i.e., eliminating an additional substrate and/or RDL from between semiconductor die 724 and semiconductor device 786, shortens an interconnection length between semiconductor device 786 and semiconductor die 724. The shortened interconnection length between semiconductor device 786 and semiconductor die 724 increases the speed and electrical performance of 3-D semiconductor package 790. Eliminating a substrate and/or additional RDL from over semiconductor die 724 also reduces a thickness and overall package profile of 3-D semiconductor package 790. Thinning encapsulant 750 by backgrinding and thinning TSV interposer 716 to expose conductive TSV 708, as shown for example in FIGS. 17*i* and 17*j*, respectively, also reduces the thickness and overall package profile of 3-D semiconductor package 790. Finally, the space between bumps 718 and surface 754 of encapsulant 750, i.e., D6 in FIG. 17*i*, allows bumps 788 of semiconductor device 786 to extend below surface 754 and surface 728 of semiconductor die 724. Extending bumps 788 below surfaces 728 and 754, i.e. into openings 770, reduces a height or distance between semiconductor device 786 and TSV interposer PoP 780, which reduces the overall thickness of 3-D semiconductor package 790.

Connecting semiconductor die 724 and semiconductor device 786 to TSV interposer 716 provides a low profile, cost effective mechanism for routing electrical signals between semiconductor die 724, semiconductor device 786, and external devices, for example a PCB. Forming electrical interconnections between semiconductor die 724, semiconductor device 786, and external device via pre-formed TSV interposer 716, as opposed to, for example, via a multilayer build-up interconnect structure formed over semiconductor die 724 and encapsulant 750, reduces warpage, manufacturing time, and an overall cost of 3-D semiconductor package 790. TSV interposer 716, semiconductor die 724, and semiconductor device 786 are each tested prior to being incorporated into 3-D semiconductor package 790. Thus, only known good components are included in 3-D semiconductor package 790. By using only known good components, manufacturing steps and materials are not wasted making defective packages and the overall cost of 3-D semiconductor package 790 is reduced.

Figure 19C:
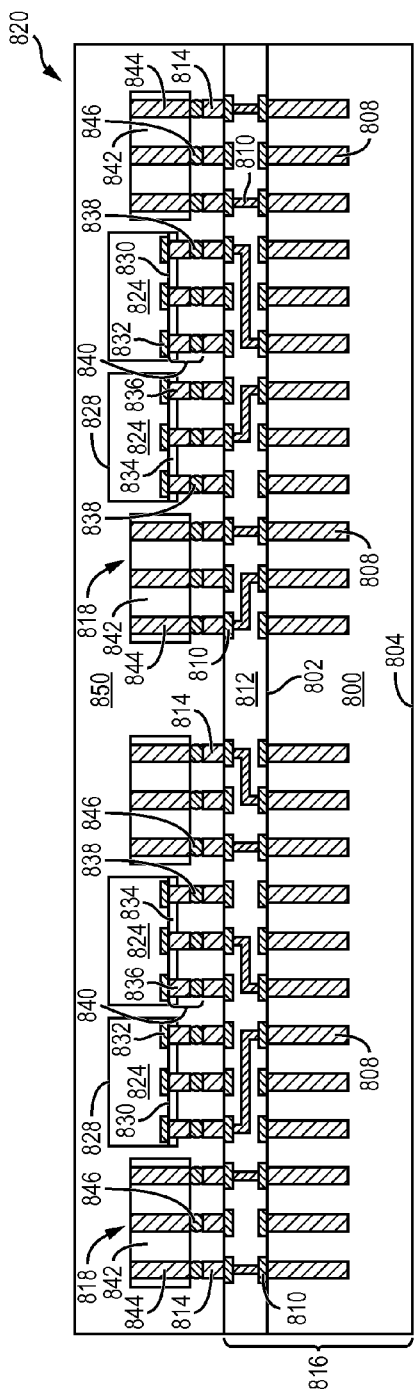

FIGS. 19a-19g illustrate, in relation to FIGS. 1 and 2a-2c, another process of forming a 3-D semiconductor package including a TSV interposer PoP with embedded vertical interconnect structures. FIG. 19a shows a TSV interposer 816 that is similar to TSV interposer 716 in FIG. 17d. TSV interposer 816 includes a substrate 800, conductive TSV 808, conductive layers 810, insulating layers 812, and bumps 814. Substrate 800 has opposing surfaces 802 and 804, and contains a base material such as silicon, germanium, gallium arsenide, indium phosphide, silicon carbide, or other suitable material for structural support. A plurality of z-direction blind conductive TSV 808 is formed partially through substrate 800. Conductive TSV 808 extend from surface 802 partially, but not completely through substrate 800. A portion of substrate 800 remains between conductive TSV 808 and surface 804 to provide structural support during subsequent manufacturing steps. Conductive TSV 808 are filled with Al, Cu, Sn, Ni, Au, Ag, Ti, W, polysilicon, or other suitable electrically conductive material using electrolytic plating, electroless plating process, or other suitable deposition process.

An interconnect structure is formed over surface 802 of substrate 800 and conductive TSV 808. The interconnect structure includes electrically conductive layers 810 and insulating layers 812. Conductive layer 810 is formed using a patterning and metal deposition process such as sputtering, electrolytic plating, and electroless plating. Conductive layer 810 can be one or more layers of Al, Cu, Sn, Ni, Au, Ag, or other suitable electrically conductive material. Conductive layer 810 includes lateral RDL and z-direction conductive vias for routing electrical signals horizontally and vertically over substrate 800. One portion of conductive layer 810 is electrically connected to conductive TSV 808. Other portions of conductive layer 810 can be electrically common or electrically isolated depending on the design and function of later mounted semiconductor die.

Insulating or passivation layer 812 is formed over substrate 800 and conductive layer 810 using PVD, CVD, printing, spin coating, spray coating, sintering, or thermal oxidation. Insulating layer 812 contains one or more layers of $SiO_2$, $Si_3N_4$, SiON, $Ta_2O_5$, $Al_2O_3$, low temperature (less than 250° C.) curing polymer dielectric with or without filler, or other material having similar insulating and structural properties. A portion of insulating layer 812 is removed by etching, LDA, or other suitable process to expose conductive layer 810.

An electrically conductive bump material is deposited over conductive layer 810 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 810 using a suitable attachment or bonding process. In one embodiment, the bump material is reflowed by heating the material above the material's melting point to form balls or bumps 814. In some applications, bumps 814 are reflowed a second time to improve electrical contact to conductive layer 810. In one embodiment, bumps 814 are formed over a UBM layer. Bumps 814 can also be compression bonded or thermocompression bonded to conductive layer 810. Bumps 814 represent one type of interconnect structure that can be formed over conductive layer 810. The interconnect structure can also use bond wires, conductive paste, stud bump, micro bump, or other electrical interconnect.

In FIG. 19b, PWB modular interconnect units 818 and semiconductor die 824 are disposed over TSV interposer 816 forming a reconstituted wafer 820. PWB modular interconnect units 818 include a core substrate 842. Core substrate 842 includes one or more laminated layers of polytetrafluoroethylene prepreg, FR-4, FR-1, CEM-1, or CEM-3 with a combination of phenolic cotton paper, epoxy, resin, woven glass, matte glass, polyester, glass fabric with filler, and other reinforcement fibers or fabrics. Alternatively, core substrate 842 includes one or more insulating or passivation layers.

A plurality of through vias is formed through core substrate 842 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnects or conductive vias 844. In one embodiment, Cu is deposited over the sidewall of the through vias by electroless plating and electroplating and the vias are filled with an insulating or a conductive filler material, similar to vertical interconnect structures 158 in FIG. 4f.

An electrically conductive bump material is deposited over vertical interconnect 844 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to vertical interconnects 844 using a suitable attachment or bonding process. In one embodiment, the bump material is reflowed by heating the material above the material's melting point to form balls or bumps 846. In some applications, bumps 846 are reflowed a second time to improve electrical contact to vertical interconnects 844. In one embodiment, bumps 846 are formed over a UBM layer. Bumps 846 can also be compression bonded or thermocompression bonded to vertical interconnects 844. Bumps 846 are reflowed to metallurgically and electrically connect PWB units 818 to bumps 814 of TSV interposer 816. Bumps 846 represent one type of interconnect structure that can be formed between PWB unit 818 and TSV interposer 816. The interconnect structure can also use bond wires, conductive paste, stud bump, micro bump, or other electrical interconnect.

Semiconductor die 824 are disposed over TSV interposer 816 between PWB units 818. Alternatively, semiconductor die 824 are mounted to TSV interposer 816 prior to PWB modular units 818. Semiconductor die 824, similar to semiconductor die 724 in FIG. 17f, has a back or non-active surface 828 and an active surface 830 opposite surface 828. An electrically conductive layer 832 is formed over active surface 830. An insulating or passivation layer 834 is formed over active surface 830. A portion of insulating layer 834 is removed by LDA, etching, or other suitable process to expose portions of conductive layer 832. A plurality of interconnect structures 840 is formed over conductive layer 832 of semiconductor die 824. Interconnect structures 840 include a non-fusible portion (conductive pillar 836) and a fusible portion (bumps cap 838). Interconnect structures 840 represent one type of interconnect structure that can be formed over semiconductor die 824. The interconnect structure can also use bond wire, bumps, conductive paste, stud bump, micro bump, or other electrical interconnect.

Bump cap 838 of interconnect structure 840 is reflowed to metallurgically and electrically connect semiconductor die 824 to bumps 814. In some applications, bump caps 838 are reflowed a second time to improve electrical contact to bumps 814. Semiconductor die 824 is electrically connected to conductive TSV 808 through interconnect structure 840, bumps 814, and conductive layer 810. TSV interposer 816 electrically connects semiconductor die 824 to PWB units 818.

In FIG. 19c, an encapsulant or molding compound 850 is deposited over TSV interposer 816, PWB units 818, and semiconductor die 824 using a paste printing, compressive molding, transfer molding, liquid encapsulant molding, vacuum lamination, spin coating, or other suitable applicator. Encapsulant 850 can be polymer composite material, such as epoxy resin with filler, epoxy acrylate with filler, or polymer with proper filler. Encapsulant 850 is non-conductive and environmentally protects the semiconductor device from external elements and contaminants. Encapsulant 850 also protects semiconductor die 824 from degradation due to exposure to light.

Figure 19D:
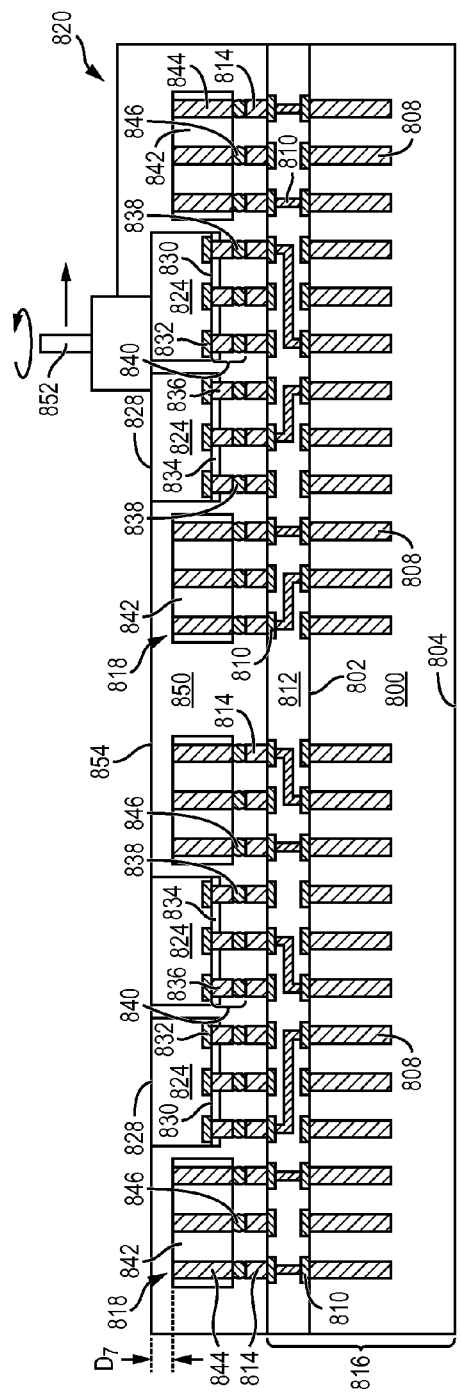

In FIG. 19d, a portion of encapsulant 850 is removed by backgrinding with grinder 852, or by CMP, etching processes, or LDA. The backgrinding operation removes encapsulant 850 from over back surface 828 of semiconductor die 824. Removing encapsulant 850 reduces a thickness of reconstituted wafer 820. Removing encapsulant 850 also reduces warpage of reconstituted wafer 820. In one embodiment, a portion of semiconductor die 824 is removed from back surface 828 during the backgrinding operation to further thin reconstituted wafer 820. After backgrinding, encapsulant 850 remains over PWB units 818, and a surface 854 of encapsulant 850 is coplanar with surface 828 of semiconductor die 824. A thickness D7 between surface 854 of encapsulant 850 and vertical interconnects 844 is 1-150 µm.

Figure 19E:
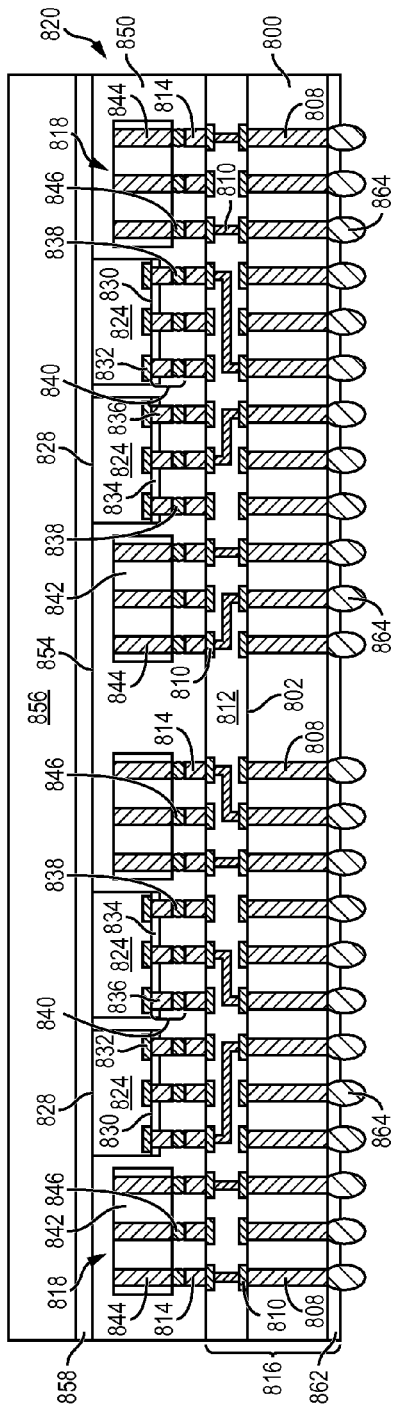

In FIG. 19e, a carrier or temporary substrate 856 containing sacrificial base material such as silicon, polymer, beryllium oxide, glass, or other suitable low-cost, rigid material for structural support is disposed over encapsulant 850 and semiconductor die 824 opposite TSV interposer 816. An interface layer or double-sided tape 858 is disposed between carrier 856 and reconstituted wafer 820 as a temporary adhesive bonding film, etch-stop layer, or thermal release layer. Carrier 856 supports reconstituted wafer 820 during subsequent manufacturing steps.

A portion of substrate 800 is removed from surface 804 by grinding, CMP, etching processes, LDA, or other suitable process to expose conductive TSV 808 and reduce a thickness of TSV interposer 816. An insulating or passivation layer 862 is formed over a surface of substrate 800 and conductive TSV 808 opposite conductive layer 810. Insulating layer 862 is formed using PVD, CVD, lamination, printing, spin coating, or spray coating. Insulating layer 862 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 862 is removed by LDA, etching, or other suitable process to expose conductive TSV 808.

An electrically conductive bump material is deposited over insulating layer 862 and electrically connected to the exposed portion of conductive TSV 808. The electrically conductive bump material is deposited using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 808 using a suitable attachment or bonding process. In one embodiment, the bump material is reflowed by heating the material above the material's melting point to form spherical balls or bumps 864. In some applications, bumps 864 are reflowed a second time to improve electrical contact to conductive TSV 808. In one embodiment, bumps 864 are formed over a UBM layer. Bumps 864 can also be compression bonded or thermocompression bonded to conductive TSV 808. Bumps 864 represent one type of interconnect structure that can be formed over conductive TSV 808. The interconnect structure can also use bond wire, conductive paste, stud bump, micro bump, or other electrical interconnect.

Figure 19F:
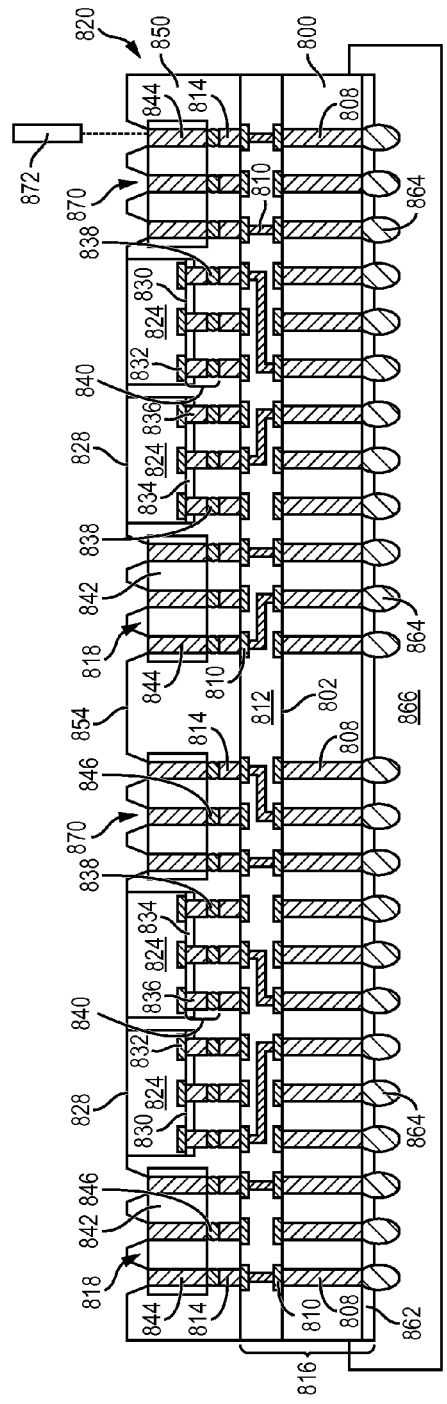

In FIG. 19f, carrier 856 and interface layer 858 are removed from reconstituted wafer 820. A dicing tape or support structure 866 is applied to reconstituted wafer 820 opposite surface 854 of encapsulant 850. Dicing tape 866 covers insulating layer 862 and bumps 864. Dicing tape 866 supports reconstituted wafer 820 during subsequent manufacturing steps and during singulation into individual semiconductor packages.

A portion of encapsulant 850 is selectively removed from over vertical interconnects 844 of PWB units 818 to form openings 870. Openings 870 are formed by LDA using laser 872, etching, or other suitable process. Openings 870 expose a portion of vertical interconnects 844. Openings 870 can have vertical, sloped, or stepped sidewalls. Openings 870 extend from surface 854 of encapsulant 850 to vertical interconnects 844 of PWB units 818. In one embodiment, a backside balance layer, similar to backside balance layer 196 in FIG. 5g, or an insulating layer, similar to insulating layer 330 in FIG. 6q, is applied over surface 854 of encapsulant 850 and surface 828 of semiconductor die 824 prior to forming openings 870.

Figure 19G:
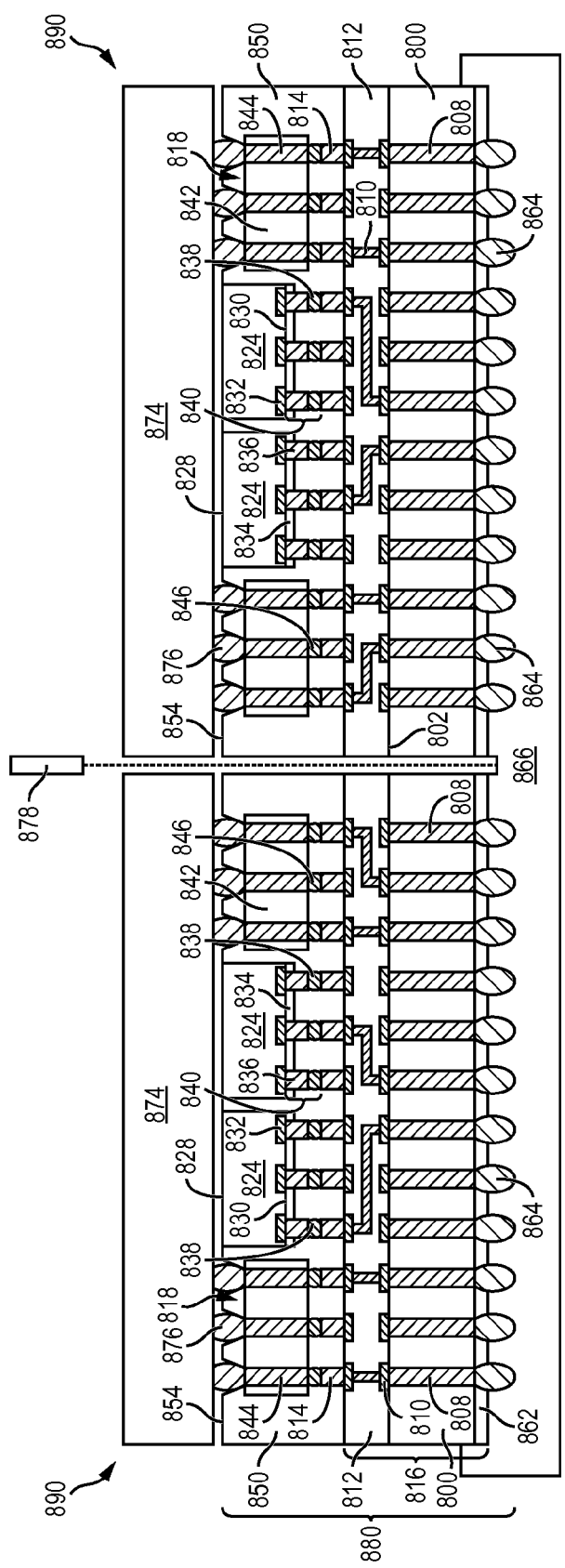

In FIG. 19g, semiconductor die or devices 874 are disposed over reconstituted wafer 820. Semiconductor device 874 may include filter, memory, or other IC chips, processors, microcontrollers, or any other packaged device containing semiconductor die or other electronic devices or circuitry. In one embodiment, semiconductor device 874 is a memory device.

Semiconductor device 874 is mounted to reconstituted wafer 820 using pick and place or other suitable operation. Bumps 876 of semiconductor device 874 are aligned with exposed vertical interconnects 844 of PWB units 818 and extend into openings 870. Bumps 876 are Al, Sn, Ni, Au, Ag, Pb, Bi, Cu, solder, and combinations thereof. Bumps 876 can be eutectic Sn/Pb, high-lead solder, or lead-free solder. Bumps 876 are reflowed to metallurgically and electrically connect semiconductor device 874 to PWB units 818. In some applications, bumps 876 are reflowed a second time to improve electrical contact to vertical interconnects 844. Bumps 876 represent one type of interconnect structure that can be formed between semiconductor device 874 and vertical interconnects 844. The interconnect structure can also use bond wire, conductive paste, stud bump, micro bump, or other electrical interconnect. Semiconductor device 874 is tested prior to mounting semiconductor device 874 to reconstituted wafer 820 to ensure that only known good die or packages are mounted to reconstituted wafer 820.

Reconstituted wafer 820 is singulated through encapsulant 850 and TSV interposer 816 using a saw blade or laser cutting tool 878 into individual 3-D semiconductor packages 890 including semiconductor device 874 mounted over a TSV interposer PoP 880. Semiconductor die 824 are electrically connected to semiconductor device 874 through PWB units 818 and TSV interposer 816. Alternatively, reconstituted wafer 820 is singulated through encapsulant 850 and TSV interposer 816 into individual TSV interposer PoP 880 prior to mounting semiconductor device 874.

Figure 20:
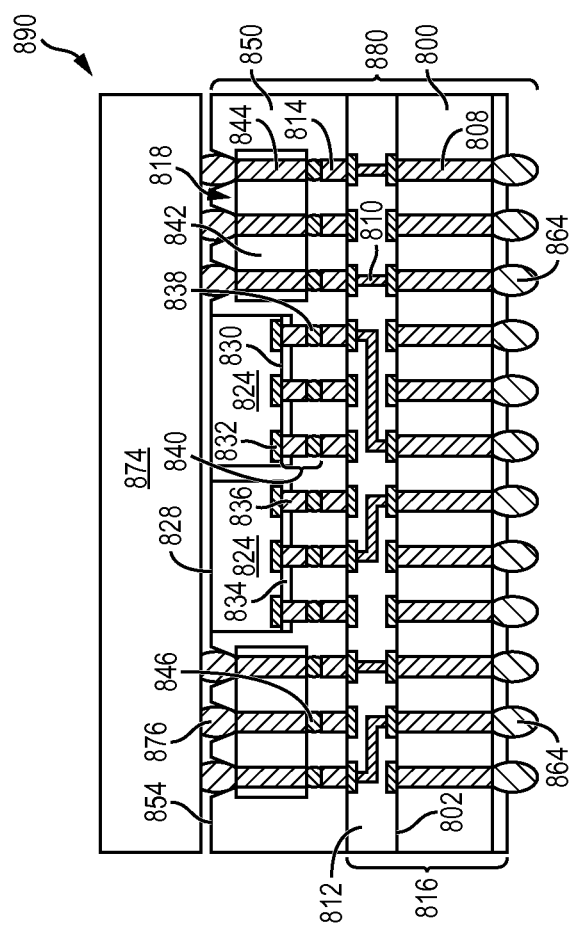
FIG. 20 illustrates the 3-D semiconductor package including a TSV interposer PoP with embedded vertical interconnect structures of FIGS. 19a-19g.

FIG. 20 shows 3-D semiconductor package 890 including TSV interposer PoP 880 and semiconductor device 874. TSV interposer PoP 880 includes TSV interposer 816, PWB modular units 818, and semiconductor die 824. Semiconductor die 824 are electrically connected through TSV interposer 816 to bumps 864 for connection to external devices. Semiconductor device 874 is electrically connected to TSV interposer 816 and semiconductor die 824 through PWB units 818. PWB units 818 are embedded within encapsulant 850 and disposed in a peripheral region around semiconductor die 824. Semiconductor die 824 are electrically connected to PWB units 818 via TSV interposer 816. Openings 870 expose vertical interconnects 844 of PWB units 818. Exposed vertical interconnects 844 allow subsequent semiconductor die or packages, for example, semiconductor device 874, to be easily stacked on and electrically connected to TSV interposer PoP 880. Connecting semiconductor device 874 to TSV interposer 816 through PWB units 818 eliminates the need for a substrate and/or additional RDL over surface 828 of semiconductor die 824. Connecting semiconductor device 874 to TSV interposer 816 through PWB units 818, i.e., eliminating any additional substrate and/or RDL from between semiconductor die 824 and semiconductor device 874, shortens an interconnection length between semiconductor device 874 and semiconductor die 824. The shortened interconnection length between semiconductor device 874 and semiconductor die 824 increases the speed and electrical performance of 3-D semiconductor package 890. Eliminating a substrate and/or additional RDL from over semiconductor die 824 also reduces a thickness and overall package profile of 3-D semiconductor package 890. Thinning encapsulant 850 by backgrinding and thinning TSV interposer 816 to expose conductive TSV 808 also reduces the thickness and overall package profile of 3-D semiconductor package 890. Finally, the space between vertical interconnects 844 and surface 828 of semiconductor die 824 and surface 854 of encapsulant 850, i.e., D7 in FIG. 19d, allows bumps 876 of semiconductor device 874 to extend below surfaces 828 and 854. Extending bumps 876 below surfaces 828 and 854, i.e., into openings 870, reduces a height or distance between semiconductor device 874 and TSV interposer PoP 880, which reduces the overall thickness of 3-D semiconductor package 890.

Connecting semiconductor die 824 and semiconductor device 874 to TSV interposer 816 provides a low profile, cost effective mechanism for routing electrical signals between semiconductor die 824, semiconductor device 874, and external devices, for example a PCB. Forming electrical interconnections between semiconductor die 824, semiconductor device 874, and external device via pre-formed TSV interposer 816, as opposed to, for example, via a multilayer build-up interconnect structure formed over semiconductor die 824 and encapsulant 850, reduces warpage, manufacturing time, and an overall cost of 3-D semiconductor package 890. TSV interposer 816, semiconductor die 824, and semiconductor device 874 are each tested prior to being incorporated into 3-D semiconductor package 890. Thus, only known good components are included in 3-D semiconductor package 890. By using only known good components, manufacturing steps and materials are not wasted making defective packages and the overall cost of 3-D semiconductor package 890 is reduced.

Figure 21A:
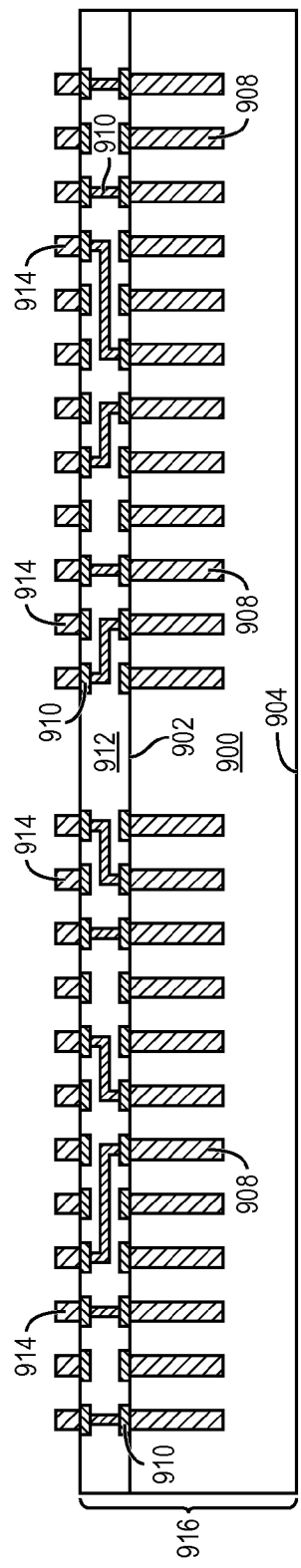

FIGS. 21a-21h illustrate, in relation to FIGS. 1 and 2a-2c, another process of forming a 3-D semiconductor package including a TSV interposer PoP with embedded vertical interconnect structures. FIG. 21a shows a TSV interposer 916, similar to TSV interposer 716 in FIG. 17d. TSV interposer 916 includes a substrate 900, conductive TSV 908, conductive layers 910, insulating layers 912, and bumps 914. Substrate 900 has opposing surfaces 902 and 904, and contains a base material such as silicon, germanium, gallium arsenide, indium phosphide, silicon carbide, or other suitable material for structural support. A plurality of z-direction blind conductive TSV 908 is formed partially through substrate 900. Conductive TSV 908 extend from surface 902 partially, but not completely through substrate 900. A portion of substrate 900 remains between conductive TSV 908 and surface 904 and provides structural support during subsequent manufacturing steps. Conductive TSV 908 are filled with Al, Cu, Sn, Ni, Au, Ag, Ti, W, polysilicon, or other suitable electrically conductive material using electrolytic plating, electroless plating process, or other suitable deposition process.

An interconnect structure is formed over surface 902 of substrate 900 and conductive TSV 908. The interconnect structure includes electrically conductive layers 910 and insulating layers 912. Conductive layer 910 is formed using a patterning and metal deposition process such as sputtering, electrolytic plating, and electroless plating. Conductive layer 910 can be one or more layers of Al, Cu, Sn, Ni, Au, Ag, or other suitable electrically conductive material. Conductive layer 910 includes lateral RDL and z-direction conductive vias for routing electrical signals horizontally and vertically over substrate 900. One portion of conductive layer 910 is electrically connected to conductive TSV 908. Other portions of conductive layer 910 can be electrically common or electrically isolated depending on the design and function of later mounted semiconductor die.

Insulating or passivation layer 912 is formed over substrate 900 and conductive layer 910 using PVD, CVD, printing, spin coating, spray coating, sintering, or thermal oxidation. Insulating layer 912 contains one or more layers of $SiO_2$, $Si_3N_4$, SiON, $Ta_2O_5$, $Al_2O_3$, low temperature (less than 250° C.) curing polymer dielectric with or without filler, or other material having similar insulating and structural properties. A portion of insulating layer 912 is removed by etching, LDA, or other suitable process to expose conductive layer 910.

An electrically conductive bump material is deposited over conductive layer 910 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 910 using a suitable attachment or bonding process. In one embodiment, the bump material is reflowed by heating the material above the material's melting point to form balls or bumps 914. In some applications, bumps 914 are reflowed a second time to improve electrical contact to conductive layer 910. In one embodiment, bumps 914 are formed over a UBM layer. Bumps 914 can also be compression bonded or thermocompression bonded to conductive layer 910. Bumps 914 represent one type of interconnect structure that can be formed over conductive layer 910. The interconnect structure can also use bond wires, conductive paste, stud bump, micro bump, or other electrical interconnect. The combination of substrate 900, conductive TSV 908, conductive layers 910, insulating layers 912, and bumps 914 constitutes TSV interposer 916.

Figure 21B:
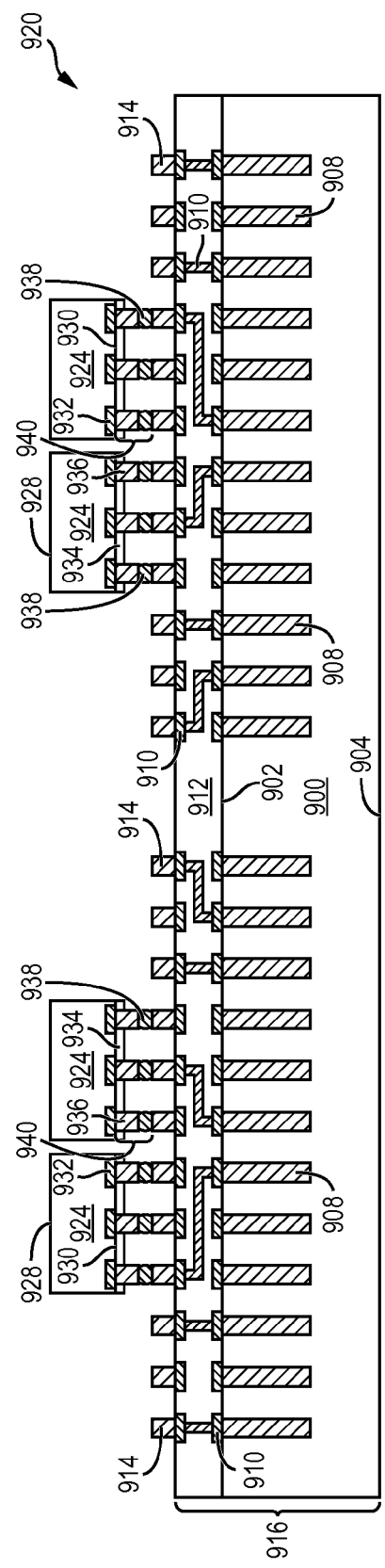

In FIG. 21b, semiconductor die 924 are disposed over TSV interposer 916 forming a reconstituted wafer 920. Semiconductor die 924, similar to semiconductor die 724 in FIG. 17f, has a back or non-active surface 928 and an active surface 930 opposite back surface 928. An electrically conductive layer 932 is formed over active surface 930. An insulating or passivation layer 934 is formed over active surface 930. A portion of insulating layer 934 is removed by LDA, etching, or other suitable process to expose portions of conductive layer 932. A plurality of interconnect structures 940 is formed over conductive layer 932 of semiconductor die 924. Interconnect structures 940 include a non-fusible portion (conductive pillar 936) and a fusible portion (bumps cap 938). Interconnect structures 940 represent one type of interconnect structure that can be formed over semiconductor die 924. The interconnect structure can also use bond wire, bumps, conductive paste, stud bump, micro bump, or other electrical interconnect.

Semiconductor die 924 are mounted to TSV interposer 916 using pick and place or other suitable operation. Bump cap 938 of interconnect structure 940 is reflowed to metallurgically and electrically connect semiconductor die 924 to bumps 914. In some applications, bumps 938 are reflowed a second time to improve electrical contact to bumps 914. Semiconductor die 924 are electrically connected to conductive TSV 908 through interconnect structure 940, bumps 914, and conductive layers 910.

Figure 21C:
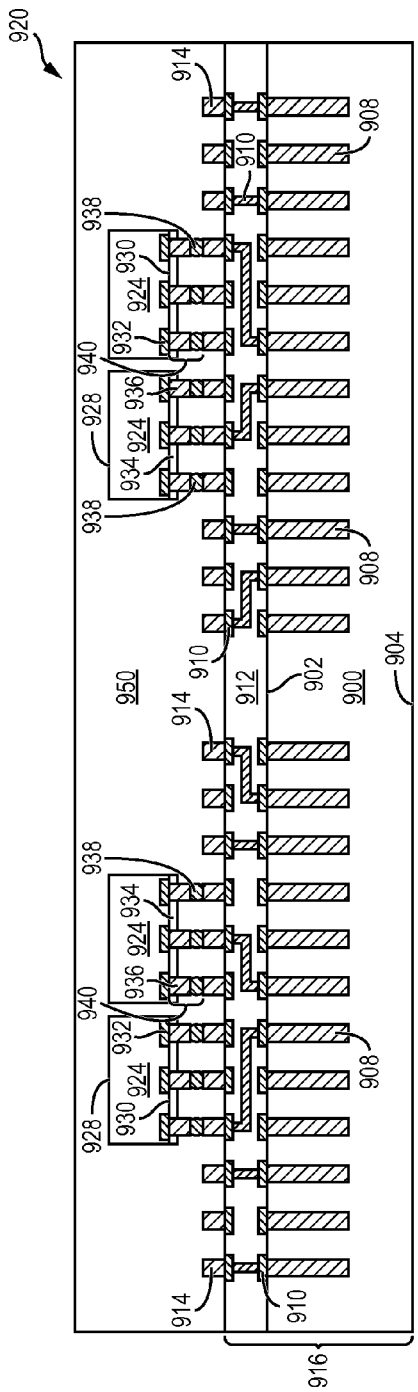

In FIG. 21c, an encapsulant 950 is deposited over TSV interposer 916 and semiconductor die 924 using a paste printing, compressive molding, transfer molding, liquid encapsulant molding, vacuum lamination, spin coating, or other suitable applicator. Encapsulant 950 can be polymer composite material, such as epoxy resin with filler, epoxy acrylate with filler, or polymer with proper filler. Encapsulant 950 is non-conductive and environmentally protects the semiconductor device from external elements and contaminants. Encapsulant 950 also protects semiconductor die 924 from degradation due to exposure to light.

Figure 21D:
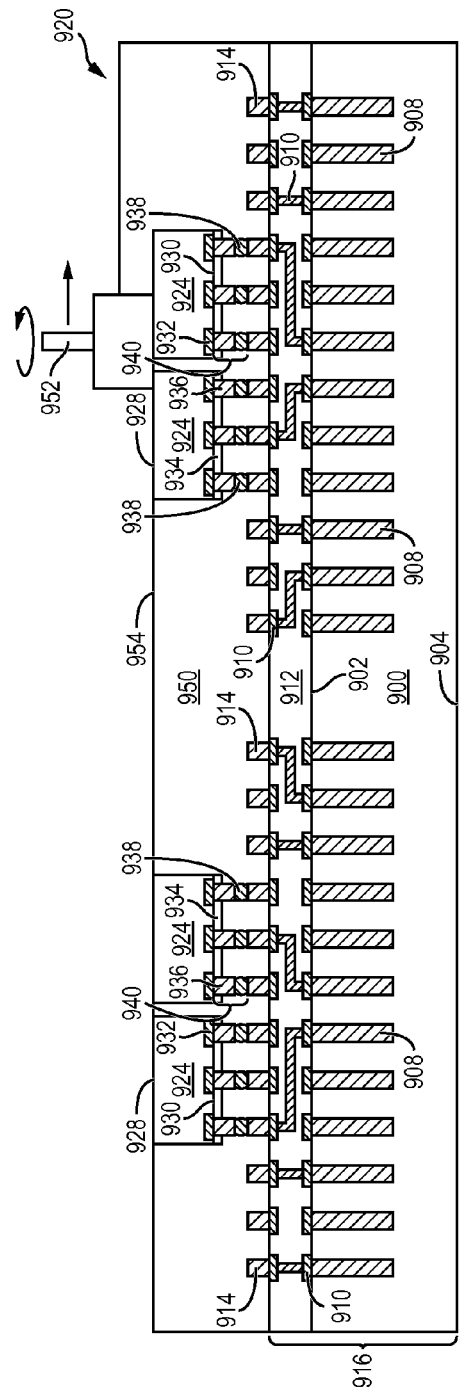

In FIG. 21d, a portion of encapsulant 950 is removed by backgrinding with grinder 952, or by CMP, etching processes, or LDA. The backgrinding operation removes encapsulant 950 from over back surface 928 of semiconductor die 924. Removing encapsulant 950 reduces a thickness of reconstituted wafer 920. Removing encapsulant 950 also reduces warpage of reconstituted wafer 920. In one embodiment, a portion of semiconductor die 924 is removed from back surface 928 during the backgrinding operation to further thin reconstituted wafer 920.

In FIG. 21e, a carrier or temporary substrate 956 containing sacrificial base material such as silicon, polymer, beryllium oxide, glass, or other suitable low-cost, rigid material for structural support is disposed over encapsulant 950 and semiconductor die 924 opposite TSV interposer 916. An interface layer or double-sided tape 958 is disposed between carrier 956 and reconstituted wafer 920 as a temporary adhesive bonding film, etch-stop layer, or thermal release layer. Carrier 956 supports reconstituted wafer 920 during subsequent manufacturing steps.

A portion of substrate 900 is removed from surface 904 by grinding, CMP, etching processes, LDA, or other suitable process to expose conductive TSV 908 and reduce a thickness of TSV interposer 916. After exposing conductive TSV 908, an insulating or passivation layer 962 is formed over a surface of substrate 900 and conductive TSV 908 opposite conductive layer 910. Insulating layer 962 is formed using PVD, CVD, lamination, printing, spin coating, or spray coating. Insulating layer 862 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 962 is removed by LDA, etching, or other suitable process to expose conductive TSV 908.

An electrically conductive bump material is deposited over insulating layer 962 and electrically connected to the exposed portion of conductive TSV 908. The electrically conductive bump material is deposited using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 908 using a suitable attachment or bonding process. In one embodiment, the bump material is reflowed by heating the material above the material's melting point to form spherical balls or bumps 964. In some applications, bumps 964 are reflowed a second time to improve electrical contact to conductive TSV 908. In one embodiment, bumps 964 are formed over a UBM layer. Bumps 964 can also be compression bonded or thermocompression bonded to conductive TSV 908. Bumps 964 represent one type of interconnect structure that can be formed over conductive TSV 908. The interconnect structure can also use bond wire, conductive paste, stud bump, micro bump, or other electrical interconnect.

In FIG. 21f, carrier 956 and interface layer 958 are removed from reconstituted wafer 920 by chemical etching, mechanical peeling, CMP, mechanical grinding, thermal bake, UV light, laser scanning, or wet stripping. A dicing tape or support structure 966 is applied to reconstituted wafer 920 opposite surface 954 of encapsulant 950. Dicing tape 966 covers insulating layer 962 and bumps 964. Dicing tape 966 supports reconstituted wafer 920 during subsequent manufacturing steps and during singulation into individual semiconductor packages.

A portion of encapsulant 950 is selectively removed from over bumps 914 to form openings 970. Openings 970 are formed by LDA using laser 972, etching, or other suitable process. Openings 970 are formed in a peripheral region around semiconductor die 924 and expose bumps 914 of TSV interposer 916. Openings 970 can have vertical, sloped, or stepped sidewalls. Openings 970 extend from surface 954 of encapsulant 950 to bumps 914 of TSV interposer 916. After forming openings 970, openings 970 undergo a desmearing or cleaning process, including a particle and organic residue wet clean, such as a single wafer pressure jetting clean with a suitable solvent, or alkali and carbon dioxide bubbled deionized water, in order to remove any particles or residue from the drilling process. Openings 970 are formed and cleaned while dicing or supporting tape 966 is attached over bumps 964. In one embodiment, a backside balance layer, similar to backside balance layer 196 in FIG. 5g, or an insulating layer, similar to insulating layer 330 in FIG. 6q, is applied over surface 954 of encapsulant 950 and surface 928 of semiconductor die 924 prior to forming openings 970.

In FIG. 21g, an electrically conductive bump material is deposited over bumps 914, within openings 970. The electrically conductive bump material is deposited using an evaporation, electrolytic plating, electroless plating, ball drop, screen printing compression bonding, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bumps 914 using a suitable attachment or bonding process. In one embodiment, the bump material is reflowed by heating the material above the material's melting point to form spherical balls or bumps 974. In some applications, bumps 974 are reflowed a second time to improve electrical contact to bumps 914. Bumps 974 represent one type of interconnect structure that can be formed over bumps 914. The interconnect structure can also use bond wires, conductive paste, stud bump, micro bump, conductive pillar, or other electrical interconnect.

In FIG. 21h, reconstituted wafer 920 is singulated through encapsulant 950 and TSV interposer 916 using a saw blade or laser cutting tool 976 into individual TSV interposer PoP 980 including semiconductor die 924 and embedded bumps 974. Bumps 974 are disposed in a peripheral region around semiconductor die 924. Semiconductor die 924 are electrically connected to bumps 974 through TSV interposer 916.

Figure 22:
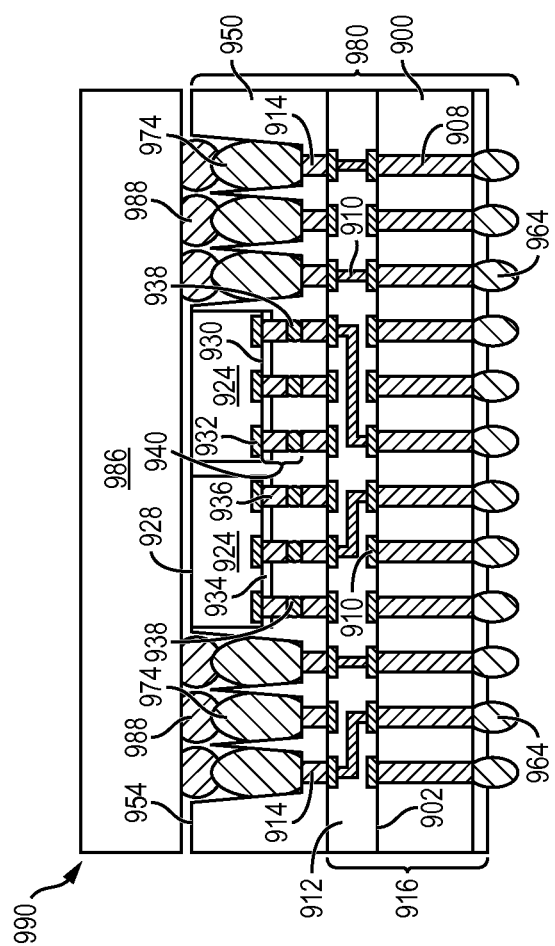
FIG. 22 illustrates the 3-D semiconductor package including a TSV interposer PoP with embedded vertical interconnect structures of FIGS. 21a-21h.

FIG. 22 shows TSV interposer PoP 980 after singulation and removal from dicing tape 966. A semiconductor die or device 986 is disposed TSV interposer PoP 980 using pick and place or other suitable operation. Semiconductor device 986 may include filter, memory, or other IC chips, processors, microcontrollers, known-good packages, or any other packaged device containing semiconductor die or other electronic devices or circuitry. In one embodiment, semiconductor device 986 is a memory device. Bumps 988 of semiconductor device 986 are aligned with bumps 974 of TSV interposer PoP 980, and extend into openings 970. Bumps 988 are reflowed to metallurgically and electrically connect semiconductor device 986 to bumps 974. In some applications, bumps 988 are reflowed a second time to improve electrical contact to bumps 974. Bumps 988 represent one type of interconnect structure that can be formed between semiconductor device 986 and TSV interposer PoP 980. The interconnect structure can also use bond wire, conductive paste, stud bump, micro bump, or other electrical interconnect. Semiconductor device 986 is tested prior to mounting semiconductor device 986 to TSV interposer PoP 980 to assure only known good devices are mounted to TSV interposer PoP 980. In one embodiment, semiconductor device 986 is mounted to TSV interposer PoP 980 on a wafer level, i.e., semiconductor device 986 is mounted to reconstituted wafer 920 prior to singulation.

TSV interposer PoP 980 and semiconductor device 986 form a 3-D semiconductor package 990. TSV interposer PoP 880 includes TSV interposer 916, semiconductor die 924, and bumps 974. Semiconductor die 924 are electrically connected through TSV interposer 916 to bumps 964 for connection to external devices. Semiconductor device 986 is electrically connected to TSV interposer 916 and semiconductor die 924 through bumps 974. Bumps 974 are formed within openings 970 in encapsulant 950 and disposed in a peripheral region around semiconductor die 924. Semiconductor die 924 are electrically connected to bumps 974 via TSV interposer 916. Bumps 974 allow subsequent semiconductor die or packages, for example semiconductor device 986, to be easily stacked on and electrically connected to TSV interposer PoP 980. Connecting semiconductor device 986 to TSV interposer 916 through bumps 974 eliminates the need for a substrate and/or additional RDL over surface 928 of semiconductor die 924. Connecting semiconductor device 986 to TSV interposer 916 through bumps 974, i.e., eliminating any additional substrate and/or RDL from between semiconductor die 924 and semiconductor device 986, shortens an interconnection length between semiconductor device 986 and semiconductor die 924. The shortened interconnection length between semiconductor device 986 and semiconductor die 924 increases the speed and electrical performance of 3-D semiconductor package 990. Eliminating a substrate and/or additional RDL from over semiconductor die 924 also reduces a thickness and overall package profile of 3-D semiconductor package 990. Thinning encapsulant 950 by backgrinding and thinning TSV interposer 916 to expose conductive TSV 908 also reduces the thickness and overall package profile of 3-D semiconductor package 990. Finally, the space between bumps 974 and surface 928 of semiconductor die 924 and surface 954 of encapsulant 950, allows bumps 988 of semiconductor device 986 to extend below surfaces 928 and 954. Extending bumps 988 into openings 970, i.e., below surfaces 928 and 954, reduces a height or distance between semiconductor device 986 and TSV interposer PoP 980, which reduces the overall thickness of 3-D semiconductor package 990.

Connecting semiconductor die 924 and semiconductor device 986 to TSV interposer 916 provides a low profile, cost effective mechanism for routing electrical signals between semiconductor die 924, semiconductor device 986, and external devices. Forming electrical interconnections between semiconductor die 924, semiconductor device 986, and external device via pre-formed TSV interposer 916, as opposed to, for example, via a multilayer build-up interconnect structure formed over semiconductor die 924 and encapsulant 950, reduces warpage, manufacturing time, and an overall cost of 3-D semiconductor package 990. TSV interposer 916, semiconductor die 924, and semiconductor device 986 are each tested prior to being incorporated into 3-D semiconductor package 990. Thus, only known good components are included in 3-D semiconductor package 990. By using only known good components, manufacturing steps and materials are not wasted making defective packages and the overall cost of 3-D semiconductor package 990 is reduced.

Figure 23:
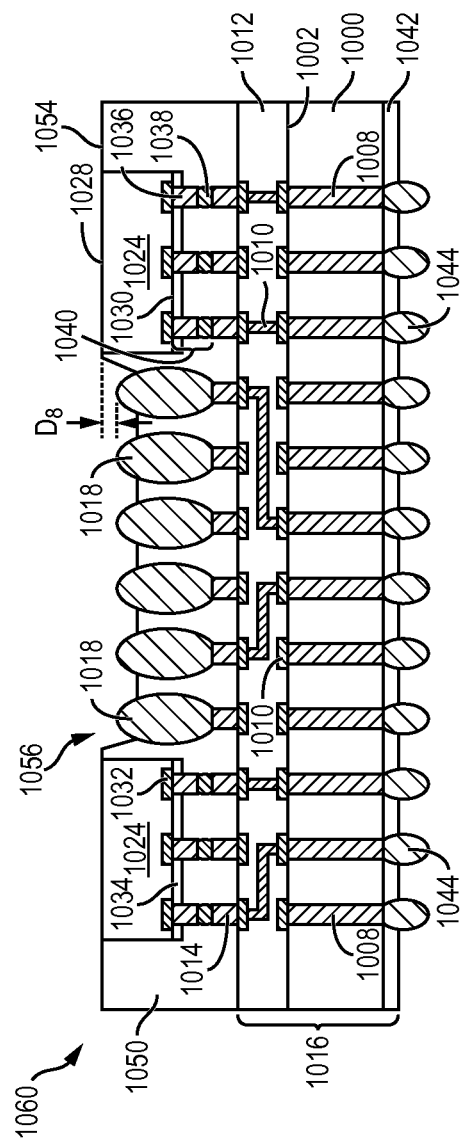
FIG. 23 illustrates a TSV interposer PoP with embedded vertical interconnect structures.

FIG. 23 shows an embodiment of a TSV interposer PoP 1060 with embedded vertical interconnects or bumps 1018 disposed between semiconductor die 1024. TSV interposer PoP 1060 includes a TSV interposer 1016, similar to TSV interposer 716 in FIG. 17j. TSV interposer 916 includes a substrate 1000, conductive TSV 1008, conductive layers 1010, insulating layers 1012, and bumps 1014. Substrate 1000 contains a base material such as silicon, germanium, gallium arsenide, indium phosphide, silicon carbide, or other suitable material for structural support. A plurality of conductive TSV 1008 is formed through substrate 1000. Conductive TSV 1008 are filled with Al, Cu, Sn, Ni, Au, Ag, Ti, W, poly-silicon, or other suitable electrically conductive material using electrolytic plating, electroless plating process, or other suitable deposition process. A portion of substrate 1000 opposite surface 1002 is removed by grinding, CMP, etching processes, LDA, or other suitable process to expose conductive TSV 1008. The grinding operation exposes conductive TSV 1008 and reduces a thickness of TSV interposer 1016.

An interconnect structure is formed over surface 1002 of substrate 1000 and conductive TSV 1008. The interconnect structure includes electrically conductive layers 1010 and insulating layers 1012. Conductive layer 1010 is formed using a patterning and metal deposition process such as sputtering, electrolytic plating, and electroless plating. Conductive layer 1010 can be one or more layers of Al, Cu, Sn, Ni, Au, Ag, or other suitable electrically conductive material. Conductive layer 1010 includes lateral RDL and z-direction conductive vias for routing electrical signals horizontally and vertically over substrate 1000. One portion of conductive layer 1010 is electrically connected to conductive TSV 1008. Other portions of conductive layer 1010 can be electrically common or electrically isolated depending on the design and function of semiconductor die 1024.

Insulating or passivation layer 1012 is formed over substrate 1000 and conductive layer 1010 using PVD, CVD, printing, spin coating, spray coating, sintering, or thermal oxidation. Insulating layer 1012 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 1012 is removed by etching, LDA, or other suitable process to expose conductive layer 1010.

An electrically conductive bump material is deposited over conductive layer 1010 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 1010 using a suitable attachment or bonding process. In one embodiment, the bump material is reflowed by heating the material above the material's melting point to form balls or bumps 1014. In some applications, bumps 1014 are reflowed a second time to improve electrical contact to conductive layer 1010. In one embodiment, bumps 1014 are formed over a UBM layer. Bumps 1014 can also be compression bonded or thermocompression bonded to conductive layer 1010. Bumps 1014 represent one type of interconnect structure that can be formed over conductive layer 1010. The interconnect structure can also use bond wires, conductive paste, stud bump, micro bump, or other electrical interconnect. The combination of substrate 1000, conductive TSV 1008, conductive layers 1010, insulating layers 1012, and bumps 1014 constitutes TSV interposer 1016.

An electrically conductive bump material is deposited over TSV interposer 1016 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bumps 1014 using a suitable attachment or bonding process. In one embodiment, the bump material is reflowed by heating the material above the material's melting point to form balls or bumps 1018. In some applications, bumps 1018 are reflowed a second time to improve electrical contact to bumps 1014. Bumps 1018 can also be compression bonded or thermocompression bonded to bumps 1014. Bumps 1018 represent one type of interconnect structure that can be formed over bumps 1014. In one embodiment, interconnect structures 1018 are Cu columns. The interconnect structure can also use stud bump, micro bump, conductive pillar, or other electrical interconnect.

Semiconductor die 1024 are disposed over TSV interposer 1016 around bumps 1018. In one embodiment, bumps 1018 are formed over TSV interposer 1016 after semiconductor die 1024 are mounted to TSV interposer 1016. Semiconductor die 1024, similar to semiconductor die 724 in FIG. 17*f*, has a back or non-active surface 1028 and an active surface 1030 opposite back surface 1028. An electrically conductive layer 1032 is formed over active surface 1030. An insulating or passivation layer 1034 is formed over active surface 1030. A portion of insulating layer 1034 is removed by LDA, etching, or other suitable process to expose portions of conductive layer 1032. A plurality of interconnect structures 1040 is formed over conductive layer 1032 of semiconductor die 1024. Interconnect structures 1040 include a non-fusible portion (conductive pillar 1036) and a fusible portion (bumps cap 1038). Interconnect structures 1040 represent one type of interconnect structure that can be formed over semiconductor die 1024. The interconnect structure can also use bond wire, bumps, conductive paste, stud bump, micro bump, or other electrical interconnect.

Semiconductor die 1024 are mounted to TSV interposer 1016 in a peripheral region around bumps 1018 using a pick and place or other suitable operation with interconnect structures 1040 aligned with bumps 1014. Bump cap 1038 of interconnect structure 1040 is reflowed to metallurgically and electrically connect semiconductor die 1024 to bumps 1014. In some applications, bumps 1038 are reflowed a second time to improve electrical contact to bumps 1014. Semiconductor die 1024 is electrically connected to conductive TSV 1008 through interconnect structure 1040, bumps 1014, and conductive layers 1010. Semiconductor die 1024 is electrically connected to bumps 1018 through TSV interposer 1016. Semiconductor die 1024 are tested prior to mounting semiconductor die 1024 to TSV interposer 1016 to assure that only known good die are mounted to TSV interposer 1016.

An encapsulant or molding compound 1050 is deposited over TSV interposer 1016, semiconductor die 1024, and bumps 1018 using a paste printing, compressive molding, transfer molding, liquid encapsulant molding, vacuum lamination, spin coating, or other suitable applicator. Encapsulant 1050 can be polymer composite material, such as epoxy resin with filler, epoxy acrylate with filler, or polymer with proper filler. Encapsulant 1050 is non-conductive and environmentally protects the semiconductor device from external elements and contaminants. Encapsulant 1050 also protects semiconductor die 1024 from degradation due to exposure to light.

A portion of encapsulant 1050 is removed by backgrinding, CMP, etching processes, LDA, or other suitable process to reduce warpage and a thickness of TSV interposer PoP 1060. In one embodiment, a portion of back surface 1028 is also removed in the backgrinding operation to further reduce the thickness of TSV interposer PoP 1060. After backgrinding, encapsulant 1050 remains over bumps 1018, and a surface 1054 of encapsulant 1050 is coplanar with surface 1028 of semiconductor die 1024. A distance D8 between surface 1054 of encapsulant 1050 and bumps 1018 is 1-150 μm.

An insulating or passivation layer 1042 is formed over conductive TSV 1008 and a surface of substrate 1000 opposite surface 1002. Insulating layer 1042 is formed using PVD, CVD, lamination, printing, spin coating, or spray coating. Insulating layer 1042 contains one or more layers of SiO2, Si3N4, SiON, Ta2O5, Al2O3, low temperature (less than 250° C.) curing polymer dielectric with or without filler, or other material having similar insulating and structural properties. A portion of insulating layer 1042 is removed by LDA, etching, or other suitable process to expose conductive TSV 1008.

An electrically conductive bump material is deposited over insulating layer 1042 and electrically connected to the exposed portion of conductive TSV 1008 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 1008 using a suitable attachment or bonding process. In one embodiment, the bump material is reflowed by heating the material above the material's melting point to form spherical balls or bumps 1044. In some applications, bumps 1044 are reflowed a second time to improve electrical contact to conductive TSV 1008. In one embodiment, bumps 1044 are formed over a UBM layer. Bumps 1044 can also be compression bonded or thermocompression bonded to conductive TSV 1008. Bumps 1044 represent one type of interconnect structure that can be formed over conductive TSV 1008. The interconnect structure can also use bond wire, conductive paste, stud bump, micro bump, or other electrical interconnect.

A portion of encapsulant 1050 is selectively removed from over bumps 1018 to form opening 1056. Opening 1056 exposes a portion of bumps 1018. Opening 1056 is formed by etching, laser, or other suitable process. Opening 1056 can have vertical, sloped, or stepped sidewalls, and extends surface 1054 of encapsulant 1050 to bumps 1018. In one embodiment, opening 1056 is formed while a dicing or supporting tape is attached over bumps 1044. A backside balance layer, similar to backside balance layer 196 in FIG. 5g, or an insulating layer, similar to insulating layer 330 in FIG. 6q, may be applied over surface 1054 of encapsulant 1050 and surface 1028 of semiconductor die 1024 prior to forming opening 1056.

Bumps 1018 are embedded within encapsulant 1050 between semiconductor die 1024 to provide vertical interconnection within TSV interposer PoP 1060. Semiconductor die 1024 are electrically connected to bumps 1018 via TSV interposer 1016. Opening 1056 exposes a portion of bumps 1018. Exposed bumps 1018 allow subsequent semiconductor die or packages to be easily stacked on and electrically connected to TSV interposer PoP 1060. Connecting subsequent semiconductor devices directly to TSV interposer 1016 through bumps 1018 eliminates the need for a substrate and/or additional RDL over surface 1028 of semiconductor die 1024. Connecting subsequent semiconductor die or devices directly to TSV interposer 1016 through bumps 1018, i.e., eliminating any additional substrate and/or RDL from over semiconductor die 1024, shortens an interconnection length between semiconductor die 1024 and subsequent semiconductor die or devices connected to TSV interposer PoP 1060. The shortened interconnection length increases the speed and electrical performance of subsequent 3-D semiconductor packages that incorporate TSV interposer PoP 1060. Eliminating an additional substrate and/or RDL from over semiconductor die 1024 also reduces a thickness and overall package profile of TSV interposer PoP 1060. Thinning encapsulant 1050 by backgrinding and thinning TSV interposer 1016 to expose conductive TSV 1008 also reduce the thickness and overall package profile of TSV interposer PoP 1060. Finally, the space between bumps 1018 and surface 1028 of semiconductor die 1024 and surface 1054 of encapsulant 1050, i.e., D8, allows interconnects of semiconductor device subsequently disposed over TSV interposer PoP to extend below surfaces 1028 and 1054. Extending subsequent interconnect structures into opening 1056, i.e., below surfaces 1028 and 1054, reduces a height or distance between TSV interposer PoP 1060 and semiconductor devices disposed over TSV interposer PoP 1060, which reduces an overall thickness of 3-D semiconductor packages incorporating TSV interposer PoP 1060.

Connecting semiconductor die 1024 to TSV interposer 1016 provides a low profile, cost effective mechanism for routing electrical signals between semiconductor die 1024, devices disposed over TSV interposer PoP 1060, and external devices, for example a PCB. Forming electrical interconnections between semiconductor die 1024, devices disposed over TSV interposer PoP 1060, and external devices via pre-formed TSV interposer 1016, as opposed to, for example, via a multilayer build-up interconnect structure formed semiconductor die 1024 and encapsulant 1050, reduces warpage, manufacturing time, and an overall cost of TSV interposer PoP 1060. TSV interposer 1016 and semiconductor die 1024 are each tested prior to mounting semiconductor die 1024. Thus, only known good components are included in TSV interposer PoP 1060. By using only known good components, manufacturing steps and materials are not wasted making defective packages and the overall cost of TSV interposer PoP 1060 is reduced.

FIG. 24a shows an embodiment of a TSV interposer PoP 1080, similar to TSV interposer PoP 1060 in FIG. 23, with an embedded PWB modular unit 1070 disposed over TSV interposer 1016 between semiconductor die 1024. PWB modular unit 1070 includes a core substrate 1072. Core substrate 1072 includes one or more laminated layers of polytetrafluoroethylene prepreg, FR-4, FR-1, CEM-1, or CEM-3 with a combination of phenolic cotton paper, epoxy, resin, woven glass, matte glass, polyester, glass fabric with filler, and other reinforcement fibers or fabrics. Alternatively, core substrate 1072 includes one or more insulating or passivation layers.

A plurality of through vias is formed through core substrate 1072 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnects or conductive vias 1074. In one embodiment, Cu is deposited over the sidewall of the through vias by electroless plating and electroplating and the vias are filled with an insulating or a conductive filler material, similar to vertical interconnect structures 158 in FIG. 4f.

An electrically conductive bump material is deposited over vertical interconnects 1074 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to vertical interconnects 1074 using a suitable attachment or bonding process. In one embodiment, the bump material is reflowed by heating the material above the material's melting point to form balls or bumps 1076. In some applications, bumps 1076 are reflowed a second time to improve electrical contact to vertical interconnects 1074. In one embodiment, bumps 1076 are formed over a UBM layer. Bumps 1076 can also be compression bonded or thermocompression bonded to vertical interconnects 1074. Bumps 1076 are reflowed to metallurgically and electrically connect PWB unit 1070 to bumps 1014 of TSV interposer 1016. Bumps 1076 represent one type of interconnect structure that can be formed between vertical interconnects 1074 and TSV interposer 1016. The interconnect structure can also use bond wires, conductive paste, stud bump, micro bump, or other electrical interconnect.

Encapsulant 1050 is deposited over TSV interposer 1016, semiconductor die 1024, and PWB units 1070. A surface 1054 of encapsulant 1050 is coplanar with surface 1028 of semiconductor die 1024. A distance D9 between surface 1054 of encapsulant 1050 and PWB unit 1070 is 1-150 µm.

An opening 1078 is formed in encapsulant 1050 over PWB unit 1070 by etching, laser, or other suitable process. Opening 1056 exposes vertical interconnects 1074 of PWB unit 1070. Opening 1078 can have vertical, sloped, or stepped sidewalls, and extends from surface 1054 of encapsulant 1050 to vertical interconnects 1074. In one embodiment, opening 1078 is formed while a dicing or supporting tape is attached over bumps 1044. A backside balance layer, similar to backside balance layer 196 in FIG. 5g, or an insulating layer, similar to insulating layer 330 in FIG. 6q, may be applied over surface 1054 of encapsulant 1050 and surface 1028 of semiconductor die 1024 prior to forming opening 1078.

In FIG. 24b, a semiconductor die or device 1082 is disposed over TSV interposer PoP 1080 using pick and place or other suitable operation. Semiconductor device 1082 may include filter, memory, or other IC chips, processors, microcontrollers, known-good packages, or any other packaged device containing semiconductor die or other electronic devices or circuitry. In one embodiment, semiconductor device 1082 is a memory device. Bumps 1084 of semiconductor device 1082 are aligned with vertical interconnects 1074 of PWB modular unit 1070. Bumps 1084 are reflowed to metallurgically and electrically connect semiconductor device 1082 to vertical interconnects 1074. In some applications, bumps 1084 are reflowed a second time to improve electrical contact to vertical interconnects 1074. Bumps 1084 represent one type of interconnect structure that can be formed between semiconductor device 1082 and PWB modular unit 1070. The interconnect structure can also use bond wire, conductive paste, stud bump, micro bump, or other electrical interconnect. Semiconductor device 1082 is tested prior to mounting semiconductor device 1082 to TSV interposer PoP 1080 to assure only known good devices are mounted to TSV interposer PoP 1080. In one embodiment, semiconductor device 1082 is mounted to TSV interposer PoP 1080 on a wafer level, i.e., semiconductor device 1082 is mounted a reconstituted wafer that includes TSV interposer PoP 1080 prior to singulation, similar to semiconductor device 786 in FIGS. 17o-17p.

Semiconductor device 1082 disposed over TSV interposer PoP 1080 forms a 3-D semiconductor package 1090. TSV interposer PoP 1080 includes TSV interposer 1016, semiconductor die 1024, and PWB modular unit 1070. Semiconductor die 1024 are electrically connected through TSV interposer 1016 to bumps 1044 for connection to external devices. Semiconductor device 1082 is electrically connected to TSV interposer 1016 and semiconductor die 1024 through vertical interconnects 1074. PWB modular unit 1070 is embedded within encapsulant 1050 and disposed between semiconductor die 1024. Semiconductor die 1024 are electrically connected to PWB unit 1070 via TSV interposer 1016. Opening 1078 exposes vertical interconnects 1074 of PWB modular unit 1070. Exposed vertical interconnects 1074 allow subsequent semiconductor die or packages, for example semiconductor device 1082, to be easily stacked on and electrically connected to TSV interposer PoP 1080. Connecting semiconductor device 1082 to TSV interposer 1016 through PWB modular unit 1070 eliminates the need for a substrate and/or additional RDL over surface 1028 of semiconductor die 1024. Connecting semiconductor device 1082 to TSV interposer 1016 through PWB modular unit 1070, i.e., eliminating any additional substrate and/or RDL from between semiconductor die 1024 and semiconductor device 1082, shortens interconnection length between semiconductor device 1082 and semiconductor die 1024. The shortened interconnection length between semiconductor device 1082 and semiconductor die 1024 increases the speed and electrical performance of 3-D semiconductor package 1090. Eliminating a substrate and/or additional RDL from over semiconductor die 1024 also reduces a thickness and overall package profile of 3-D semiconductor package 1090. Thinning encapsulant 1050 by backgrinding and thinning TSV interposer 1016 to expose conductive TSV 1008 also reduces the thickness and overall package profile of 3-D semiconductor package 1090. Finally, the space between vertical interconnects 1074 and surface 1028 of semiconductor die 1024 and surface 1054 of encapsulant 1050, i.e., D9, allows bumps 1084 of semiconductor device 1082 to extend below surfaces 1028 and 1054. Extending bumps 1084 below surfaces 1028 and 1054, i.e., into opening 1078, reduces a height or distance between semiconductor device 1082 and TSV interposer PoP 1080, which reduces the overall thickness of 3-D semiconductor package 1090.

Connecting semiconductor die 1024 and semiconductor device 1082 to TSV interposer 1016 provides a low profile, cost effective mechanism for routing electrical signals between semiconductor die 1024, semiconductor device 1082, and external devices. Forming electrical interconnections between semiconductor die 1024, semiconductor device 1082, and external device via pre-formed TSV interposer 1016, as opposed to, for example, via a multilayer build-up interconnect structure formed over semiconductor die 1024 and encapsulant 1050, reduces warpage, manufacturing time, and an overall cost of 3-D semiconductor package 1090. TSV interposer 1016, semiconductor die 1024, and semiconductor device 1082 are each tested prior to being incorporated into 3-D semiconductor package 1090. Thus, only known good components are included in 3-D semiconductor package 1090. By using only known good components, manufacturing steps and materials are not wasted making defective packages and the overall cost of 3-D semiconductor package 1090 is reduced.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
  providing a substrate including a conductive via formed through the substrate;
  disposing a modular interconnect unit including a vertical interconnect structure over the substrate;
  disposing a first semiconductor die over the substrate;

depositing an encapsulant over the first semiconductor die and vertical interconnect structure;

planarizing the encapsulant to form a surface of the encapsulant coplanar with a back surface opposite an active surface of the first semiconductor die while leaving a portion of the encapsulant over the modular interconnect unit;

removing a portion of the encapsulant over the vertical interconnect structure to form an opening in the encapsulant after planarizing the encapsulant; and disposing a second semiconductor die over the first semiconductor die including disposing a bump of the second semiconductor die within the opening of the encapsulant and electrically connected to the vertical interconnect structure.

2. The method of claim 1, further including forming a conductive layer over the substrate.

3. The method of claim 1, further including removing a portion of the substrate over the conductive via.

4. The method of claim 1, wherein a height of the vertical interconnect structure is less than a height of the first semiconductor die.

5. The method of claim 1, further including disposing a third semiconductor die over the substrate, wherein the modular interconnect unit is disposed between the first semiconductor die and the third semiconductor die.

6. The method of claim 1, wherein the vertical interconnect structure is a conductive via.

* * * * *